(12) United States Patent
Ciolfi et al.

(10) Patent No.: US 7,681,151 B2
(45) Date of Patent: Mar. 16, 2010

(54) MANAGEMENT OF FUNCTIONS FOR BLOCK DIAGRAMS

(75) Inventors: John Ciolfi, Wellesley, MA (US); Michael David Tocci, Shrewsbury, MA (US); Mojdeh Shakeri, Southborough, MA (US); Murali Yeddanapudi, Watertown, MA (US); Kai Tuschner, Leinfelden-Echterdingen (DE); Ramamurthy Mani, Needham, MA (US)

(73) Assignee: The Math Works, Inc., Natick, MA (US)

( * ) Notice: Subject to any disclaimer, the term of this patent is extended or adjusted under 35 U.S.C. 154(b) by 427 days.

(21) Appl. No.: 11/703,336

(22) Filed: Feb. 6, 2007

(65) Prior Publication Data
US 2007/0157138 A1 Jul. 5, 2007

Related U.S. Application Data

(63) Continuation of application No. 10/418,002, filed on Apr. 16, 2003, now Pat. No. 7,178,112.

(51) Int. Cl.
*G06F 17/50* (2006.01)
(52) U.S. Cl. ............................ 716/1; 716/11; 716/17; 716/18; 703/14
(58) Field of Classification Search ............ 716/1, 716/11, 17, 18
See application file for complete search history.

(56) References Cited

U.S. PATENT DOCUMENTS 6,985,905 B2 * 1/2006 Prompt et al. .............. 707/102

OTHER PUBLICATIONS dSpace News. National Instruments. "More than just a code generator: TargetLink2.0." Retrieved from the Internet:_www.fengco.se/nl-02-02.pdf. Retrieved on May 17, 2007, pp. 13-16.
National Instruments. "MATRIXx—System design and control development software." Retrieved from the Internet: www.ni.com/pdf/products/us/matrixx_04.pdf <http://www.ni.com/pdf/products/us/matrixx_04.pdf>. Retrieved on May 17, 2007, pp. 124-127.

* cited by examiner

*Primary Examiner*—Thuan Do
(74) *Attorney, Agent, or Firm*—Lahive & Cockfield, LLP; Kevin J. Canning

(57) ABSTRACT

A method is provided that includes pattern-matching portions of a block diagram model as being equivalent, and creation of a common set of instructions in place of the occurrences of the pattern-matched portions to enhance the efficiency of simulation or generated code for the block diagram model, such as by a reduced image size. Diagnostics are also available to provide information on the execution structure of the block diagram and guidance on how to modify block of the block diagram to obtain reduced image size by increasing the amount of matching patterns. Also, automatically generated hierarchical structures, a tool to control the function signature and the ability for a user to control file packaging which all provide flexible control over the generated code for block diagrams, are provided.

45 Claims, 40 Drawing Sheets

Sorted List: ←—128

0:0 Sine Wave 1
0:1 Sine Wave 2
0:2 Function-Call Generator
0:3 Function-Call Subsystem
0:4 Integrator
0:5 Gain (algebraic id 0#1)
0:6 Sum (algebraic variable for id 0#1)
0:7 Out1

*Fig. 6B*

| Diagnostics Report for Block Diagram ||| 
|---|---|---|
| Category | Subsystem Name | Incremental Checksum Value |
| Connectivity Information | <u>A</u><br><u>C</u><br><u>D</u> | 10<br>10<br>10 |
| Port Properties | <u>A</u><br><u>B</u> | 15<br>15 |
| | <u>D</u><br><u>E</u><br><u>F</u> | 20<br>20<br>20 |
| Internal Block Properties | | |
| Sample Times | <u>A</u><br><u>B</u> | 25<br>25 |
| | <u>C</u><br><u>D</u> | 26<br>26 |
| | <u>E</u><br><u>F</u> | 30<br>30 |

| Function Signature Layout Tool | | |
|---|---|---|
| | Arguments | Parameters Names |
| Output Function | Inputs<br>Outputs<br>Block Outputs<br>Continuous States<br>... | In1<br>Out1<br>block_outputs<br>cont_states<br>... |
| Update Function | Inputs<br>Outputs<br>Block Outputs<br>Continuous States<br>... | In1_update<br>Out1_update<br>blockout_update<br>contstate_update<br>... |
| ... | ... | ... |

*Fig. 35*

MANAGEMENT OF FUNCTIONS FOR BLOCK DIAGRAMS

RELATED APPLICATIONS

This application is a continuation of U.S. patent application Ser. No. 10/418,002, filed Apr. 16, 2003, the contents of which are incorporated herein by reference. Additionally, this application relates to a U.S. Patent Application entitled, System And Method For Using Execution Contexts In Block Diagram Modeling, Ser. No. 10/414,644, filed Apr. 16, 2003, the contents of which are herein incorporated by reference.

TECHNICAL FIELD

The illustrative embodiment of the present invention relates generally to block diagrams and more particularly to the preparation and management of instructions for the execution of a block diagram model.

BACKGROUND

Various classes of block diagrams describe computations that can be performed on application specific computational hardware, such as a computer, microcontroller, FPGA, and custom hardware. Classes of such block diagrams include time-based block diagrams such as those found within Simulink® from the MathWorks, Inc. Natick Ma, state-based and flow diagrams such as those found within Stateflow® from the MathWorks, Inc. Natick Ma., and data-flow diagrams. A common characteristic among these various forms of block diagrams is that they define semantics on how to execute the diagram.

Historically, engineers and scientists have utilized time-based block diagram models in numerous scientific areas such as Feedback Control Theory and Signal Processing to study, design, debug, and refine dynamic systems. Dynamic systems, which are characterized by the fact that their behaviors change over time, are representative of many real-world systems. Time-based block diagram modeling has become particularly attractive over the last few years with the advent of software packages such as Simulink® from The MathWorks, Inc. of Natick, Mass. Such packages provide sophisticated software platforms with a rich suite of support tools that makes the analysis and design of dynamic systems efficient, methodical, and cost-effective.

A dynamic system (either natural or man-made) is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), bio-chemical systems (gene expression, protein pathways), weather and climate pattern systems, etc. Examples of man-made or engineered dynamic systems include: a bouncing ball, a spring with a mass tied on an end, automobiles, airplanes, control systems in major appliances, communication networks, audio signal processing, nuclear reactors, a stock market, etc. Professionals from diverse areas such as engineering, science, education, and economics build mathematical models of dynamic systems in order to better understand system behavior as it changes with the progression of time. The mathematical models aid in building "better" systems, where "better" may be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may also serve an educational purpose of educating others on the basic principles governing physical systems. The models and results are often used as a scientific communication medium between humans. The term "model-based design" is used to refer to the use of block diagram models in the development, analysis, and validation of dynamic systems.

Often, the complexity of block diagram models results in a need for substantial memory and/or processing capabilities. A need exists to seek to reduce the memory and/or processing requirements, to enable faster response of a simulation of a block diagram model. Faster responses, particularly in the case of a real-time model used in a control system, can enable the use of lower cost processing hardware and/or memory. Also, a need exists to aid a user in the management of a block diagram model.

SUMMARY

An illustrative embodiment of the present invention provides a method of reducing processing requirements by reducing an image size by the reuse of execution instructions when matching patterns in the block diagram occur. Diagnostics are also available to provide information on the execution structure of the block diagram and guidance on how to modify block of the block diagram to obtain reduced image size by increasing the amount of matching patterns. Also, automatically generated hierarchical structures, a tool to control the function signature and the ability for a user to control file packaging which all provide flexible control over the generated code for block diagrams, are provided.

This is a general invention that focuses on classes of block diagrams that describe computation that can be performed on a computer. Classes of such block diagrams include the time-based block diagrams such as those found within Simulink, state-based and flow diagrams such as those found within Stateflow, Data-flow diagrams, etc. The common characteristic among these various forms of block diagrams is that they define semantics on how to execute the diagram on a computer.

The semantics of these diagrams do not define or limit how to best translate the diagram to an executable format (which may be an interpreter, generated instructions, or generated code) that achieves efficient use of the computer. Traditionally, the execution engine would translate the block diagram to executable entities (interpretive op-codes, computer instructions, or source code) following the layout of the block diagram as provided by the user. This translation can yield duplicated execution entities, e.g. matching patterns. The translation also lacked in presenting diagnostics to the user that show the mapping in how the translation was performed and what the results were. There was also no diagnostic guidance in enabling the user to alter their model to achieve smaller executable or code footprints.

According to an embodiment of the invention, a method is provided in an electronic device having a block diagram environment for simulating a dynamic system. The method includes searching a block diagram model for a first pattern of one or more blocks that matches a second pattern of one or more blocks. Processing of the block diagram model is also performed to produce instructions to perform the simulation of the block diagram model. A common set of the instructions is used for simulation of the first pattern and then reused for simulating the second pattern.

Another embodiment of the invention provides a compiler in an electronic device for performing a method. The method includes searching a block diagram model for a first pattern of one or more blocks that matches a second pattern of one or more blocks. Processing of the block diagram model is also performed to produce instructions to perform the simulation of the block diagram model, wherein a common set of the instructions is used for simulation of the first pattern and then reused for simulating the second pattern.

According to an embodiment of the invention, a method is provided in an electronic device having a block diagram environment for simulating a dynamic system. Searching of a block diagram model occurs for a first pattern of one or more blocks that matches a second pattern of one or more blocks. The block diagram model is processed to produce instructions to perform the simulation of the block diagram model, wherein a common set of the instructions is used for simulation of the first pattern and then reused for simulating the second pattern. Code is generated for execution of said instructions that include a plurality of subsystems. Also, a list of names of said subsystems, subsystems that include references to said common set of instructions and/or a link in said code to a corresponding portion of said block diagram are provided.

A further method of an embodiment of the invention involves searching a block diagram model for a first pattern of one or more blocks that matches a second pattern of one or more blocks. The block diagram model is processed to produce instructions to perform the simulation of the block diagram model. A common set of the instructions is used for simulation of the first pattern and then reused for simulating the second pattern. Code is generated for execution of said instructions. According to this method, a subsystem of said instructions is provided with a variable signature allowing only the data structures needed by the subsystem to be passed to the subsystem.

Another method of an embodiment of the invention includes searching a block diagram model for a first pattern of one or more blocks that matches a second pattern of one or more blocks. The block diagram model is processed to produce instructions to perform the simulation of the block diagram model. A common set of the instructions is used for simulation of the first pattern and then reused for simulating the second pattern. Code is generated for execution of said instructions, wherein said instructions include at least one subsystem, and an interface is provided to enable a user to perform at least one of the group of control an order of a list of arguments associated with said subsystem and control a name assigned to each of said arguments.

According to an embodiment of the invention, a method is provided in an electronic device having a block diagram environment for simulating a dynamic system. A block diagram model is searched for a first pattern of one or more blocks that matches a second pattern of one or more blocks. The block diagram model is processed to produce instructions to perform the simulation of the block diagram model, wherein a common set of the instructions is used for simulation of the first pattern and then reused for simulating the second pattern. Code is generated for execution of said instructions. The instructions include at least one subsystem. Also, an interface is provided to enable a user to control a name of said subsystem.

According to an embodiment of the invention, a method is provided in an electronic device having a block diagram environment for simulating a dynamic system. A block diagram model is searched for a first pattern of one or more blocks that matches a second pattern of one or more blocks. The block diagram model is processed to produce instructions to perform the simulation of the block diagram model. According to this method, a common set of the instructions is used for simulation of the first pattern and then reused for simulating the second pattern. Code is generated for execution of said instructions. The instructions include at least one subsystem, and a plurality of identifiers are parsed and different identifiers having conflicting names are resolved by appending a string to at least one of the identifiers.

According to an embodiment of the invention, a method is provided in an electronic device having a block diagram environment for simulating a dynamic system. A plurality of incremental checksums are determined, each of said incremental checksums being representative of a characteristic of each subsystem of a plurality of subsystems. The incremental checksums are stored for each of said subsystems.

Further embodiments of the invention include a medium holding computer executable steps for the methods described herein.

BRIEF DESCRIPTION OF THE DRAWINGS

The invention will be apparent from the description herein and the accompanying drawings, in which like reference characters refer to the same parts throughout the different views.

FIG. 6B depicts a linear sorted list generated from the directed graph of FIG. 6A;

FIG. 29 depicts an example of a diagnostics report;

FIG. 35 illustrates an interface to enable a user to control various aspects of a function signature;

DETAILED DESCRIPTION

The illustrative embodiments of the present invention provide several tools for the management of functions for block diagrams. Methods of reuse of matching patterns within a block diagram model are provided. Reuse of matching patterns can provide efficiencies in reduction of memory required to execute a block diagram, along with efficiencies of data management. Automatic generation and control of function signatures in a block diagram are provided, along with control of identifiers used within a block diagram and the file packaging of the block diagram. Diagnostics and reports are also provided to assist a user in managing functions for block diagrams. Diagnostics can include indications of why a portion of the block diagram was not able to be reused. Reports can include indications of how reused patterns are incorporated in execution of the block diagram. By one or more of these tools, various embodiments of the invention can provide enhanced efficiency of execution of a block diagram and/or improved organization of functions of a block diagram and file packaging.

Dynamic systems are typically modeled as sets of differential, difference, and/or algebraic equations. At any given instant of time, these equations may be viewed as relationships between the system's output response ("outputs"), the system's input stimuli ("inputs") at that time, the current state of the system, the system parameters, and time. The state of the system may be thought of as a numerical representation of the dynamically changing configuration of the system. For instance, in a physical system modeling a simple pendulum, the state may be viewed as the current position and velocity of the pendulum. Similarly, a signal-processing system that filters a signal would maintain a set of previous inputs as the state. The system parameters are the numerical representation of the static (unchanging) configuration of the system and may be viewed as constant coefficients in the system's equations. For the pendulum example, a parameter is the length of pendulum and for the filter example; a parameter is the values of the filter taps.

Figure 1A:
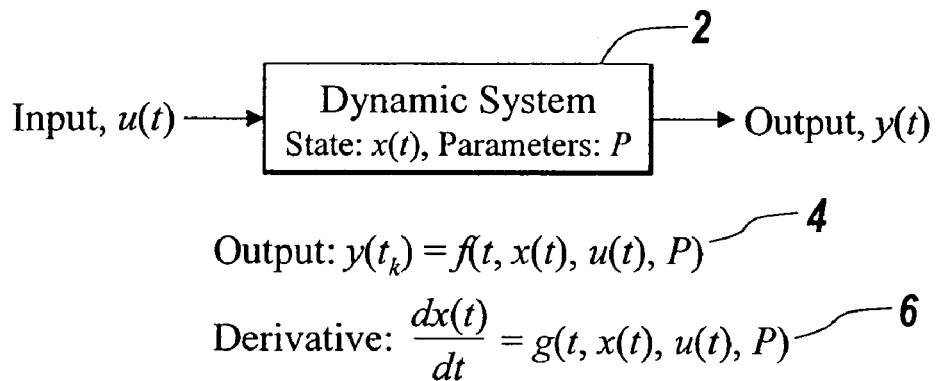
FIG. 1A depicts a dynamic system described with ordinary differential equations (ODE)

There are four common types of mathematical models used in the study of dynamic systems. The first type of mathematical model describes systems using ordinary differential equations (ODEs) and is depicted in FIG. 1A. The dynamic system 2 specifies a set of two equations: Output 4 and Derivative 6. The Output equation 4 facilitates the computation of the system's output response at a given time instant as a function of its inputs, states, parameters, and time. The Derivative equation 6 is an ordinary differential equation that allows the computation of the derivative of the states at the current time as a function of the inputs, the states, parameters, and time. This class of models is suitable for systems in which it is important to track the system response as a continuous function of time. Such continuous-time systems are commonly representative of physical systems (mechanical, thermal, electrical). For simple systems, it may be possible to use the Output 4 and Derivative equations 6 to obtain a closed-form solution for the output response y(t). But in most complex real world systems, the response of the system is obtained by integrating the states through numerical means.

The definition of an ODE used herein encompasses both implicit and explicit differential equations. The class of ordinary differential equations may require additional equations to define the system being modeled. For example, equations called projections may be required to impose constraints on the differential variables (e.g., states $X_1$ and $X_2$ must fall on the manifold defined by $X_1^2+X_2^2=25$). These constraints can be either applied as a secondary condition or a coupled condition to the differential equation. Although systems including the projections may conventionally no longer qualify as an ODE; they are included here to simplify the categories of systems. Another example is the use of a Jacobian equation that defines partial derivatives with respect to the independent and/or differential variables. The Jacobian equation is typically used when obtaining a linear approximation of a non-linear model or an overall linear model of a set of equations. Jacobian equations are required for some forms of numerical integration, for producing the linear model once the model has reached its steady state operating point, etc. The Output 4 and Derivatives equations 6 may be extended to define other relationships for the block. For example, the Output equation 4 may help manage its states by defining a relationship where it resets the state back to a known quantity at a specific point in time or when a specific condition is seen.

Figure 1B:
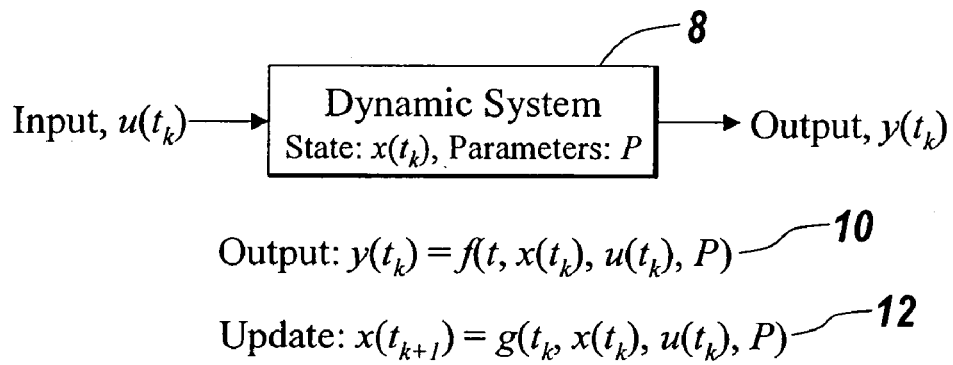
FIG. 1B depicts a dynamic system described with difference equations.

Another type of mathematical model describes systems using difference equations as depicted in FIG. 1B. The dynamic system 8 specifies a set of two equations: Output 10 and Update 12. The Output equation 10 facilitates the computation of the system's output response at a given time instant as a function of the inputs, states at some previous time, parameters, and time. The Update equation 12 is a difference equation that allows the computation of the states at the current time as a function of the inputs, states at some previous time, parameters, and time. This class of models is suitable for systems in which it is important to track the system response at discrete points in time. Such discrete-time systems are commonly representative of digital signal processing systems. For simple systems, it may be possible to use the Output 10 and Update equations 12 to obtain a closed-form solution for the output response y(t). But in most complex real world systems, the response of the system is solved through recursion. The Output 10 and Update equations 12 are applied repeatedly to solve for the system response over a period of time.

Figure 1C:
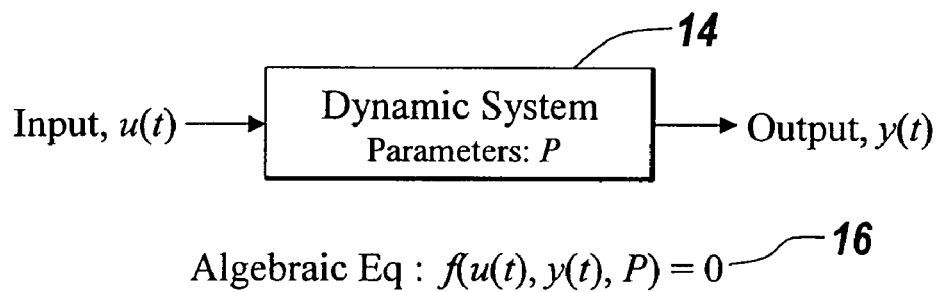
FIG. 1C depicts a dynamic system described with algebraic equations.

An additional type of mathematical model describes systems using algebraic equations as depicted in FIG. 1C. The dynamic system 14 uses an algebraic equation 16 that needs to be solved at each time to obtain the outputs. While simple systems may allow one to obtain a closed-form solution for the system inputs and outputs, practical algebraic equations may best be solved iteratively using a numerical method involving both perturbations and iterations. Algebraic equation solving techniques used in the context of dynamic system modeling are discussed in greater detail below.

A fourth type of mathematical model is a composite system that has components that fall into the three types of models discussed above. Most complex real-world system models fall into this category. This class of systems has Output, Derivative, Update, Algebraic, and potentially other equations. Solving for the output response of such systems requires a combination of the solution approaches discussed for all of the classes above. One example of a composite system is one described by differential-algebraic equations (DAEs) which contain both differential equations and algebraic equations.

Grouped within the composite class of systems are many extensions involving relationships (equations) defined in terms of both outputs and state. For example, one can define a limited integration relationship for a differential variable. This relationship requires a set of equations that consists of the Output equation, an Update equation, a Derivative equation, and a Zero Crossing condition. The Zero Crossing defines the points in time where the upper and lower limits of the limited integration occur. Another example of an extension is the notion of Enable and Disable equations that define relationships among states or signals when parts of a system are activated and deactivated during execution.

Inherent in the four classes of systems (ODE, difference equations, algebraic equations and composite) is the notion of system sample time. The sample-time is the time interval at which the inputs, state, or outputs (collectively referred to as the results) of the system are traced as time progresses. Based on sample times, a system can be described as a discrete-time system, continuous-time system and hybrid system. A discrete-time system is a system in which the evolution of the system results are tracked at finite intervals of time. In the limit as the interval approaches zero, the discrete-time system becomes a continuous-time system. The intervals of time may be periodic or non-periodic. Sometimes, non-periodic rate systems are referred to as non-uniform rate systems meaning that there is no periodic rate at which the response can be tracked Nonuniform-rate systems can fall into the class of composite systems where an additional equation (GetTimeOfNextVarHit) defines when in the future the other equations associated with the system should be evaluated. A continuous-time system is a system in which the evolutions of the system results are continuously changing. Continuous-time signals change during numerical integration (minor time steps). An example of a continuous-time system is one described by an ODE. There can also be algebraic or composite continuous-time systems. A hybrid system is a system with both discrete-time and continuous-time elements.

If a system has only one sample time, it is said to be single-rate. If a system has multiple sample times, it is said to be multi-rate. Multi-rate systems can be evaluated (executed) using either a single-tasking form of execution or a multi-tasking form of execution. When multi-tasking execution is used, it conforms to rate monotonic scheduling principals as defined by Liu, C. L., and LAYLAND, J. W. *Scheduling Algorithms for Multiprogramming in a Hard-Real-Time Environment*. ACM 20, 1 (January 1973), 46-61. Systems may also be categorized by the type of numerical integration solver being used. A fixed-step system is one that uses a fixed-step solver. Fixed-step solvers typically use explicit methods to compute the next continuous state at fixed periodic intervals of time. A variable-step system is one that is using a variable-step solver. A variable-step solver can use either implicit or explicit methods to compute the next continuous state at non-periodic intervals of time. Generally, variable-step solvers use a form of error control to adjust the interval size such that the desired error tolerances are achieved.

In practice, except for the most basic systems, mathematical models for dynamic systems involve a complex set of mathematical transformations applied in some prescribed manner with the outputs of some transformations forming the inputs of others. Each elemental transformation may be viewed in isolation as a simple dynamic system falling into one of the four categories listed above. Therefore, a complex dynamic system may be modeled as an interconnection of various simple dynamic systems. A schematic representation of such an interconnection that has evolved over the years is the block diagram. Such block diagram models have now become a standard means in textbooks, design papers, journal articles, and specifications to communicate the details of a dynamic system's behavior.

Figure 2:
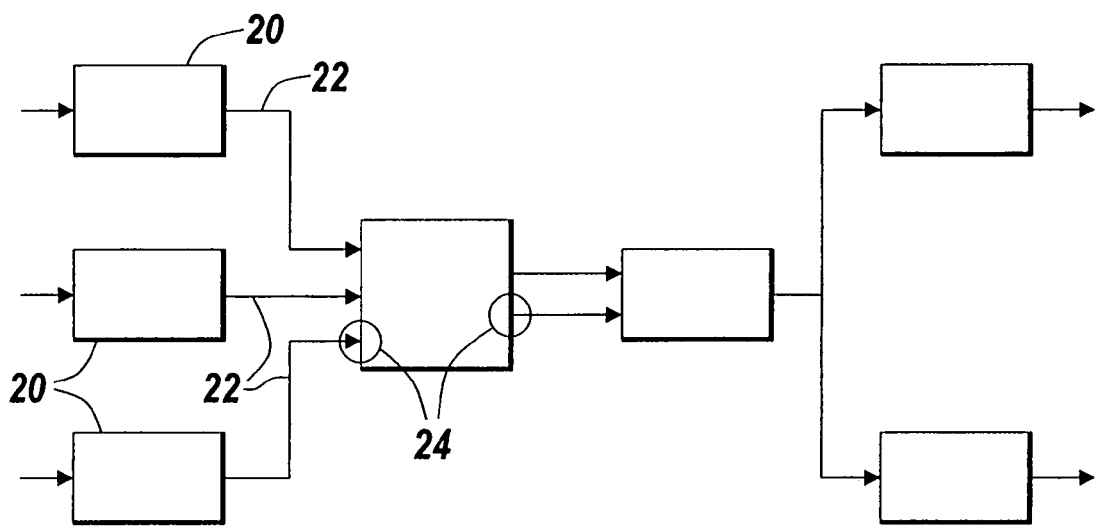
FIG. 2 depicts components of a basic block diagram.

A block diagram model of a dynamic system is represented schematically as a collection of blocks interconnected by lines that represent signals. A signal represents the input and output of a dynamic system. Each block represents an elemental dynamic system. A line emanating at one block and terminating at another signifies that the output of the first block is an input to the second block. Each distinct input or output on a block is referred to as a port. Signals correspond to the time-varying data values represented by each line connection and are assumed to have values at each time instant. The source block of a signal writes to the signal at a given time instant when its system equations are solved. The destination blocks of this signal read from the signal when their system equations are being solved. The basic components of a block diagram are illustrated in FIG. 2. The block diagram includes a plurality of blocks 20, lines 22 and ports 24 that are interconnected. Those skilled in the art will recognize that the terms "block" and "blocks" do not refer exclusively to elemental dynamic systems but may also include other modeling elements that aid in readability and modularity of block diagrams.

The theory of Digital Signal Processing (DSP) focuses on modeling signals as sequences of samples. This view naturally fits into the time-based block diagram paradigm by mapping the samples u[n] to discrete-time points $u(t_k)$. This adds the benefit of being able to model the interaction between DSP systems and other classes of time-based systems, e.g. continuous and/or discrete-time control systems.

Put another way, block diagram models are time-based relationships between signals and state variables representative of a dynamic system. The solution (computation of system response) of the model is obtained by evaluating these relationships over time, where time starts at a user-specified "start time" and ends at a user-specified "stop time". Each evaluation of these relationships is referred to as a time step. Signals represent quantities that change over time, and these quantities are defined for all points in time between the block diagram's start and stop time. The relationships between signals and state variables are defined by sets of equations represented by blocks. These equations define a relationship between the input signals, output signals, state, and time. Inherent in the definition is the notion of parameters, which are the coefficients of the equations.

It is important to note that block diagrams are not exclusively used for representing time-based dynamic systems but also for other models of computation. For instance, flowcharts are block diagrams used to capture process flow and are not generally suitable for describing dynamic system behavior. Data flow block diagrams are block diagrams that describe a graphical programming paradigm where the availability of data (often thought of as tokens) is used to initiate the execution of blocks, where a block represents an operation and a line represents execution dependency data flowing between blocks. As used herein, the term block diagrams means time-based block diagrams used in the context of dynamic systems except as otherwise noted.

Block diagram modeling has spawned a variety of software products such as Simulink™ from The Mathworks, Inc. of Natick, Mass., that cater to various aspects of dynamic system analysis and design. Such products allow users to perform various types of tasks including constructing system models through a user-interface that allows drafting block diagram models, allowing augmentation of a pre-defined set of blocks with custom user-specified blocks, the use of the block diagram model to compute and trace the temporal evolution of the dynamic system's outputs ("executing" the block diagram), and automatically producing either deployable software systems or descriptions of hardware systems that mimic the behavior of either the entire model or portions of it(referred to herein as "code generation"). Each of the tasks listed above has many intricate details and subtle variations which are explored further below.

Block modeling software includes a number of generic components. Although the discussion contained herein focuses on Simulink version 5.0 (Release 13) from The MathWorks, Inc. of, Natick Mass., those skilled in the art will recognize that it is applicable to other block modeling software applications. The generic components include a block diagram editor, blocks and a block diagram execution engine. The block diagram editor allows users to perform such actions as draw, edit, annotate, save, and print out block diagram representations of dynamic systems. As noted earlier, blocks are the fundamental mathematical elements of a classic block diagram model. Simulink extends the classic block diagram models by introducing the notion of two classes of blocks, non-virtual blocks and virtual blocks. Non-virtual blocks are elementary dynamic systems. A virtual block is provided for graphical organizational convenience and plays no role in the definition of the system of equations described by the block diagram model. Examples of virtual blocks are the Bus Creator virtual block and Bus Selector virtual block which are used to reduce block diagram clutter by managing groups of signals as a "bundle". Virtual blocks may be used to improve the readability of models. Simulink further extends the meaning of a non-virtual block to include other semantics, such as a "merge" block semantic. The merge block semantic is such that on a given time step its output is equal to the last block to write to an input of the merge block. An additional extension provided by Simulink is the concept of conditional execution. Simulink contains the concept of conditional and iterative subsystems that control when in time block methods execute for a sub-section of the overall block diagram.

A block diagram execution engine contributes to the modeling software task of enabling the computation and tracing of a dynamic system's outputs from its block diagram model. An execution engine carries out the task of compiling and linking the block diagram to produce an "in-memory executable" version of the model that is used for generating code and/or simulating or linearizing a block diagram model. Note that execution of the block-diagram is also referred to as simulation. The compile stage involves checking the integrity and validity of the block interconnections in the block diagram. In this stage, the engine also sorts the blocks in the block diagram into hierarchical lists that are used when creating the block method execution lists. In the link stage, the execution engine uses the result of the compiled stage to allocate memory needed for the execution of the various components of the block diagram. The linking stage also produces block method execution lists which are used by the simulation or linearization of the block diagram. Included within the link stage is the initialization of the model which consists of evaluating "setup" methods (e.g. block start, initialize, enable, and constant output methods). The block method execution lists are generated because the simulation and/or linearization of a model must execute block methods by type (not by block) when they have a sample hit.

After linking has been performed, the execution engine may generate code. In this stage, the execution engine may choose to translate the block diagram model (or portions of it) into either software modules or hardware descriptions (broadly termed code). If this stage is performed, then the stages that follow use the generated code during the execution of the block diagram. If this stage is skipped completely, then the execution engine uses an interpretive mode of execution for the block diagram. In some cases, the user may even not proceed further with the execution of the block diagram because they would like to deploy the code outside the confines of the block diagram software. Upon reaching the simulation stage, the execution engine uses a simulation loop to execute block methods in a pre-defined ordering upon a sample hit to produce the system responses they change with time.

For linearization, Simulink uses the block method execution lists in a prescribed fashion to produce a linear state space representation of the dynamic system described by the block diagram.

The block diagram editor is the graphical user interface (GUI) component that allows drafting of block diagram models by a user. In most block diagram editors, there is also a textual interface with a set of commands that allow interaction with the graphical editor. Using this textual interface, users may write special scripts that perform automatic editing operations on the block diagram. A user generally interacts with a set of windows that act as canvases for the model. There is generally more than one window for a model because models may be partitioned into multiple hierarchical levels through the use of subsystems (discussed further below).

A suite of GUI tools in Simulink allows users to draft a block diagram model on the corresponding windows. The GUI tools include a block palette, wiring line connection tool, annotation tool, formatting tool, attribute editing tool, save/load tool and publishing tool. The block palette is a library of all the pre-defined blocks available to the user when they are building the block diagram. Individual users may be able to customize this palette to: (a) reorganize blocks in some custom format, (b) delete blocks they do not use, and (c) add custom blocks they have designed. The palette allows blocks to be dragged through some human-machine interface (such as a mouse or keyboard) from the palette on to the window (i.e., model canvas). The graphical version of the block that is rendered on the canvas is called the icon for the block. There may be different embodiments for the block palette including a tree-based browser view of all of the blocks.

The wiring line connection tool allows users to draw directed lines that connect the ports of blocks in the model's window. Lines are also added through various mechanisms involving human-machine interfaces such as the mouse or keyboard. Advanced editors also provide various forms of auto-connection tools that connect blocks automatically on user request to produce an aesthetically pleasing layout of the block diagram (especially those with high complexity with large numbers of blocks). The annotation tool allows users to add notes and annotations to various parts of the palette for a block diagram. The formatting tool enables users to perform various formatting operations that are generally available on any document editing tool. These operations help pick and modify the various graphical attributes of the block diagram (and constituent blocks) such as include font-selection, alignment & justification, color selection, etc. The block diagram and all the blocks within the block diagram generally have a set of functional attributes that are relevant for the execution or code-generation. The attribute editing tool provides GUIs that allows these attributes to be specified and edited. The save/load tool allows a created block diagram model to be saved. The saved model can be reopened in the editor at some later juncture through a load mechanism. Packages such as Simulink also allow users to save blocks including pre-constructed subsystems into a separate class of block-diagrams called libraries. Such libraries facilitate reuse of the same block in a number of other block-diagrams. The load/save mechanism is specially equipped to handle loading and saving of blocks in a block-diagram that actually reside in libraries.

The publishing tool enables the viewing of the block diagram as a document that can be published in any of the standard document formats (examples: PostScript, PDF, HTML, etc.). Those skilled in the art will recognize that the windows for multiple models and all of the tools mentioned above could potentially be embedded in a single Multi-Document Interface (MDI) for providing a unified software environment. Those skilled in the art will also recognize that block-diagram packages offer scripting languages for writing out programs that automatically carry out a series of operations that would normally require interaction with the GUI. For example, Simulink offers a set of commands in MATLAB for carrying out operations such as block addition (add_block), block deletion (delete_block), starting and terminating execution (set_param), modifying block attributes (set_param/get_param), etc.'

Simulink also offers a variety of other GUI tools that improve the ability of users to build and manage large block diagrams. Examples of such GUIs include: (a) a Finder that helps find various objects such as blocks and lines within a block-diagram, (b) a Debugger that helps debug the execution of block-diagrams, (c) a Revision Control UI for managing multiple revisions of the block-diagram, and (d) a Profiler for viewing timing results while executing a block-diagram.

A typical base data-structure for a block may be represented as:

```
class Block {
    public:
        ...
        // Access methods for setting/getting block data
        ...
        // Methods for block editing
        virtual ErrorStatus BlockDrawIcon( );
        virtual BlockParameterData BlockGetParameterData( );
        ...
        // Methods for block compilation
        ...
        // Methods for block execution
        ...........................................
        virtual ErrorStatus BlockOutput( ) = 0;
        virtual ErrorStatus BlockDerivative( ) = 0;
        virtual ErrorStatus BlockUpdate( ) = 0;
        ...
    private:
        BlockGraphicalData blkGraphicalAttributes;
        BlockFunctionalData blkFunctionalAttributes;
        BlockCompiledData blkCompiledAttributes;
        BlockExecutionData blkExecutionData;
        ...
};
```

Although the example of the data structure above is written in C++, those skilled in the art will recognize that equivalent data structures written in other languages may also be used. The major data fields of the block data structure fall into four categories, a graphical attributes field, a functional attributes field, a compiled attributes field and an execution data field.

The graphical attributes field is responsible for storing information relevant for graphical rendering of the block within its parent block diagram's GUI. Attributes specific to the block icon such as font, color, name, and icon-image are stored in this field. It should be noted that modifying these attributes does not affect the dynamics of the model using this block. The functional attributes field is responsible for specifying block attributes that may potentially affect the dynamics of the model using this block. These attributes are specified for the block as a whole and the input and output ports of the block. Examples of block attributes include block sample times and restrictive flags. Block sample times specify if the block corresponds to an elemental, continuous, discrete, or hybrid dynamic system. If the block is an elemental discrete-time system, then the attribute specifies the spacing between time instants at which the block response should be traced. A restrictive flag disallows the use of blocks in certain modeling contexts. For example, one may impose the restriction that there may only be one instance of given block in a model.

Attributes of block ports specify properties of the data that is either available or produced at that port. Block port attributes include dimensions, datatypes, sample rates, and direct feedthrough. Dimension attributes are individual dimensions of a multi-dimensional matrix that is used as a container for data elements. Datatype attributes are the datatype of each element of data in the data container. A complexity attribute is a flag to specify if each data element is real or complex. A sample rate attribute specifies how when the signal corresponding to an input or output port will be used. The port sample times may sometimes be used to implicitly infer the block's sample time. The direct feedthrough attribute is specified only for input ports and indicates whether or not the Output and/or GetTimeOfNextHit equations of the block are a function of the given input.

This attribute helps in determining the sequence in which block methods should be executed while executing the block diagram.

The compiled attributes field of the block data structure holds the attributes of the block and its ports that mirror the functional attributes listed above. This field is filled in during block diagram compilation by utilizing the functional attributes of the block in conjunction with the functional and compiled attributes of the blocks that are connected to it. This process of determining the compiled attributes from the functional attributes is termed attribute propagation. Attribute propagation is described in greater detail below in the section on block diagram compilation. The execution data field is mainly responsible for storing the memory locations that are going to serve as sources for block inputs, outputs, states, parameters, and other work areas during execution of blocks.

The block data structure also has a set of associated methods that may be categorized as access methods to data fields, methods used in editing, methods used in compilation and methods used in execution. Access methods to data fields help in setting and getting the various data fields of the block. Methods used in editing are called by the block diagram editor in order to render the block appropriately in the GUI of its parent block diagram. For instance, this set of methods may include a BlockDrawIcon method that determines the shape the block icon has on the GUI. Methods used in compilation are methods that are called by the block diagram compilation engine. They help validate the connections of the block to other blocks on the block diagram. The methods used in execution include a number of different run-time methods that are required for execution. These include the BlockOutput, BlockUpdate, BlockDerivative methods that realize the Output, Update, and Derivative equations discussed earlier in the context of dynamic systems. In addition, to these methods Simulink includes several other run-time methods, such as the Jacobian, Projection, ZeroCrossings, Enable, Disable, Initialize, EvalParams (check and process parameters), and GetTimeOfNextHit methods. It should be noted that there is no explicit method for algebraic equations because these are represented and processed in a different manner which will be discussed below.

Figure 3:
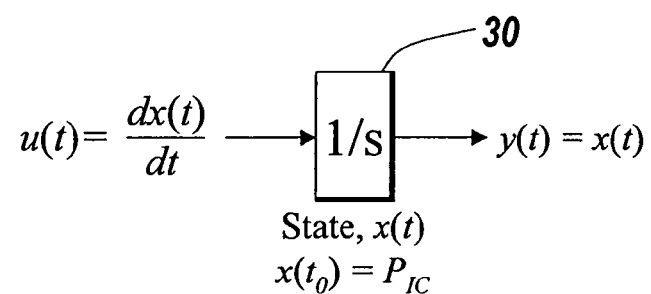
FIG. 3 depicts the desired behavior of an integrator block.

The base data structure for the block specifies the generic fields and interfaces that need to be supported by a block. Some of the methods are purely virtual and have no specific implementation in the base block class. In order to define a specific block (such as an Integrator block), one needs to subclass the base block class and provide explicit definitions for these virtual methods. An example of the subclassing of a block may be seen by examining an Integrator block. FIG. 3 depicts the desired behavior of an Integrator block 30. In order to create the subclass, four major categories of information within the subclass must be specified, the block parameters, the methods used in editing, the methods used in compilation, and the methods used in execution. The elemental dynamic system embodied by the block may be parameterized as illustrated in FIGS. 1A-1C. Each block needs to be able to specify its list of expected parameters. The block diagram editor's Attribute-Editing tool may allow users to specify the parameters for the block when they use it in their models. In the Integrator block example, the block has one parameter that specifies the block's initial condition for the block's state. Regarding the methods used in editing, the subclass needs to specify a method that renders its icon. For example, the Integrator block may implement a method that makes its icon be a box with a '1/s' within the box. Also, the subclass needs to instantiate a method that allows access of the block parameters from the GUI's Attribute-Editing tool. For the Integrator example, this method would allow users to specify the Initial Condition parameter on a GUI for the block. For the methods used in compilation, the subclass needs to instantiate methods that help in the compilation of the block diagram model in which it is placed. These methods help specify the compiled information for the inputs and outputs of the block. For instance, the Integrator block may specify a method that ensures that if the input to the Integrator is a vector, then the output is a vector of the same size. For methods used in execution, the subclass needs to instantiate specific Output, Derivative, and Update methods that represent the block behavior. In the case of the Integrator block, an Output and Derivative method are needed. The Output method sets the output to be equal to the state. The Derivative method sets the derivative of the state to be equal to the input.

The specification of these four types of information for the Integrator block subclass may be shown by a reduced form of the Simulink Integrator block:

```
IntegratorBlock : public Block {
    public:
        ErrorStatus BlockDrawIcon( ) {
            // Draw '1/s' on the icon
            ..............................
        }
        BlockParameterData BlockGetParameterData( ) {
            // Return initial_condition as block data
            ..............................
        }
        ErrorStatus BlockOutput( ){
            // Implement y(t) = x(t)
            ..............................
        }
        ErrorStatus BlockDerivative( ){
            // Implement dx(t)/dt = u(t)
            ..............................
        }
    private:
        double initial_condition;
};
```

It should be noted that block diagram software generally provides open access to the block's data structure to users of the software. This allows users to create and utilize custom block implementations in their models.

Blocks in a block diagram may be virtual or non-virtual. The designation of a block as non-virtual indicates that it influence the equations in the mathematical model for the dynamic system. In the context of block diagram software, it is beneficial to include other virtual blocks that do not affect the equations in the dynamic system's model. Such blocks help improve the readability and modularity of the block diagram and wield no semantic influence on the mathematical model. Examples of such virtual blocks include virtual subsystems, inport blocks and outport blocks, bus creator blocks and From and Goto blocks.

Modularity may be achieved in a block diagram by layering the block diagram through the use of subsystems. A subsystem facilitates layering by allowing a collection of blocks to be represented by a single block with input and output signals. The input and output signals of the subsystem are accessible to the constituent blocks within the subsystem. A subsystem is a virtual subsystem if its constituent blocks are moved back into the main block diagram model during the model's execution. Within a virtual subsystem graphical entities, called inport and outport blocks, are provided to define signal connections to the parent block diagram. These inport and outport blocks indicate a tunnel-through signal connection to the parent block diagram.

Additional types of virtual blocks include bus creator blocks and selector blocks. In large models, there may be an extensive set of lines that connect one section of a block diagram to another section. To avoid excessive clutter of lines and improve readability, there is typically a special block called a Bus Creator that helps bundle all of the lines together to form a single bus line. This single bus line then connects the two sections of the model. At the destination end of the line, a block called a Bus Selector helps un-bundle the individual lines so that they can be connected to other blocks.

Other virtual blocks include From blocks and Goto blocks that are special blocks that help avoid graphical clutter, e.g. a line that connects two distant sections of a block diagram. The line is terminated close to its originating point by a From block. At the other end, a new line is drawn from a Goto block that is hot-linked to the From block. Each Goto and From block has an associated tag that describes which blocks are connected together. An important point to be noted is that Virtual blocks have neither execution data nor execution methods in their data structure.

Simulink also provides the user with the ability to extend the simulator by providing the ability to enhance the simulator with blocks that define dynamic systems or are virtual properties. The extension is provided through a language independent API (e.g. C, C++, Ada, Fortran, Assembly, M).

As noted previously, to facilitate modeling fairly large and complex dynamic systems, Simulink allows users to layer their block diagrams. A subsystem facilitates such layering by allowing a collection of blocks to be represented by a single block with input and output signals. The input and output signals of the subsystem are accessible to its constituent blocks. By nesting subsystems within each other, one can create block diagrams with arbitrary layers of hierarchy. Ideally, a subsystem has no impact on the meaning of the block diagram. Additionally, subsystems provide a way of grouping blocks together and allowing other block diagram constructs to impose unified control on the constituent blocks. To enhance the modularity of subsystems, modeling software also allows aggregated list(s) of parameters of the blocks within the subsystem to be accessed from a single GUI, and defines and displays special icons on the subsystems. The process of defining the parameter list and the special icon is called masking a subsystem.

There are two main types of subsystem blocks, virtual subsystems and non-virtual subsystems. Virtual subsystems serve the purpose of providing the block diagram with a graphical hierarchy. Non-virtual subsystems behave like an elemental dynamic system with its own execution methods (BlockOutput, BlockUpdate, BlockDerivatives, etc.). These execution methods in turn call the execution methods of the constituent blocks.

The classes of nonvirtual subsystems are:
Atomic subsystems. These are similar to virtual subsystems, with the advantage of grouping functional aspects of models at a given layer. This is useful in modular design. Conditionally-executed subsystems. These are non-virtual subsystems that execute only when a precondition is fulfilled:
Enabled subsystems. These are similar to Atomic subsystems, except that the constituent blocks only execute when an enable signal feeding the subsystem is greater than zero. Triggered subsystems. These are similar to Atomic subsystems, except that the constituent blocks only execute when a rising and/or falling signal is seen on a triggering signal feeding the subsystem.
Enable with Trigger subsystems. These are an intersection of the properties of Enabled and Triggered subsystems.
Action subsystems. These subsystems are connected to action-initiator (e.g., an "If" or "SwitchCase" block), a block that explicitly commands the subsystem contents to execute. These subsystems are similar to Enabled subsystems except that the management of the "enabling" signal has been delegated to an action-initiator. Action subsystems define a new type of signal, called an action signal that signifies which subsystems are commanded to execute by the action-initiator.
Function-call subsystems. These subsystems provide a means of collecting blocks into a subsystem that is only executed when called by an owner block. The owner block may compute input signals for the subsystem before calling the subsystem. Additionally, the owner may also read output signals from the subsystem after calling it. Function-call subsystems define a new type of execution control signal, called a function-call signal that contains no data. It is used to define the execution relationship between the owner block and the function-call subsystem. Function-call owners may also designate themselves as an "interrupt" source. In simulation, they simulate the effects of an interrupt and in code generation they can attach themselves to an (asynchronous) interrupt.
While subsystems and For subsystems. These subsystems execute the constituent blocks multiple times on a given time step.

Simulink allows for several forms of block parameters to be defined. There are two general categories of parameters: those parameters that can be modified during simulation and those that cannot be modified. An example of a parameter that may be modified during simulation is the amplitude of a Sine Wave block if configured by the user to allow modification during execution. A parameter such as the amplitude specifies coefficients of the dynamic equation, in this case the amplitude of the sine wave function defined by the Sine Wave block. An example of a parameter that can never be modified during simulation is the sample time of the Sine Wave block. The parameters that can be modified during simulation are further broken down into other categories which include mapping the dialog parameter (e.g. the amplitude) to run-time parameters or converting the dialog parameter to an inlined (non-modifiable) parameter. Run-time parameters can further be mapped to mathematical expressions of tunable Matlab variables or Matlab parameter objects describing properties of the variables (called Simulink.Parameter's). A global run-time parameter data structure is used within Simulink to manage the block parameters during the execution of the model.

In addition to block parameters, there are model-wide parameters which are generally associated with the solver. These parameters include aspects such as the time span in which to perform a simulation, the type of solver, and the time span. Simulink gives the user the ability to adjust solver parameters during model execution. The adjustment of these solver parameters is performed at the start of a time step.

Once a block diagram model has been constructed using the editor, an execution engine allows the model to be solved in order to trace the system outputs as a function of time. The solution of the model, which may be referred to as model execution, is carried out over a user-specified time span for a set of user-specified inputs. Simulation proceeds in four major stages: compilation, link, code generation, and the simulation loop. Alternatively, the execution engine can obtain a linear representation of the model (linearization).

Figure 4:
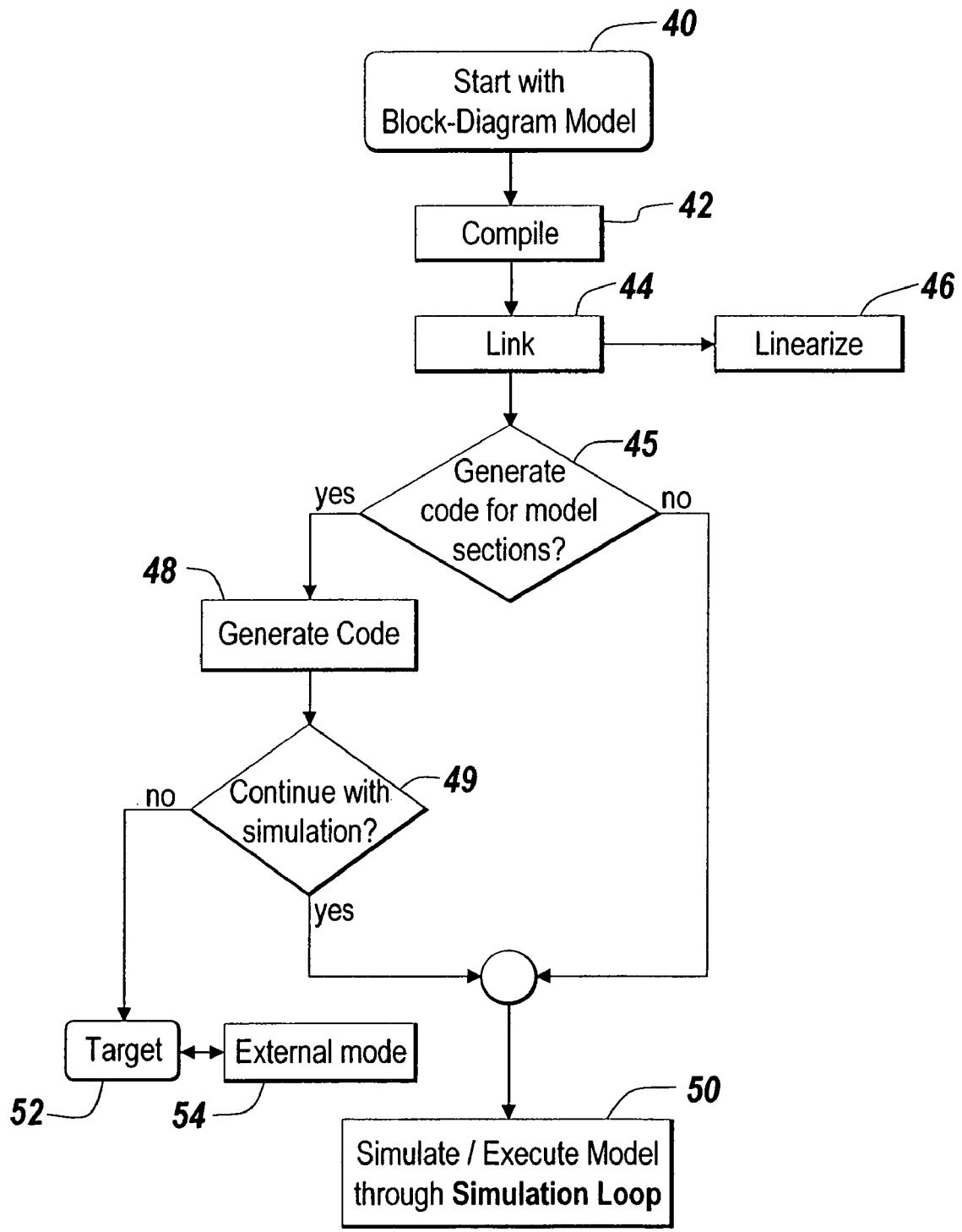
FIG. 4 is a flow chart of the sequence of steps used to perform simulation of the block diagram.

The interrelationship between the various stages is illustrated in a flowchart in FIG. 4.

The execution begins when the block diagram 40 is compiled 42. Following the compilation stage, is the model link stage 44 which may also produce linear models 46. Code may or may not be generated 45. If code is generated 48, a decision is made 49 whether to continue the simulation. If the decision is made to continue the simulation the model is simulated/executed through the Simulation Loop 50. If the simulation is not continued, the code may be delivered to a target 52 and executed in an external mode 54. If code is not generated the block diagram may execute in interpretive mode when entering the Simulation Loop 50.

The compile stage marks the start of model execution and involves preparing data structures and evaluating parameters, configuring and propagating block characteristics, determining block connectivity, and performing block reduction and block insertion. The preparation of data structures and the evaluation of parameters creates and initializes basic data-structures needed in the compile stage. For each of the blocks, a method forces the block to evaluate all of its parameters. This method is called for all blocks in the block diagram. If there are any unresolved parameters, execution errors are thrown at this point.

During the configuration and propagation of block and port/signal characteristics, the compiled attributes (such as dimensions, datatypes, complexity, or sample time) of each block (and/or ports) are setup on the basis of the corresponding functional attributes and the attributes of blocks (and/or ports) that are connected to the given block through lines. The attribute setup is performed through a process during which block functional attributes "ripple through" the block diagram from one block to the next following signal connectivity. This process (referred to herein as "propagation"), serves two purposes. In the case of a block that has explicitly specified its block (or its ports') functional attributes, propagation helps ensure that the attributes of this block are compatible with the attributes of the blocks connected to it. If not, an error is issued. For instance, if an Integrator block is implemented to only accept numbers of double precision datatype, then this block will error out if it is driven by a block that produces single precision data, unless the user has asked for an implicit data conversion. Secondly, in many cases blocks are implemented to be compatible with a wide range of attributes. Such blocks adapt their behavior in accordance with the attributes of the blocks connected to them. This is akin to the concept of polymorphism in object-oriented programming languages. For instance, a discrete-time Filter block could be implemented to accept any of the standard integer datatypes ranging from 8-bit to 128-bit. The exact implementation of the block is chosen on the basis of the specific block diagram in which this block finds itself. Included within this step are other aspects such as validating that all rate-transitions within the model yield deterministic results and that the appropriate rate transition blocks are being used.

Figure 5:
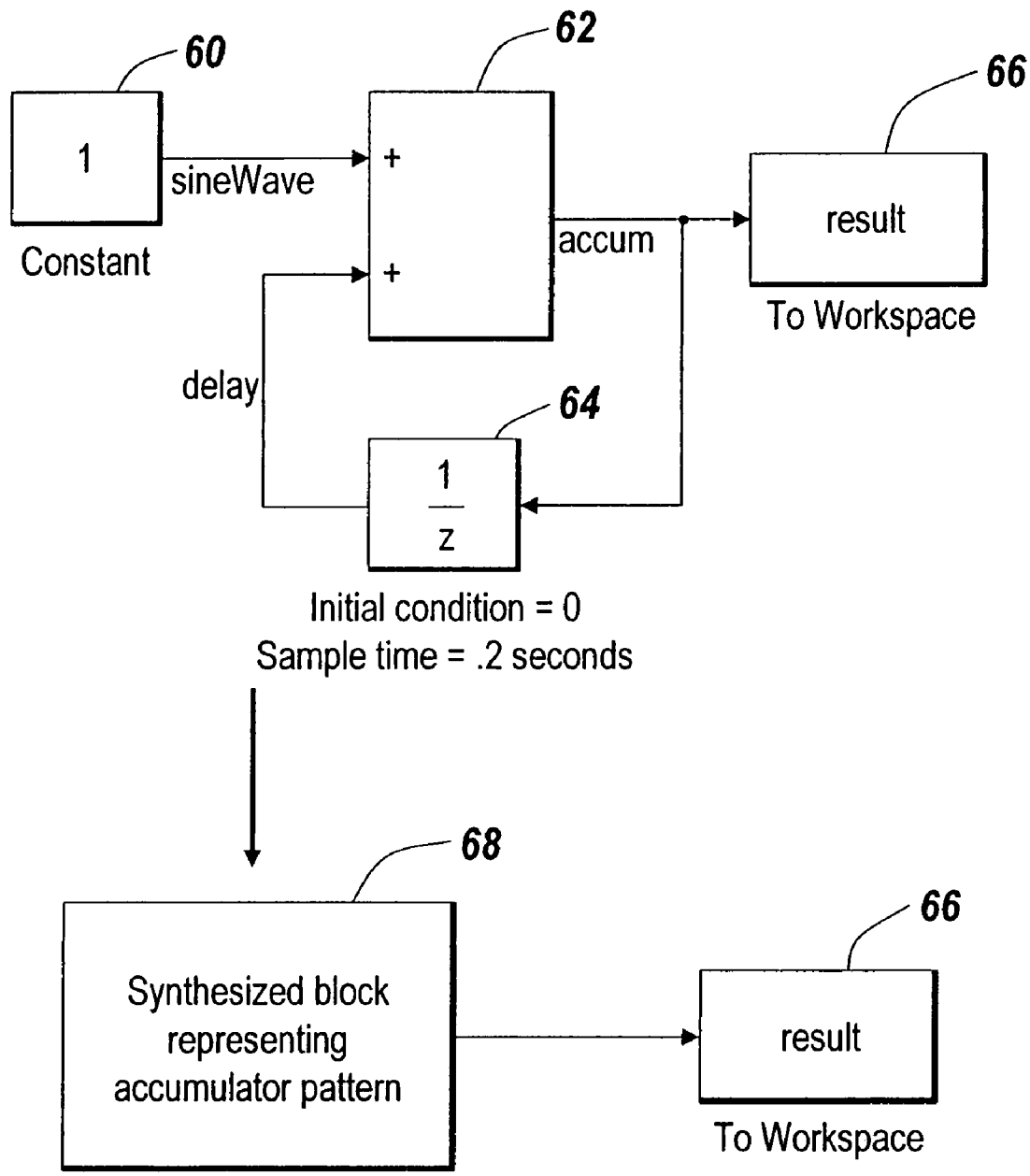
FIG. 5 depicts the replacement of a collection of blocks in a block diagram with an accumulator block.

The compilation step also determines actual block connectivity. Virtual blocks play no semantic role in the execution of a block diagram. In this step, the virtual blocks in the block diagram are optimized away (removed) and the remaining non-virtual blocks are reconnected to each other appropriately. This compiled version of the block diagram with actual block connections is used from this point forward in the execution process Once actual block connectivity has been determined (by removing the virtual blocks) the block diagram may be further optimized by performing block reduction and insertion. During this step, non-virtual blocks may be inserted or a set of non-virtual blocks may be completely removed or reduced to a single equivalent block. Block insertion and reduction is mainly done to improve execution efficiency. Examples of block insertion and reduction include the removal of Gain blocks whose gain value is 1. A Gain block is a block which multiplies its input value by a gain parameter, such as a simple amplifier. FIG. 5 depicts the replacement of a collection of blocks 60, 62, and 64 connected in a accumulator pattern and leading to result 66 with an equivalent synthesized block 68 representing the accumulator pattern leading to the same result 66. A signal copy block may also be automatically inserted in order to make contiguous memory copies of signals that are made up of disjoint memory sections. Block insertion and reduction may also be performed at other suitable stages of compilation.

The way in which blocks are interconnected in the block diagram does not necessarily define the order in which the equations (methods) corresponding to the individual blocks will be solved (executed). The actual order is partially determined during the sorting step in compilation. Once the compilation step has completed, the sorted order cannot be changed for the entire duration of the block diagram's execution.

The first step in sorting involves transforming the graphical block diagram into a compiled (in-memory) directed graph consisting of arcs and vertices. The vertices are derived from some of the non-virtual blocks. For instance, virtual and reduced blocks do not appear in the directed graph. The arcs represent data dependencies between the vertices. The data dependencies do not correspond to the signals in the block diagram. For example, all signals that connect to input ports without direct feed through are "cut" or ignored. In addition, data dependencies are added to capture implicit dependencies. For example, all inputs to a Function-Call subsystem are implicit data dependencies to the owner (caller) block.

Figure 6A:
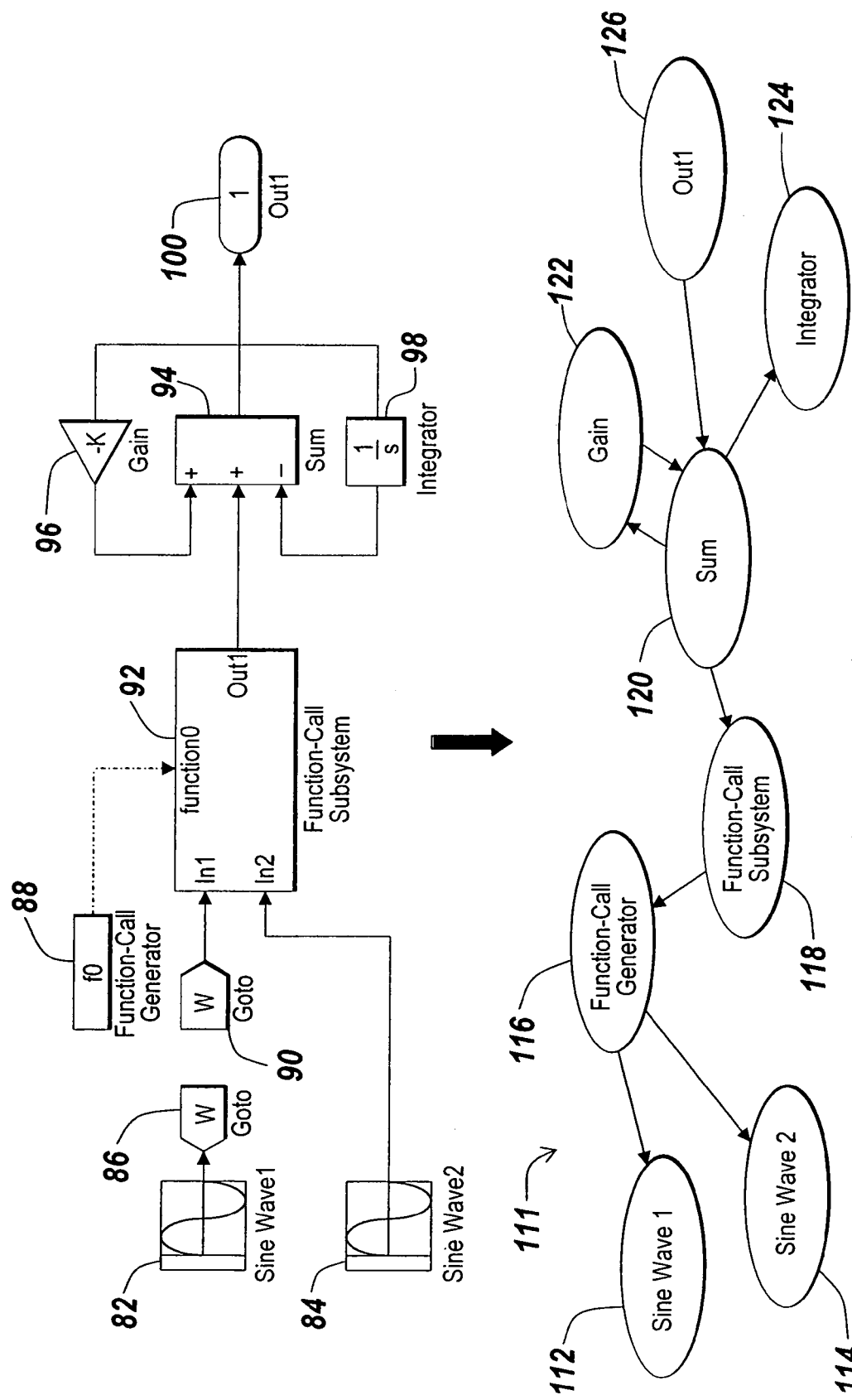
FIG. 6A depicts a block diagram and its associated directed graph.

The process of converting a block diagram into a compiled directed graph is shown in FIG. 6A. A block diagram 81 includes a Sine Wave 1 block 82, a Sine Wave 2 block 84, a Goto block 86, a Function Call Generator block 88, and a From block 90. Also included are a Function Call Subsystem block 92, a Sum block 94, a Gain block 96, an Integrator block 98 and an Outport (Output 1) block 100. Those blocks which are not virtual or reduced appear on the corresponding directed graph 111. The directed graph 111 includes a Sine Wave1 vertex 112, a Sine Wave 2 vertex 114, a function-call generator vertex 116, and a function call subsystem vertex 118. Also included are a Sum vertex 120, a Gain vertex 122, an Integrator vertex 124 and an Outport 1 vertex 126. The vertices are connected by arcs.

The graph is used to sort the blocks into a linear sorted list. FIG. 6B depicts a sorted list 128 generated from the compiled directed graph 111 which includes the elements appearing as vertices in the directed graph 111 sorted into order. The root block diagram has a sorted-list associated with it. Roughly speaking, each non-virtual subsystem layer and some special block diagram elements also each have their own sorted-list. During the sorting of the graph into the list, strongly connected components are identified and flagged as algebraic loops (an example is shown in FIG. 6A consisting of the Sum 120 and Gain 122 blocks). Such loops correspond to a set of algebraic equations and are solved using iterations and perturbations during block diagram execution by solving for the algebraic variables. Algebraic variables are either specified by the user via Initial Condition blocks or chosen by the execution engine. Solving of algebraic loops is discussed further below.

Sorting must also take into consideration other user specified dependencies between the blocks. These dependencies include the concepts of priorities and placement groups. A block priority specifies the order in which the equations associated with a block are evaluated with respect to other blocks. Placement groups are a way of causing each class of block methods for a specified set of blocks to be "placed together" in the block method execution lists. The terms "data dependency" or "data precedence" as used herein refers to the arcs of the compiled directed graph and not the signals found within a block diagram. Attempting to correlate data dependencies directly to the signals found within a block diagram is incorrect and leads to the conclusion that Simulink does not satisfy data dependencies, i.e., the execution of the operations or block methods does not satisfy data dependencies if one interprets signal connectivity as specifying data dependencies.

After compilation, the link stage commences. During this stage physical memory allocations are made in order to prepare for execution. Buffers are allocated for block input and output data buffers, states, and work areas. Additionally, block method execution lists that are derived from the sorted list allow for execution of the block diagram. Each block method execution list is a list of block methods that are to be executed in a sequence when each method within the list has a sample hit. There is generally a set of block method execution lists associated with each layer of the block diagram that corresponds to a non-virtual subsystem. Non-virtual subsystems are either defined by the user or automatically synthesized during compilation to either efficiently execute the model or simplify the implementation of the semantics defined by Simulink. In multi-tasking mode, the lists within each layer may be further partitioned when block diagrams have blocks with different sample rates. These lists are explained in greater detail below.

Those skilled in the art will recognize that while the block method execution lists are derived from the sorted list, they do not necessarily correspond one-to-one with the sorted lists. First, each block method execution lists contains only blocks that have such a block method of the given type (class) defined by the list. Second, block methods corresponding to components like the function-call subsystem do not appear on the block method execution lists because they are executed by an "owner" block.

Although included in the discussion of the compilation stage, it is not required that the time-based diagram perform the block sorting step during compilation. The sorting step is performed to achieve efficient execution. Ignoring efficiency, there is no semantic reason to perform the sorting step. Any random ordering of the block methods will work. In fact, any ordering of all block method execution lists except the Output block method execution list will result in the same level of efficiency. Randomly re-ordering the Output block method execution list will yield correct answers. If the Output block method list is randomly ordered, then the Simulation engine, when executing the Output block method execution list, continues sequencing through the Output block method execution list at each point in time until there are no changes.

Similarly included within the linking stage for the sake of simplicity, is the memory initialization of the model. The memory initialization of the model includes invoking block start, initialize, constant initialize, enable, and constant output methods. These are examples of some of the block methods that are used during model setup (prior to execution) to initialize the "state" of the system so that execution or linearization can commence.

The compiled and linked version of the block diagram may be directly utilized to execute the model over the desired time-span. This interpretive mode of execution is suitable for getting fine-grained signal traceability. It should be noted that the traceability associated with interpretive execution comes at the price of increased overhead in the form of additional execution-related data-structures and messaging in the engine. An alternative to the interpretive execution mode is to utilize the generated-code created by Real-Time Workshop tool for Simulink models. In this mode, the engine (upon the behest of the user) translates a selected portion of the block diagram (or the entire block diagram itself) into code. Such code could be in a number of possible forms. The code may be instructions in a high-level software language such as C, C++, Ada, etc., hardware descriptions of the block diagram portions in a language such as HDL, or custom code formats suitable for interpretation in some third-party software. Alternatively, the code may be instructions suitable for a hardware platform such as a microprocessor, microcontroller, or digital signal processor, etc., a platform independent assembly that can be re-targeted to other environments, or just-in-time code (instructions) that corresponds to sections of the block diagram for accelerated performance.

The execution of a portion of the block diagram represented in code may be performed in a number of different ways based on the specific code format. The portion of the block diagram may execute a compiled version of the code generated in a high-level language (accelerated or software-in-the-loop simulation), the execution may simulate code that corresponds to a hardware description on a hardware simulator, (co-simulation execution), the execution may involve calling out to third-party software to run code generated for such software (co-simulation execution), or the execution may call out directly to hardware that will run code that was generated and compiled for that hardware (processor-in-the-loop execution).

There are several different advantages to execution through code generation: Execution of generated code can be more efficient than interpretive execution because of fewer data-structures and lesser internal messaging in the engine, although the increased efficiency generally comes at the cost of decreased execution traceability. Simulation of hardware descriptions during execution can help identify and resolve bugs in the software stage of a design project. Such bugs prove much more expensive to track and fix once the system has been implemented in hardware. Additionally, block diagram modeling software can be integrated with other software environments that are suitable for modeling and simulating special classes of systems. Models can be tested directly in hardware thereby making prototyping of new systems fast and cost-effective. For instance, consider the design of a controller for an anti-lock braking system of a car. The dynamics of the braking system can be executed in the interpretive mode in the block diagram. The controller itself can be implemented on a hardware micro-controller to test the efficiency of the control laws implemented within. Note that for such target execution, it is normally necessary for the time span over which a model is executed by the software to match real-world time. In other words, the software must allow real-time execution of the block diagram model. Those skilled in the art will recognize that when users generate code, they may choose to not proceed further with the block diagram's execution. They may choose to take the code and deploy it outside of the confines of the modeling software environment. This is normally the last step in the design of dynamic systems in a block diagram software package.

There are several forms of target code execution known to those skilled in the art such as Rapid Prototyping, Embedded System Deployment, and Hardware-in-the-Loop which execute a model or portions of a model via the generated code on a Real-Time System. One aspect of deploying (executing) the generated code on a target is the notion of "external mode." External mode refers to a system where Simulink acts as a monitor and debugger of the generated code running in real-time on a target. In External Mode, users can change parameters and view signals via standard Simulink elements. Another important aspect of the code generation technology is that it is very extensible. Provided with the Simulink product family is the Target Language Compiler (TLC). This technology enables the creation of "active scripts" that control how the generated code is produced for a block diagram. Using TLC, one can tailor the generated code to suite their specific needs.

The execution of the block diagram uses a Simulation Loop (SimLoop) for solving for the block diagram's outputs for a specified set of inputs over a specified span of time ("Time" in reference to the Simulation Loop means the time-line corresponding to the tracing of the dynamic system's outputs, not real-world time unless otherwise noted). The term "SimLoop" applies to real-time systems where each iteration is tied to a physical periodic clock or other timer source. During this process, the block methods (equations) corresponding to the individual blocks are executed by type following their sorted order when they have a sample hit. The term "block execution" is loosely used to mean executing all block methods associated with the given block for a given time step, generally starting with the output method. Strictly speaking, blocks do not execute; the engine executes (evaluates) the appropriate block methods at the appropriate time points.

SimLoop has two variants "single-tasking" and "multi-tasking" depending on sample times. In general, the sample time of a block is the interval of time between calls to the Output, Update, and/or Derivative methods for a given block. In computing this interval, repeated calls at the same time instant (not in real-world time but the time corresponding to the execution of the dynamic system) are counted as the same call. A block's sample rate may also be thought of the interval between successive executions of the block. If there is no uniform or regular interval between calls, then the block is said have a continuous sample time. If a uniform time interval can be found, then the block is said to have a discrete sample-time equal to that interval. Although blocks may be associated with more than one sample time in a sufficiently complex dynamic system the descriptions contained herein are confined to blocks with a single sample-time. Those skilled in the art will recognize that the descriptions may be extended to encompass blocks with multiple sample times.

Figure 7A:
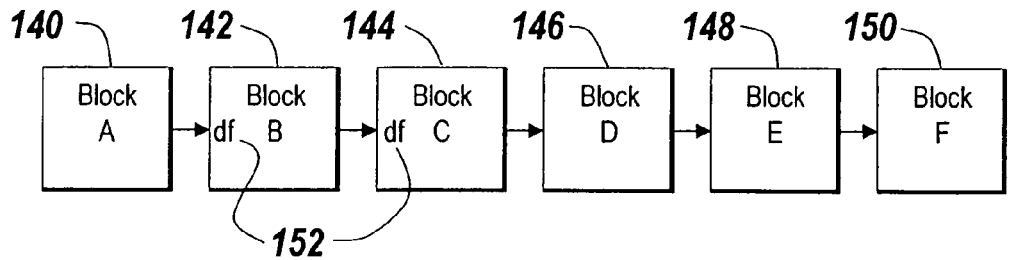
FIG. 7A depicts an abstract example of a block diagram being executed.
Figure 7B:
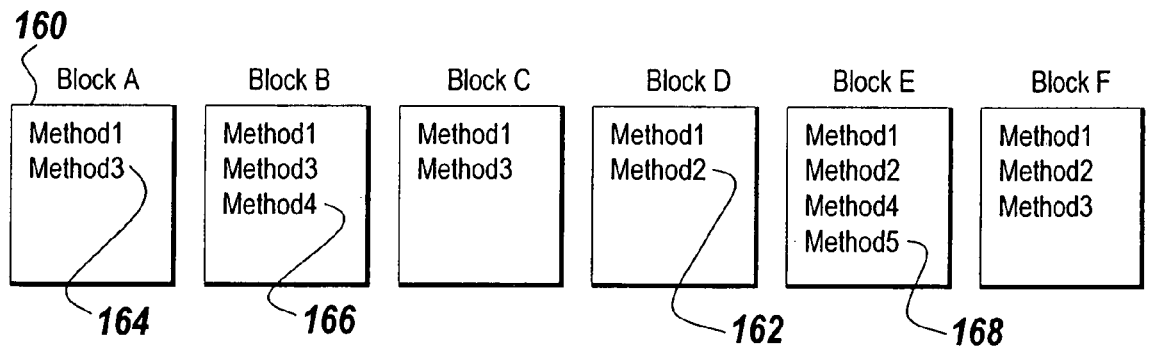
FIG. 7B depicts an abstract view of the execution methods instantiated by the blocks depicted in FIG. 7A.
Figure 7C:
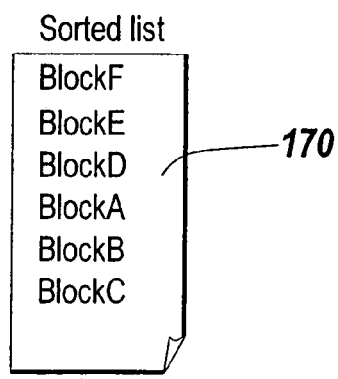
FIG. 7C depicts a sorted list generated from the data dependencies between blocks of FIG. 7A.

FIG. 7A depicts an abstract example of a block diagram being executed. The diagram includes a plurality of blocks 140, 142, 144, 146, 148 and 150. The block ports that have direct feedthrough are explicitly marked (using the symbol 'df') 152. Additionally, an abstract view of the execution methods instantiated by each block is shown in FIG. 7B. The blocks contain a number of different methods 160, 162, 164, 166 and 168. Execution methods includes the three basic execution methods discussed earlier: Output, Update, Derivative, as well as several other methods that aid in advanced block functions such as initialization, linearization, and zero-crossing detection.(which are discussed below). The data-dependencies between the compiled vertices created during sorting are used to generate the Sorted List 170 shown in FIG. 7C.

Figure 8:
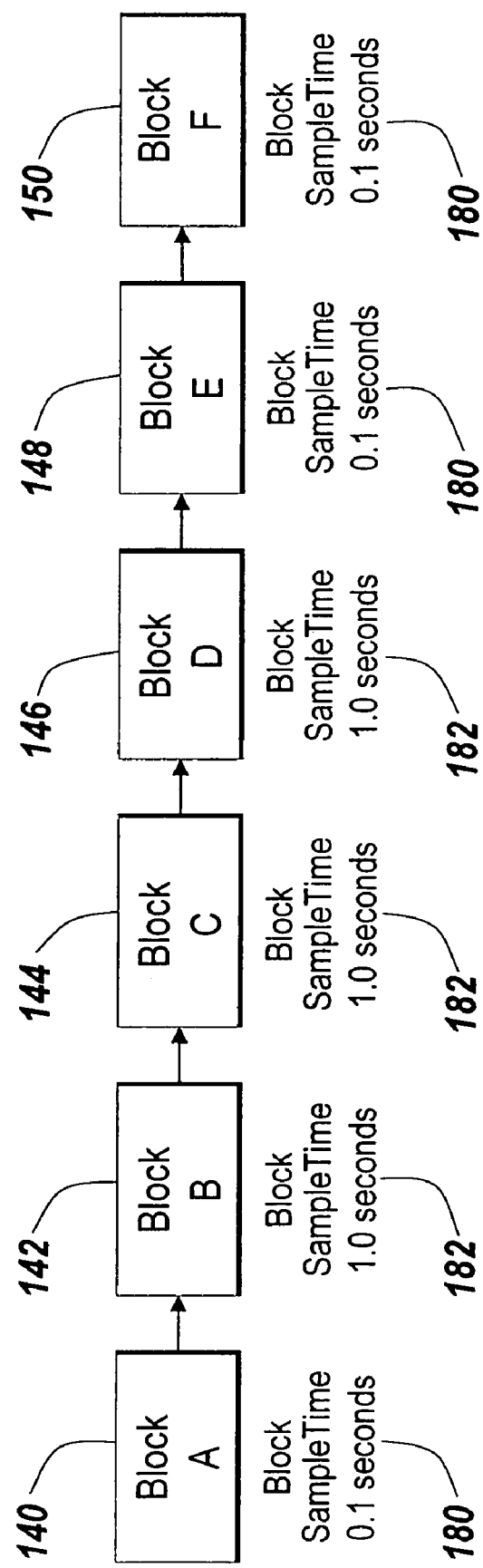
FIG. 8 depicts a multi-rate system.

A block diagram consisting of blocks that all have the same sample time is said to correspond to a single-rate system. A block diagram consisting of blocks that have more than one sample time corresponds to a multi-rate system. FIG. 8 depicts a multi-rate system, adding sample-time information to the block diagram of FIG. 7A. The plurality of blocks 140, 142, 144, 146, 148, and 150 each have an associated sample time. Since the sample times in the block diagram differ between blocks, the system is considered a multi-rate system. Block A 140, block E 148 and block F 150 each have a sample time of 0.1 seconds. Block B 142, block C 144 and block D 146 each have a sample time of 1.0 seconds.

The SimLoop is the heart of the execution engine. Each full pass through the loop is responsible for computing the outputs of the system at a particular time. At the end of each loop, the execution time corresponding to the next pass through the loop is computed. If this time exceeds the stop time specified by the user, the execution terminates. Within the loop, the sequence in which individual block equations are solved is determined by two pieces of information: the sample times of the blocks and the sorted order determined during the Compile stage. The amalgamation of these two pieces of information gives the execution lists for the block diagram. Those skilled in the art will recognize that the execution lists are created in the Link stage and are explained in the context of SimLoops for convenience. There are two distinct approaches for building execution lists and using them in the SimLoop. These approaches correspond to the Single-tasking and Multi-tasking SimLoops summarized in the discussion on FIG. 10 below.

Simulink also has the ability to modify coefficients (parameters) of blocks who declare their parameters as tunable. An example of a block is a Sine Wave block that implements the function output (time)=Amplitude*sin(frequency*time+phase)+bias, where time is the independent variable and the parameters are: amplitude, frequency, phase, bias. When these parameters are declared as tunable, Simulink lets the user change these coefficients during simulation. Changing parameters is a drastic operation in that the definition of the model has changed (e.g. the sine block defines equations that describe the system). Thus, to enable the changing of parameters during the SimLoop, Simulink first queues parameter changes and then applies them on the next time step. Thus, the changing of parameters is not immediate. The delay in the changing of parameters is needed to ensure system stability. The application of the parameters at the start of the next time step is combined with the reset of the solver (Integrator) if needed.

Figure 9:
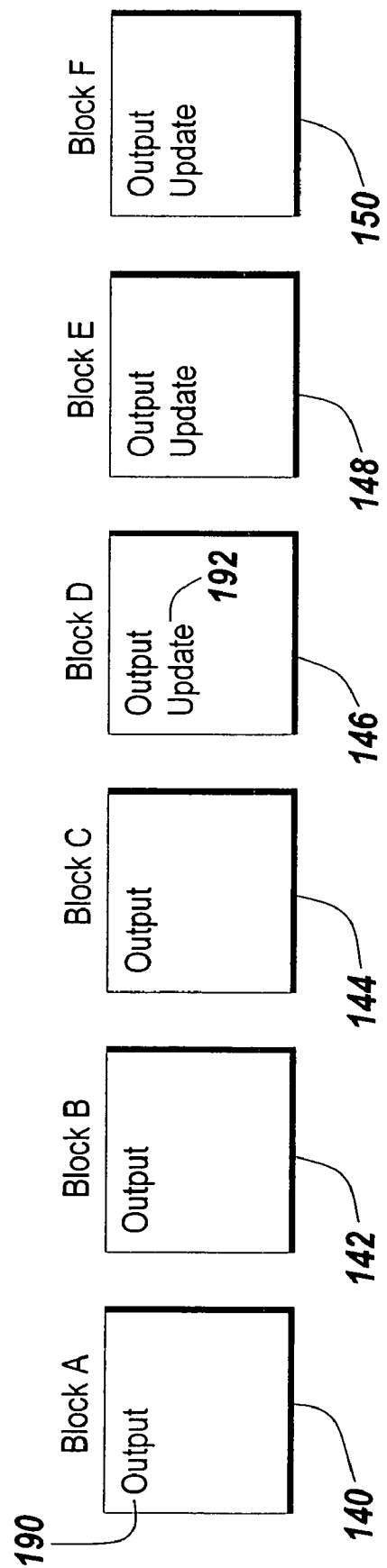
FIG. 9 depicts the block diagram of FIG. 7A and FIG. 8 with associated methods added to the blocks.

For the purpose of exploring single-task loops and multi-task loops, FIG. 9 depicts the block diagrams of FIG. 7A and FIG. 8 where Method1 corresponds to the Output method 190 and Method2 corresponds to the Update method 192. All other methods are ignored in the explanation of the loops. Simpler loops which do not include blocks that have continuous sample times are used in the example for two reasons: the explanation is simpler in the context of discrete sample times and can be extended to continuous sample time cases easily, and in real-world systems, it is very difficult to make the system operate in real-time it contains continuous sample time components.

Figure 10:
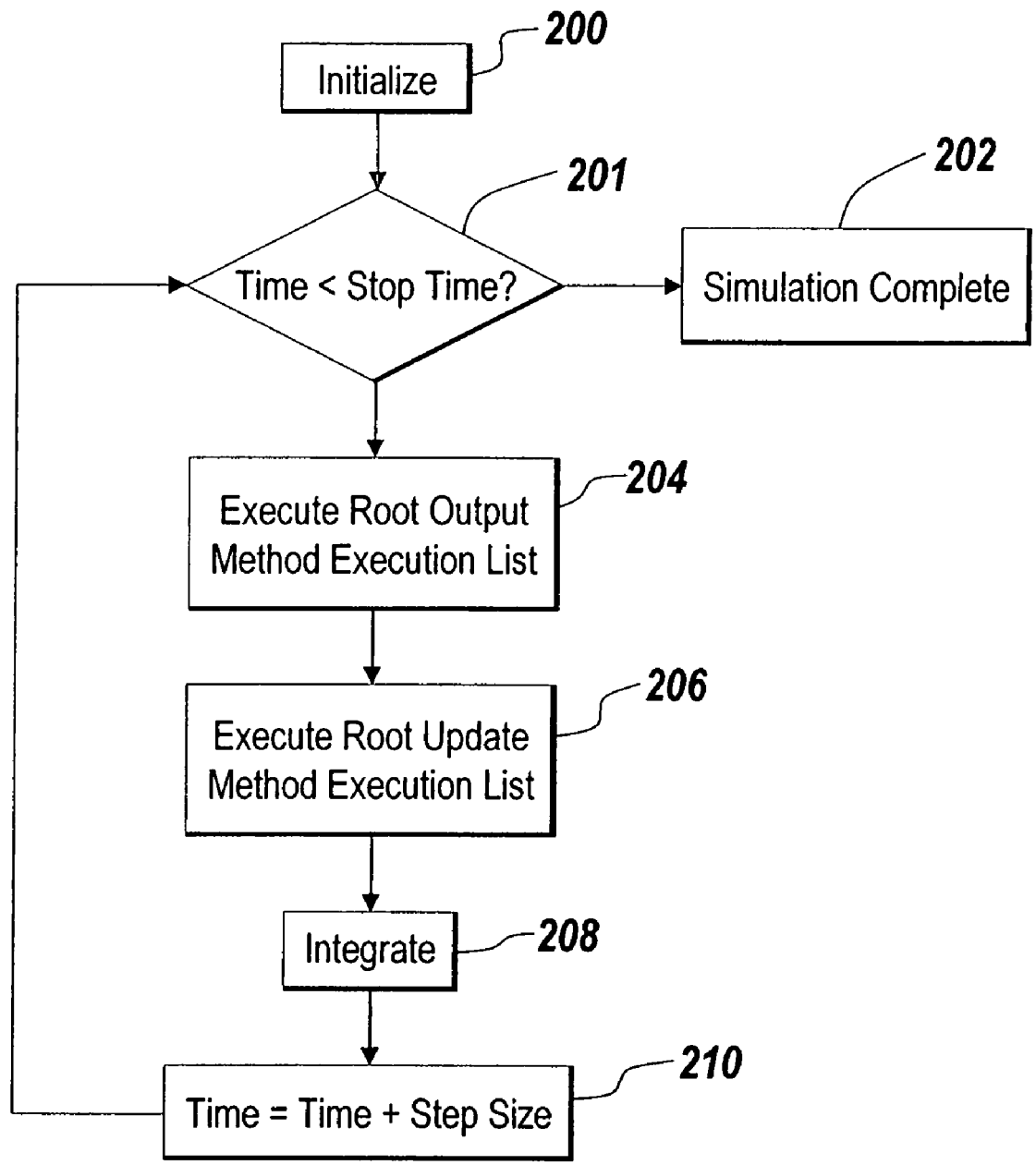
FIG. 10 is a flowchart of the sequence of steps followed by a single-tasking execution loop.

In a single-tasking SimLoop, there is essentially a single execution time-line. On this time-line, each block is executed when it has a sample hit. A sample hit is defined to an execution time instant that is an integer multiple of the block's sample time. To aid in execution, execution lists are constructed for each method type. FIG. 10 depicts the sequence of steps followed by a single-tasking execution loop. Following initialization (step 200), a time parameter is checked to see if the current time is less than the stop time (step 201). If the time is not less than the stop time, the simulation ends (step 202). If the time is less than the stop time, the simulation continues and the root output method execution list is executed (step 204). Following execution of the output method list (step 204) the update method execution list is executed (step 206). Following the performance of an integrate step (208) (the Integrate step is described more below in FIG. 13), the time parameter is incremented by the applicable step size (step 210).

Figure 11A:
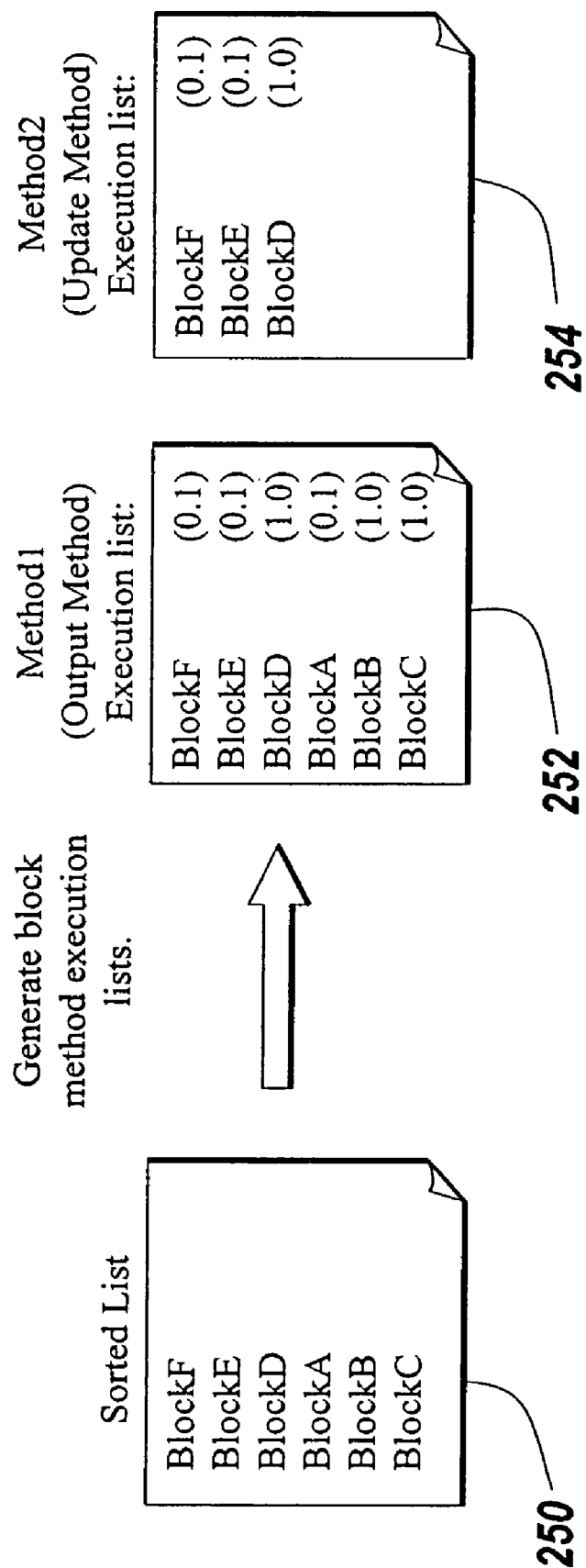
FIG. 11A depicts the creation of execution lists from sorted lists in single task mode.

Blocks are arranged in these execution lists in the sorted order as shown in FIG. 11A. A sorted list 250 is used to generate an Output method execution list 252 and an Update method execution list 254. Referring back to the example in FIGS. 7 and 8, the engine sequentially steps through and execute each block in the block method execution list when the execution time divided by the sample time equals an integer number (1, 2, 3, 4, etc.). At time zero (T0), all the blocks are executed. This involves executing the Output methods for blocks F, E, D, A, B, and C (in this order as dictated by the sorted list) and then executing the Update methods of blocks F, E, and D (again, in this order based on the sorted list). The execution time then is then incremented by step size, which in this case is assumed to be 0.1 seconds. Execution then commences once again at the top of the loop for T=0.1 (T0.1). Blocks F and E have a sample time of 0.1 seconds and have a sample hit (0.1÷0.1=1, sample time is an integer multiple of the execution time), so the output block methods for Blocks F and E are executed. Block D, however, has a 1.0 second sample time and has no sample hit (0.1÷1.0=0.1, sample time is not an integer multiple of the execution time), so its output block method is not executed (essentially it is skipped). Block A, like Blocks F and E, has a 0.1 second sample time and so its output block method is executed. Blocks B and C, like Block D, have 1.0 second sample times and are skipped during this iteration of the simulation loop, which completes execution of the output block method execution list for $T_{0.1}$.

Figure 11B:
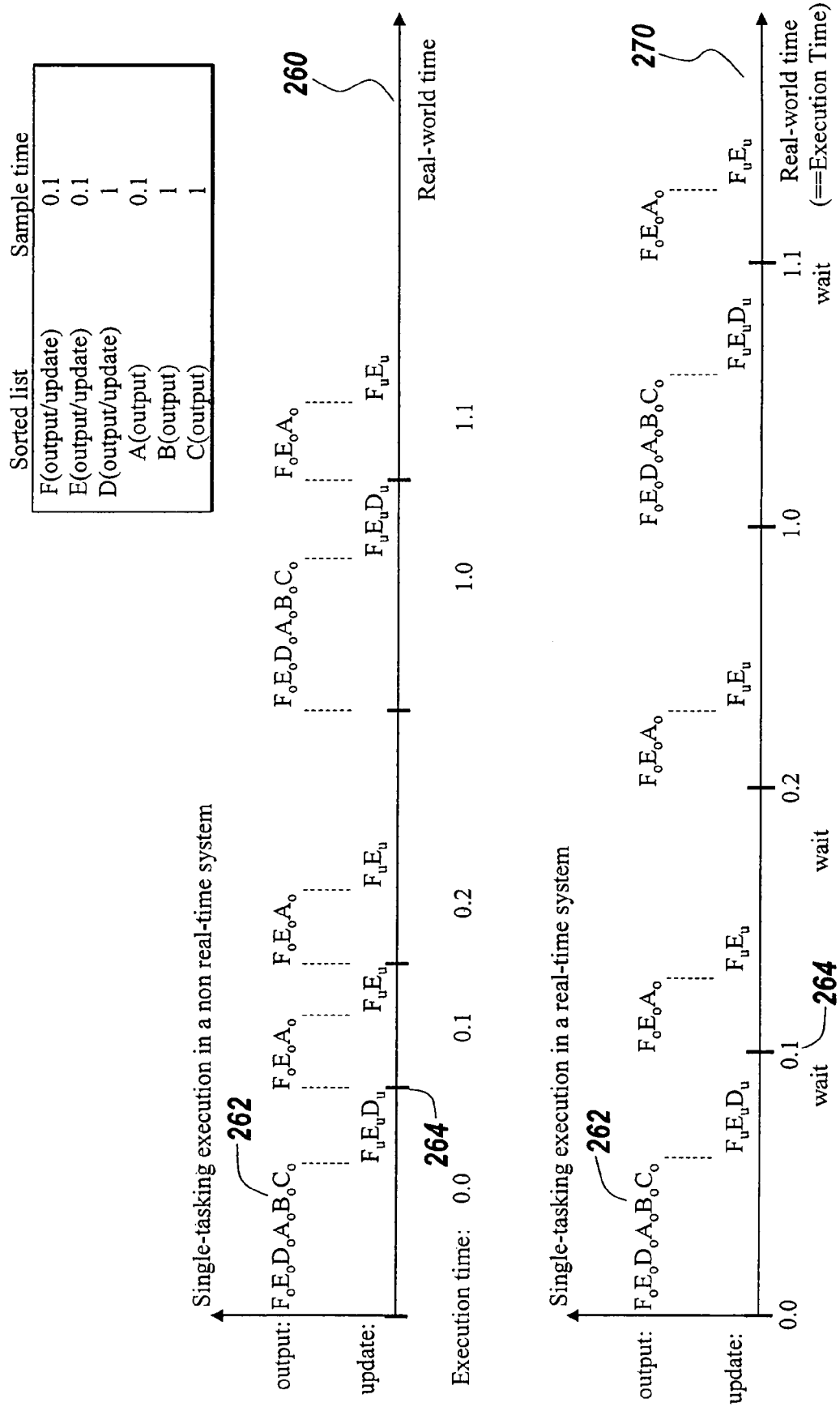
FIG. 11B depicts the execution timing of block diagrams in single task mode in timelines synchronized and non-synchronized with real world time.

The execution timing of the example block diagram in single task mode is shown in the first time-line of FIG. 11B. In this diagram, note that the execution-time is not synchronized with real-world time. Instead, execution time progresses as fast as it can in real-world time. The sorted list 259 is executed on the time-line 260. The methods in the list 262 are executed at the appropriate time step 264. Block diagram modeling software can also allow users to simulate real-world conditions by synchronizing execution time with real-world time. Such execution is illustrated in the second timing diagram of FIG. 11B. The methods 262 are implemented at a time-step 264 synchronized with real world time on the time line 270.

Figure 12A:
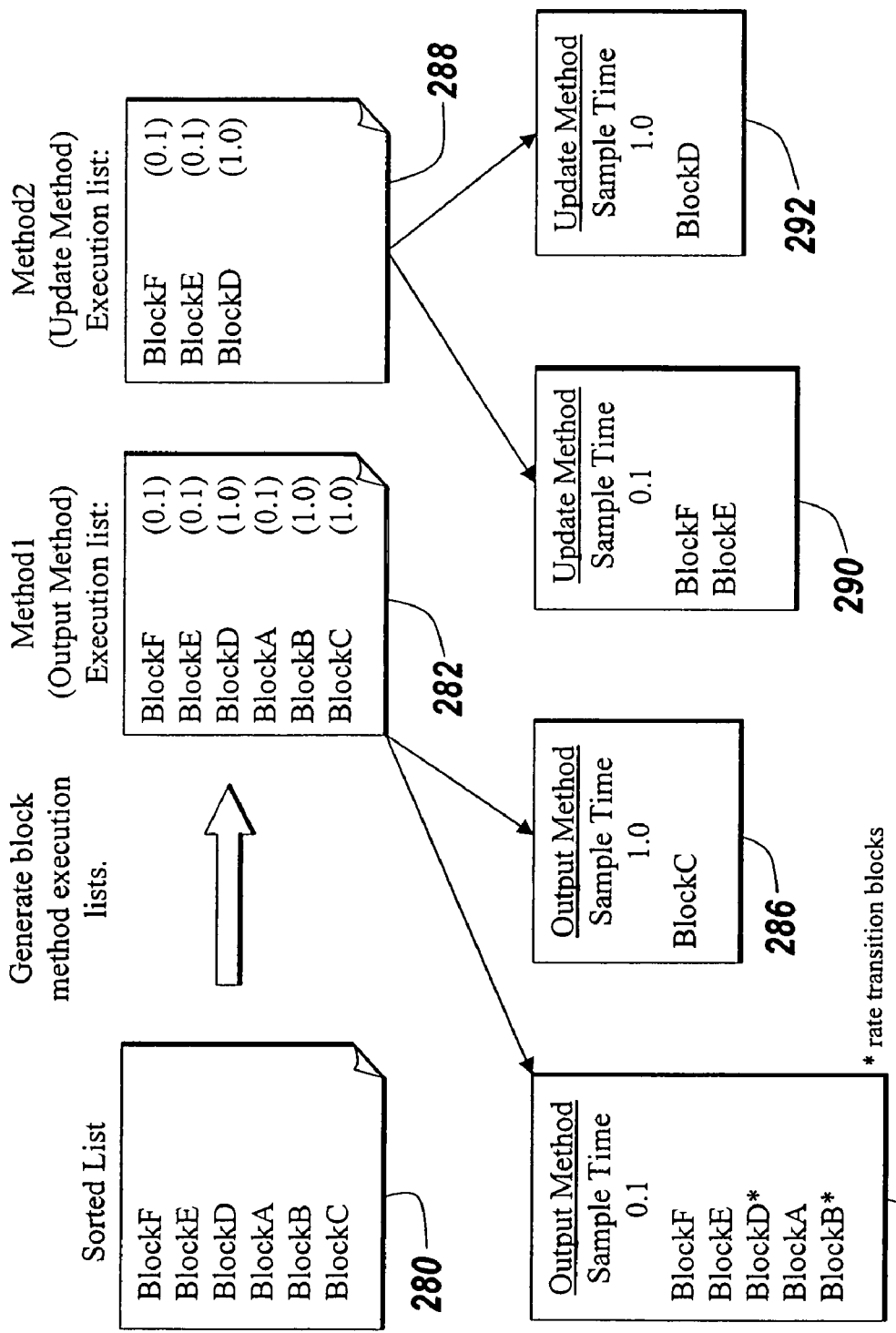
FIG. 12A depicts the creation of execution lists from sorted lists in multi-task mode.

In multitask mode, the engine performs execution along multiple time-lines based upon the number of block sample times used in the mode as shown in the flowchart of FIG. 10B. In the example of FIGS. 7 and 8, the model's blocks have a sample time of either 0.1 seconds or 1.0 second. This implies that the engine runs one set of blocks along a 0.1 second time line and another set of blocks along a 1.0 second time line. In order to run in multitask mode, the execution lists are first divided on the basis of methods (as in single-tasking mode) and then subdivided again based upon block sample times. This is illustrated in FIG. 12A The sorted list 280 is used to generate an output method execution list 282 and update method execution list 288. The output method execution list 282 is split into two separate list execution lists 284 and 286 based on sample times. Similarly, the update method execution list 288 is divided into two update method execution lists 290 and 292 based on sample times.

The execution engine uses the divided execution lists to create multiple execution time lines. In the multitask mode the engine places a higher execution priority on the faster sample time blocks than the slower sample time blocks. This prioritization is carried out by assigning Task Identification Numbers (TIDs) to each execution list; the higher the priority, the lower the TID. For example, a TID of 0 executes at a higher priority than a TID of 1, and so forth. Furthermore, because, during execution in multitask mode, execution transitions between the faster and slower blocks, and vice-versa, the multitask mode requires rate transition blocks that allow the model to transition from blocks running at fast sample times, in our example 0.1 seconds, to slower samples times, e.g., 1.0 seconds. The rate transition blocks are required to correctly simulate how a multi-rate system would behave in a real-time environment. To provide this transition, the engine promotes rate transition blocks to the TID of the fast block for which transition is being provided, although the engine executes these rate transition blocks at their slower rate. This is why Blocks D and B appear in the 0.1 sample time output method execution list in FIG. 12A.

Figure 12B:
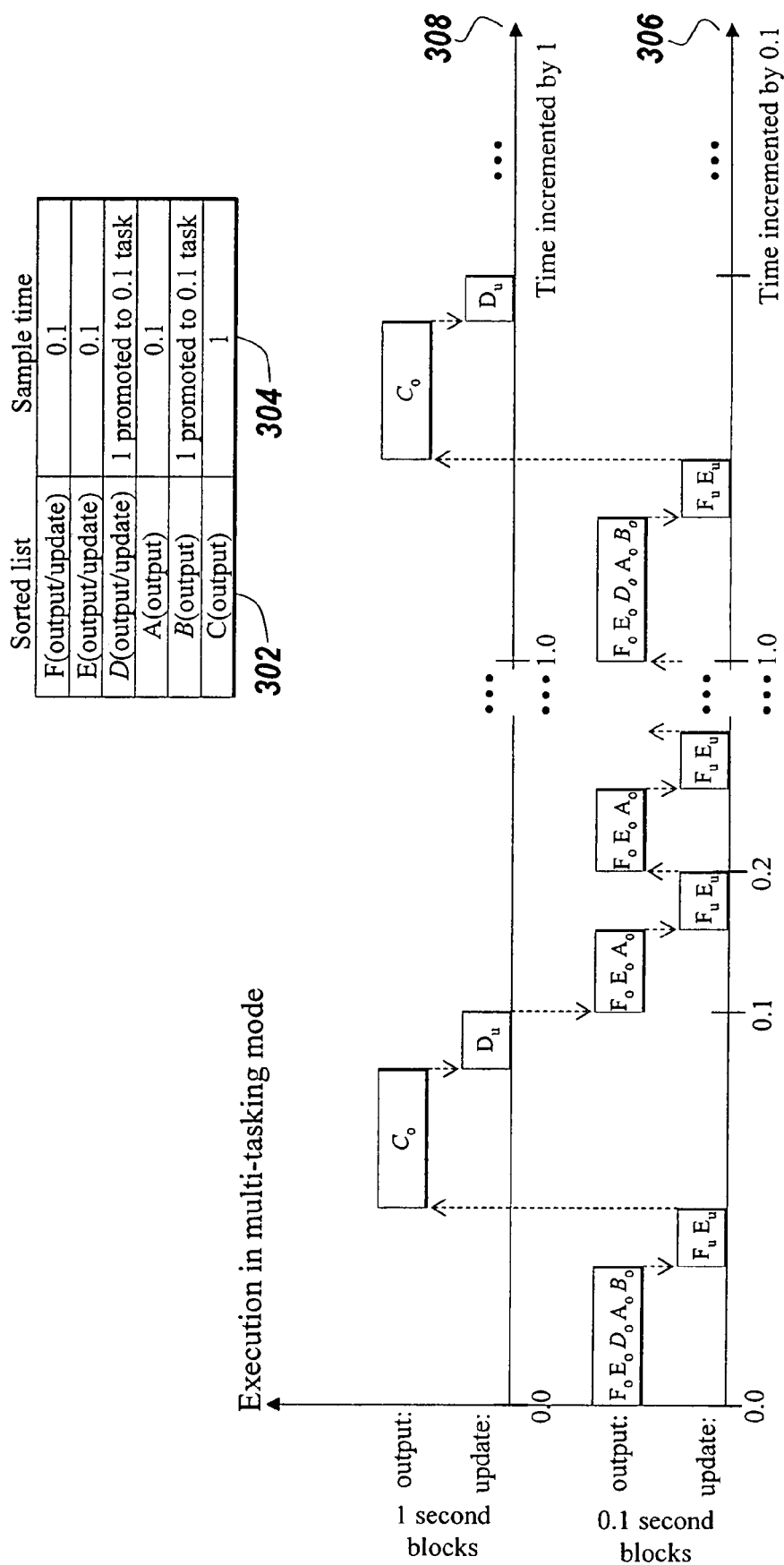
FIG. 12B depicts the execution timing of block diagrams in multi-task mode.

The execution of our example in the multitask mode may be seen in FIG. 12B. At time T=0, the engine first executes the high priority output methods (those with TID 0) for Blocks F, E, D, A and B, then it executes the high priority update methods (those with TID 0) for Blocks F and E. After finishing the high priority blocks, the engine executes the lower priority output block methods (those with TID 1) for Block C, and then executes the lower priority update methods (those with TID 1), which, in this example, is Block D. In contrast to the single task mode, in multitask mode the engine runs through a TID inner loop to execute the output and update block methods before going on to the Integration step, as the flow chart in FIG. 13 which is discussed below illustrates.

As a result of the inner TID loop, as well as the segregated block method execution lists, the order of execution in multitask mode differs from the order of execution in single task mode. Recall for the example that in single task mode that the order of execution at T=0 is: $F_o, E_o, D_o, A_o, B_o, C_o, F_u, E_u,$ and $D_u$, where the subscript "o" stands for output method and the subscript "u" stands for update method. In the multitask mode, however, the order of execution at T=0 is: $F_o, E_o, D_o, A_o, B_o, F_u, E_u, C_o,$ and $D_u$. Notice that $C_o$ is executed in a different order in multitasking mode. This occurs because separate method execution lists (based upon sample time) are created and run in order from fasted sample time to slowest sample time. Additionally, the use of rate transition blocks restricts the connection of blocks with different rates. By requiring the insertion of these blocks into the model, the engine ensures that execution in multitask mode will follow the sorted list.

After it is finished executing the block methods for T=0, like in the single task mode, the execution time is incremented (again assume by 0.1 seconds) and execution goes to the beginning of the loop. The engine executes $F_o, E_o, A_o, F_u,$ and $E_u$, and the engine does not execute the block methods of Blocks D, B, and C because the current execution time is not an integer multiple of those block's sample time. The engine repeats this execution until the execution time is incremented to 1.0 seconds, whereupon execution occurs in the same manner as described for T=0. The engine repeats this overall process until the execution stop time is reached.

FIG. 12B shows two time-lines; the lower time-line 306 represents the execution order of the faster sample time blocks (Blocks A, E, and F), along with the rate transition blocks (Blocks B and D), while the top time-line 308 shows the execution order of the slower sample time block (Block C), and the rate transition (Block D) update method. The time-lines are generated from the sorted list 302 and the associated sample times 304. The lower line, representing the faster sample times has a TID of 0, and the top line has a TID of 1. For execution time T=0, the chart shows that the engine executes the output methods for Blocks F, E, D, A, and B (designated on the chart as $F_o$, $E_o$, $D_o$, $A_o$, $B_o$). Then, consistent with the flow chart for the multi-tasking mode (see FIG. 13 discussed below), the engine executes the update block methods for Blocks F and E (designated $F_u$, and $E_u$). Once the engine is finished with the high priority block methods, the output method for Block C ($C_o$) and the update method for rate transition block D ($D_u$) are executed. The execution time is then incremented by the step size (continue to assume 0.1 seconds) and the blocks that have a sample hit are executed. The figure shows execution of $F_o$, $E_o$, $A_o$, $F_u$, and $E_u$, which is repeated, as noted above, until execution time equals 1.0 second. Notice, like in the non-real-time case for Single-task mode, the engine does not wait for time to elapse; rather it executes block methods immediately upon completion of the previous pass through the loop.

Figure 13:
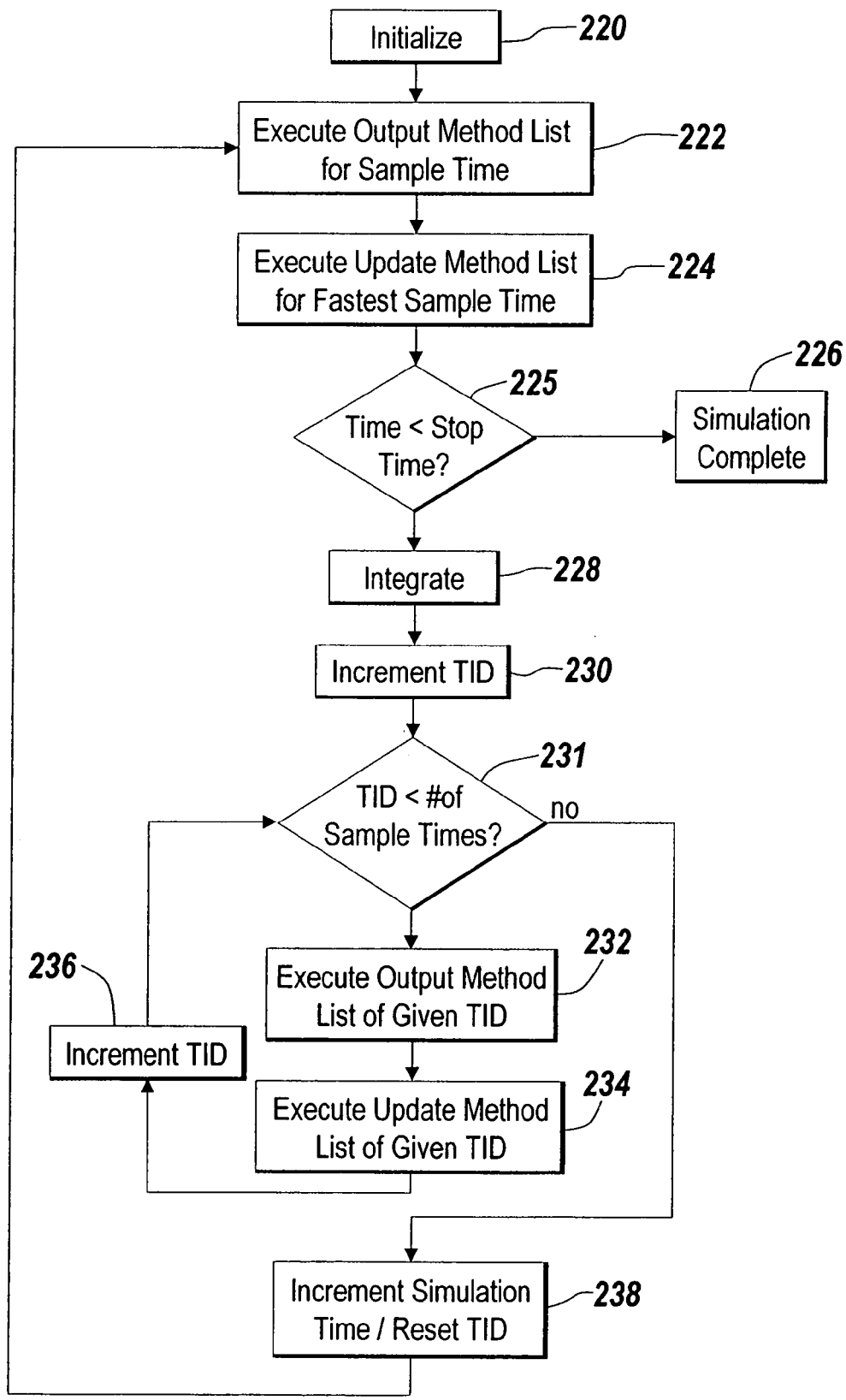
FIG. 13 is a flowchart of the overall sequence of steps taken by Simulink in multi-task mode.

FIG. 13 shows the overall sequence of steps taken by Simulink in multitask mode. Following initialization (step 220), the output method execution list is executed for the fastest sample time (step 222). The update method execution list is then executed for the fastest sample time (step 224). A time parameter is checked (step 225) to determine to determine if the time is less than a designated stop time. If the stop time has been reached, the simulation completes (step 226). Otherwise, the integrate stage (step 228) is performed. The task ID variable is incremented (step 230) and compared to a parameter of the number of sample times (step 231). If the task ID is less than the number of sample times, the output method execution list for the methods assigned the new task Id are executed (232) followed by the execution of the update method execution list assigned the new task ID (step 234). The task ID variable is incremented and the process iterates with the task ID being compared to the number of sample rate times (step 231). When the task ID number is determined to equal the number of sample rate times, the simulation time is incremented (step 238) and the entire process iterates with the output method list execution list (step 222) being executed for the fastest sample times. The process continues until the end of simulation when the time equals the stop time (step 226).

In order to understand how the step size is picked within SimLoop, it is first necessary to understand the notion of a solver. The solver is a module of the execution engine that is responsible for performing two tasks: (a) determining how far execution time should be advanced between consecutive passes through the SimLoop in order to accurately trace the system's outputs, and (b) integrating the derivative of the states of the system to obtain the actual states. Based on how solvers performs the first task, they are generally classified into two basic classes: Fixed-step solvers or Variable-step solvers.

Fixed-step solvers are solvers in which the time step-size between consecutive passes through the SimLoop is a fixed quantity. The user generally explicitly specifies this quantity. These solvers are used to model types of systems that must operate within a defined time (discrete systems). For instance, an anti-lock braking system may be designed to control a car's braking system, and to execute such control in one-one hundredth (0.01) of a second so as to assure the car stops safely; if the braking system does not meet its timing constraints, the car may crash. Fixed-step solvers, therefore, are designed to help model discrete systems that have to generate a result in a fixed time period, and the fixed-step execution assures that the modeled system can generate such results.

Variable-step solvers are designed to model continuous systems where non-evenly spaced time steps are needed to simulate all significant behavior. For example, one may want to simulate the path of a bouncing ball, where it bounces, how high it bounces, and where it stops. It is known, based on experience, that the ball's bounces will not be evenly spaced, and that the height of the bounces will diminish as a result of gravity, friction, and other forces. Variable-step solvers are used for these types of continuous systems and to determine what step size to use so that the behavior of the ball will be accurately modeled.

The two broad classes of solvers are further subdivided based on the integration task they perform. There are several algorithms for carrying out numerical integration. The particular choice of the integration algorithm gives rise to the subclasses of solvers.

Figure 14:
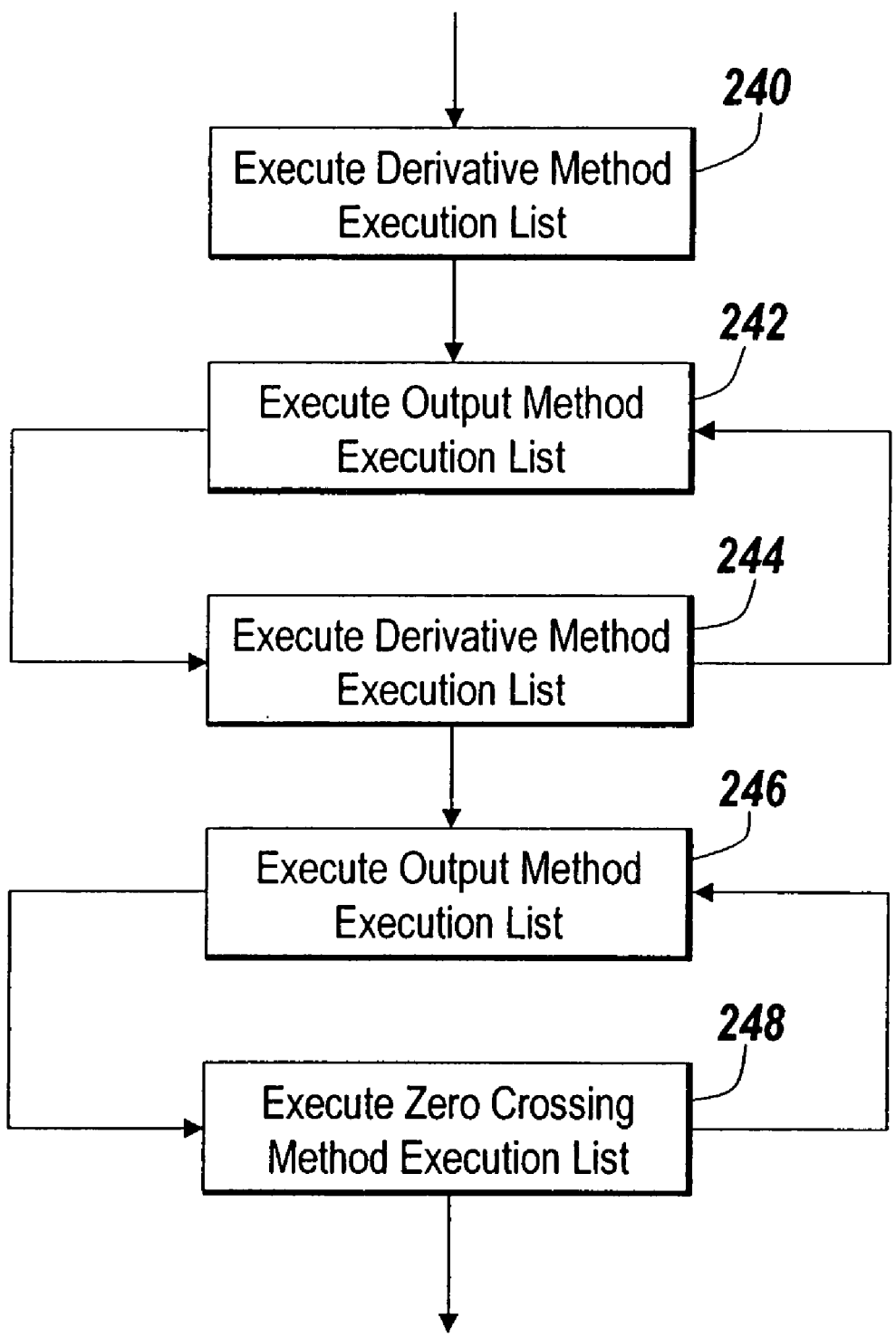
FIG. 14 is a flowchart of the sequence of steps followed by a variable-step solver.

The difference in the conceptual definition of Fixed- and Variable-step solvers leads to the functional difference in the context of the SimLoop. The major difference between the solvers arises in the Integrate step of the SimLoop which is depicted in FIG. 14. During the Integrate step, the Variable-step solver executes the Output and Derivative block method lists for a number of iterations that varies based on the solver subclass (i.e., the numerical integration algorithm it uses) and integration error tolerances. In a fixed-step solver, the number of iterations is fixed for a given solver subclass. Another difference between solvers arises in the Integrate phase in the context of an operation known as zero-crossing detection. Zero-crossings in the derivatives of the state generally indicate a discontinuity in the states themselves. Because discontinuities often indicate a significant change in a dynamic system, it is important to trace the system outputs precisely at such points. Otherwise, the outputs of the model could lead to false conclusions about the behavior of the system under investigation. Consider, again the example of the bouncing ball. If the point at which the ball hits the floor occurs between simulation steps, the simulated ball appears to reverse position in midair. This might lead an investigator to false conclusions about the physics of the bouncing ball. To avoid such misleading conclusions, it is important that the execution has time steps on and around the vicinity of discontinuities.

In the case of Fixed-step solvers, there is no notion of zero-crossing detection and one is not guaranteed to find all points of discontinuity. One can only keep reducing the step-size to increase the probability of hitting the discontinuity. By contrast, in the case of Variable-step solvers, the Integrate step explicitly includes zero-crossing detection. The execution step size is then adjusted accordingly to ensure that discontinuities are tracked accurately. To enable zero-crossing detection, blocks that can produce discontinuities instantiate a special execution method. This method registers a set of zero-crossing variables with the execution engine, each of which is a function of a state variable that can have a discontinuity. The zero-crossing function passes through zero from a positive or negative value when the corresponding discontinuity occurs. During the zero-crossing detection phase of the Integration step, the engine asks each block that has registered zero-crossing variables to update the variables for the projected time of the next time step. These variables are then checked for a change of sign since the current step. Such a change indicates the presence of a discontinuity. An iterative process then tries to narrow down the location of the discontinuity and ensure that the next few time steps (at least 2) accurately bracket the location of the discontinuity. The final difference, which is in the step-size during execution, is a direct consequence of the two previous differences in the step-size determination. In Fixed-step solvers, the step size is a known and fixed quantity. For Variable-step solvers, the step size is determined during the integration iterations and the zero-crossing detection that happens during the Integration step.

An example of the variable-step solver is shown in FIG. 14, the derivative method execution list is executed (step 240) followed by the output method execution list (step 242). The derivative method execution list is then executed again (step 244) and the solver iterates between the execution of the output method execution list (step 242) and the execution of the derivative method execution list (step 244). A similar iteration loop then occurs between the execution of the output method execution list (step 246) and the execution of the zero-crossing method execution list (step 248).

While it is theoretically possible to have Variable-step solvers in the context of multitasking, such a combination is not employed in practice. This is because the step-size for such solvers can become very small making it impossible to keep up with the real-time constraint that generally goes along with multitasking execution. An added complication is that the integration step in such solvers is iterative and takes varying amounts of time at each step of the execution. Therefore, Variable-step solvers are generally used only in conjunction with the Single-Tasking SimLoop. Additionally, they are not usually employed in systems that need to operate in real-time.

When a model contains an algebraic loop, the engine calls a loop solving routine at each time step. The loop solver performs iterations and perturbations to determine the solution to the algebraic condition (if it can). One possible approach to solving the algebraic equation F(z)=0, is to use Newton's method with weak line search and rank-one updates to a Jacobian matrix of partial derivatives. Although the method is robust, it is possible to create loops for which the loop solver will not converge without a good initial guess for the algebraic states z. Special blocks are generally provided to specify an initial guess of the states in the algebraic loop.

In addition to the various forms of the SimLoop, modeling packages such as Simulink use the output of the Link stage to compute linear models through a process generally referred to as model linearization. These linear models may be used in the SimLoop at various points in the execution of the overall model. Alternatively, the linear model may be returned to the user. The linearization process involves the use of a Jacobian method defined on blocks and numerical Jacobian algorithm.

According to an illustrative embodiment of the invention, a method of execution instruction reuse is provided with reference to the time-based block diagrams of Simulink. It is understood that the invention is applicable to a wide variety of model-based design products based on a block diagram environment. Classes of such block diagrams include the time-based block diagrams such as those found within Simulink, state-based and flow diagrams such as those found within Stateflow, Data-flow diagrams, Etc. A common characteristic among these various forms of block diagrams is that they define semantics on how to execute the diagram on an electronic device such as a computer, microcontroller, FPGA, custom hardware/silicon, etc.

Figure 15:
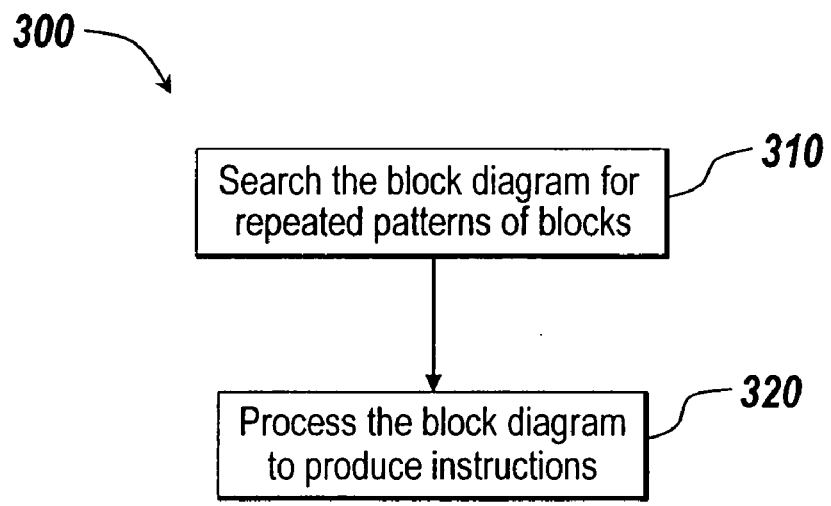
FIG. 15 depicts a method for processing a block diagram to search for repeated patterns of blocks.

With reference to FIG. 4, and as discussed above, once a block diagram model has been constructed, the next step in preparing the model to be executed is to compile 42 the block diagram. After the sorting of the blocks during the compile stage 42 described above, a method 300 according an illustrative embodiment of the invention, shown in FIG. 15, includes searching, step 310, a block diagram model, such as by the use of the directed graph described above, for repeated patterns of blocks. If any matching patterns are found, these sections of the block diagram are duplicative of each other and can be replaced by a common set of instructions. The block diagram model is processed, step 320, to produce instructions to perform the simulation of the block diagram model, such that a common set of the instructions is used for simulation of any matching patterns. This common set of instructions can be a function in the generated code if code is generated 48, or the common set of instructions can be implemented in-memory for the interpretive version of the block diagram during the Simulation Loop 50.

Figure 16A:
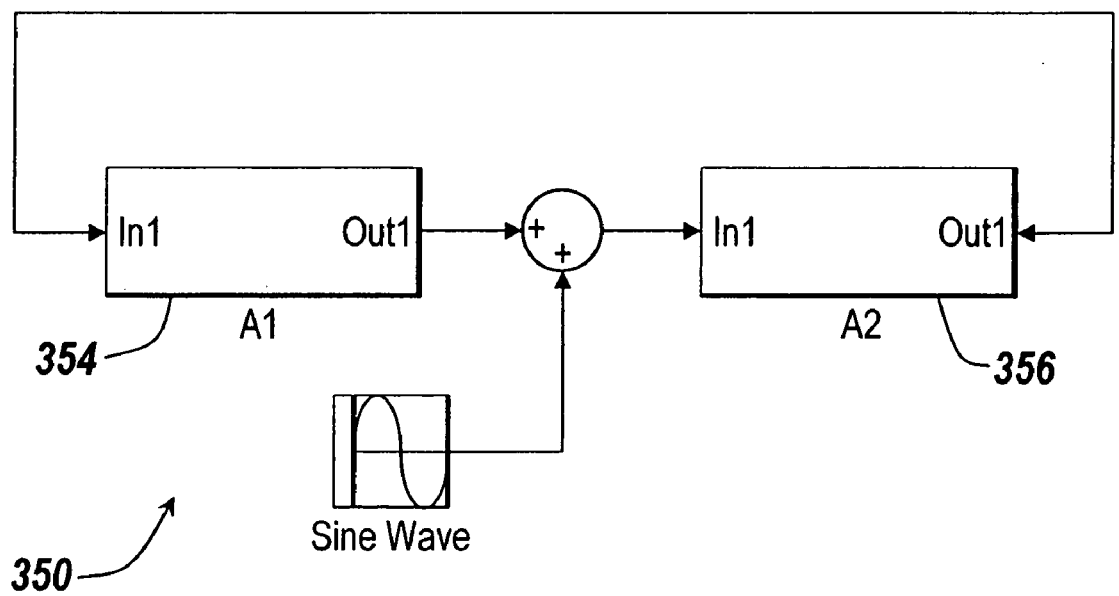
FIGS. 16A-16D illustrate various views of a block diagram.
Figure 16B:
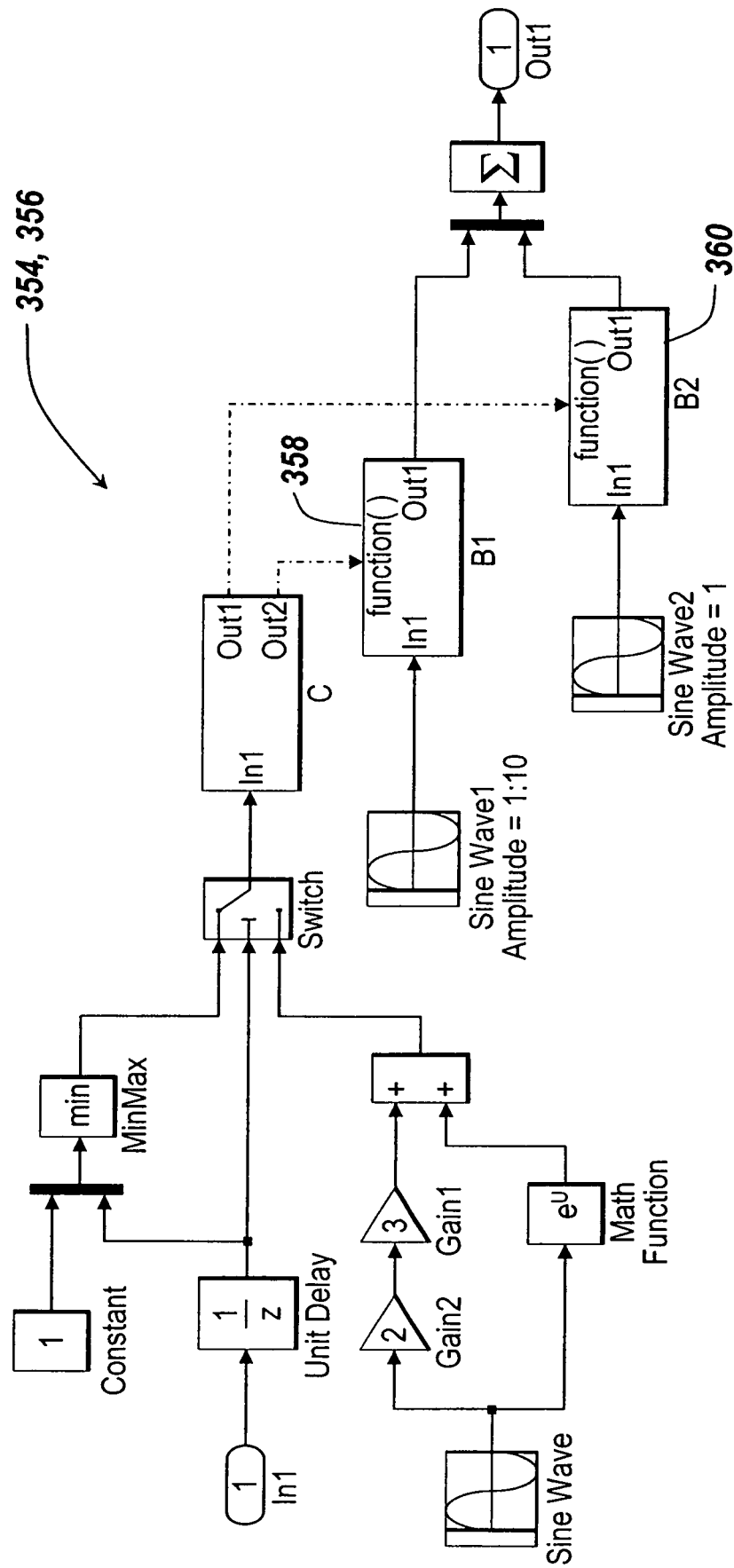
Figure 16C:
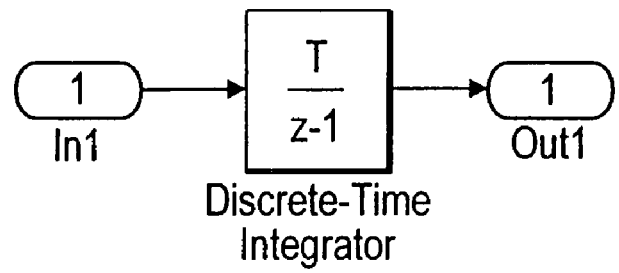
Figure 16D:
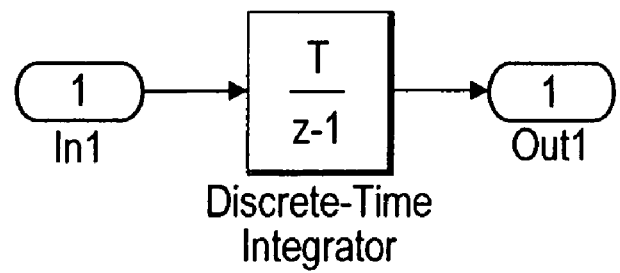
Figure 17:
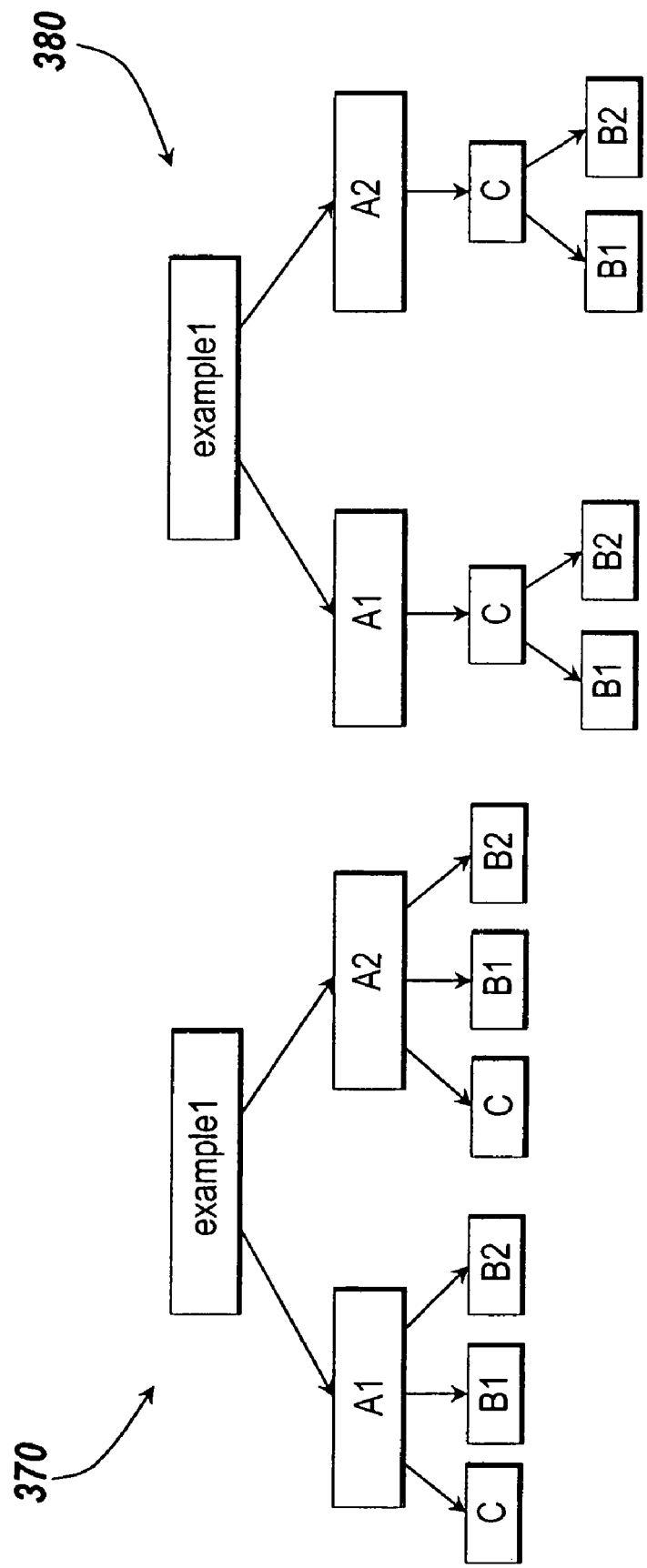
FIG. 17 illustrates a graphical hierarchy and execution hierarchy of the block diagram of FIGS. 16A-16D.

A block diagram consists of blocks and lines with hierarchy defined by subsystem blocks. The graphical hierarchy does not in general reflect the actual execution hierarchy of the block diagram. The execution hierarchy is captured in a call graph. One example of where the execution hierarchy may differ is due to function-call subsystems where an explicit function-call signal is used to control execution of the subsystem by an owner block. As an example, consider the block diagram 350 of FIG. 16A. This block diagram illustrates the root of the block diagram 350, showing two subsystems, A1 354 and A2 356. The contents of each of A1 354 and A2 354 are shown in FIG. 16B and are visually identical to each other. These two identical subsystems may have been created by the users via a copy operation, or they may originate from the same source within a library. Also, note that the subsystems, B1 358 and B2 360, shown in FIGS. 16C and 16D, respectively, are not identical even though, graphically, they appear identical. The reason these two subsystems are not identical is that they have different characteristics that affect their structure. B1 is fed with a vector of width 10, where as B2 is fed with a vector of width 1. In some models the graphical model hierarchy is equivalent to the execution hierarchy. However, in general they may often differ. The graphical hierarchy 370 and execution hierarchy 380 are shown in FIG. 17 for this example.

Figure 18:
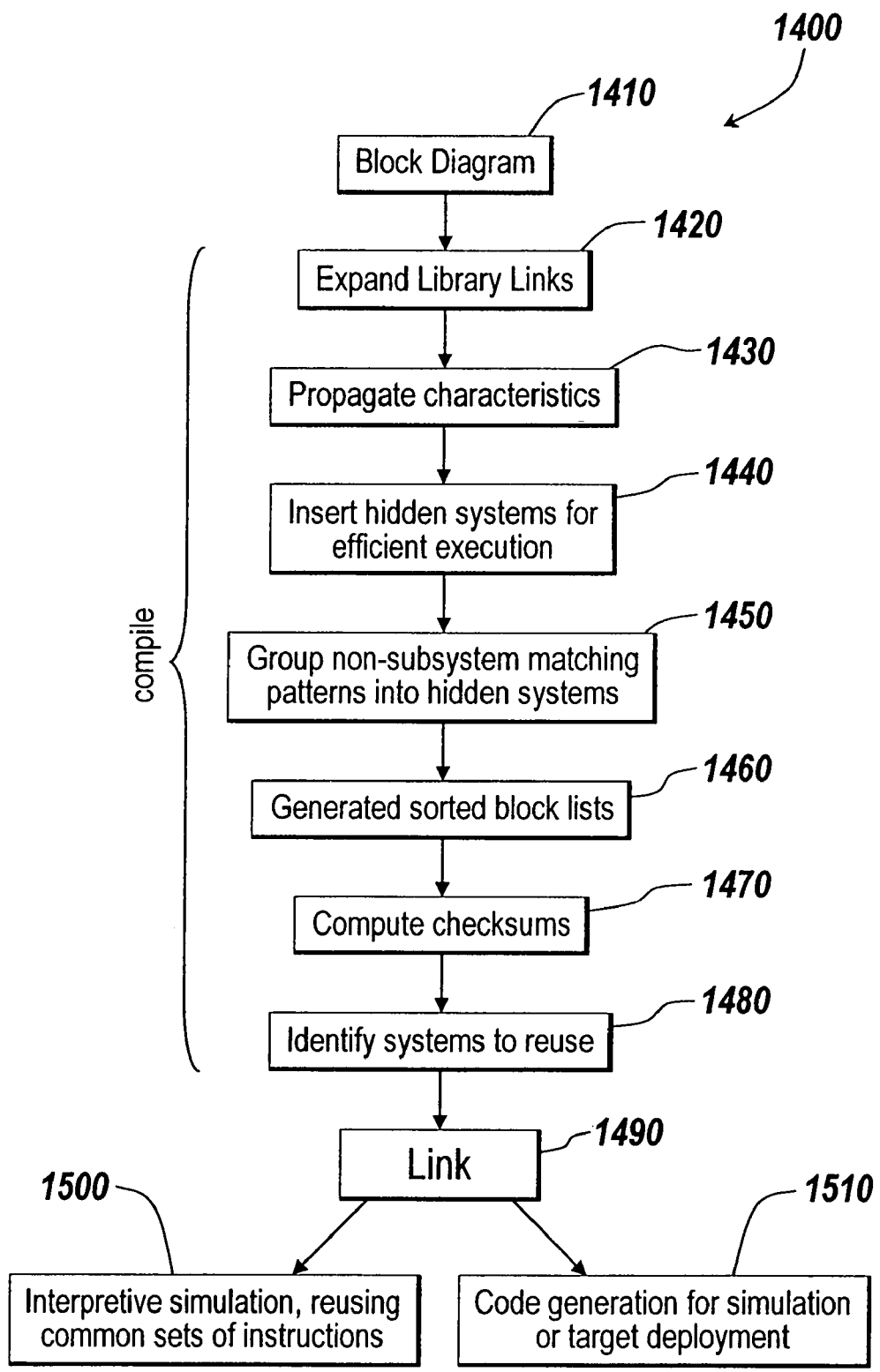
FIG. 18 depicts an example process of pattern matching sections of the model to create reused functions.

A sample process 1400 of pattern matching sections of the model to create reused functions is shown in FIG. 18. Beginning with a block diagram 1410, the expand library links phase 1420 expand, in place, references to blocks that come from a common library. For example, A1 and A2 may link back to the same library source. Likewise, B1 and B2 may link back to the same library source. This expansion of library links enables one to treat library blocks as templates. Recall that the example involving A1 and A2 were structurally identical whereas B1 and B2 were visually identical, but not structurally identical. This ability to expand subsystems in place, and then identify identical portions enables library elements to be treated as templates much like C++ templates. The propagate characteristics phase 1430 is discussed in greater detail above.

Figure 19:
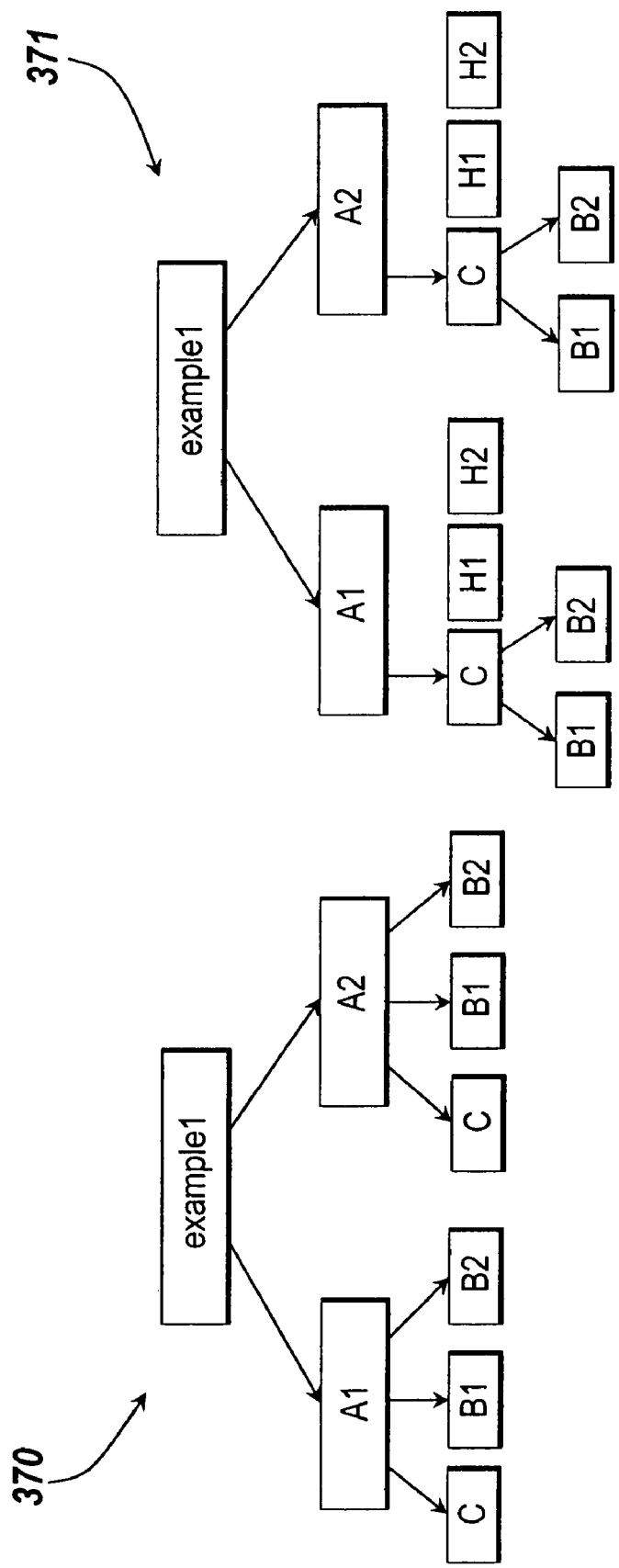
FIG. 19 illustrates the altered call graph hierarchy of the block diagram of FIGS. 16A-16D.

The group non-subsystem matching patterns into hidden subsystems phase 1440 is the process (described below) of generic pattern matching. The compute checksums phase 1470 is the means by which patterns are matched. The identify systems to reuse phase 1480 is where the final version of the call graph is created where the first instance is identified. To illustrate these concepts, let's revisit example 1. At the start of the compile phase, we have a block diagram hierarchy and a conceptual call as shown in FIG. 17. In the insert hidden systems for execution phase 1440, the structure of the call graph is altered as shown in FIG. 19 from the graphical hierarchy 370 to the altered graphical hierarchy 371.

The H1 and H2 hidden systems are created for the switch block input ports 1 and 3. The execution of these two hidden systems is controlled by the switch block for efficient execution. During the group non-subsystem matching patterns into hidden subsystems phase 1450, the call graph is altered to include additional systems for any matched patterns. In the example, there are no patterns to match that will increase reuse.

With further reference to FIG. 18, linking 1490 follows the compilation stage. Following linking 1490, interpretive simulation 1500 can be performed, reusing common sets of instructions and/or code generation 1510 can be performed for simulation or target deployment.

In a preferred embodiment, the pattern matching stage of compilation uses checksums. In general, checksums provide an efficient way to give a short numerical value to a large set of items. Checksum algorithms guarantee that for identical collections of items that the checksum generated is the same. Such algorithms also try to produce non-identical checksums for collections of items that differ. Alternatively, one could use a brute force method of pattern matching by comparing every item within the collections (patterns) to be matched. Thus, during the search for pattern matches, checksums may be used as an efficient way to keep track of the pertinent characteristics associated with a block or group of blocks such as data type, signal dimensions, sample time, etc. Although the invention is not so limited, one example of a checksum is the MD5 checksum available from RSA Security Inc, of Bedford, Mass. According to an implementation of the invention, the checksum is calculated on all the properties of each of the patterns that affects the execution structure of the block diagram model. Checksums should give a unique value for each unique set of characteristics. Checksums are stored using large integers, so that the chance of a false unique value is very small. Optionally, a second step of validating that the sections of the block diagram are identical may be performed, such as comparing each of the characteristics of the patterns separately.

Figure 20:
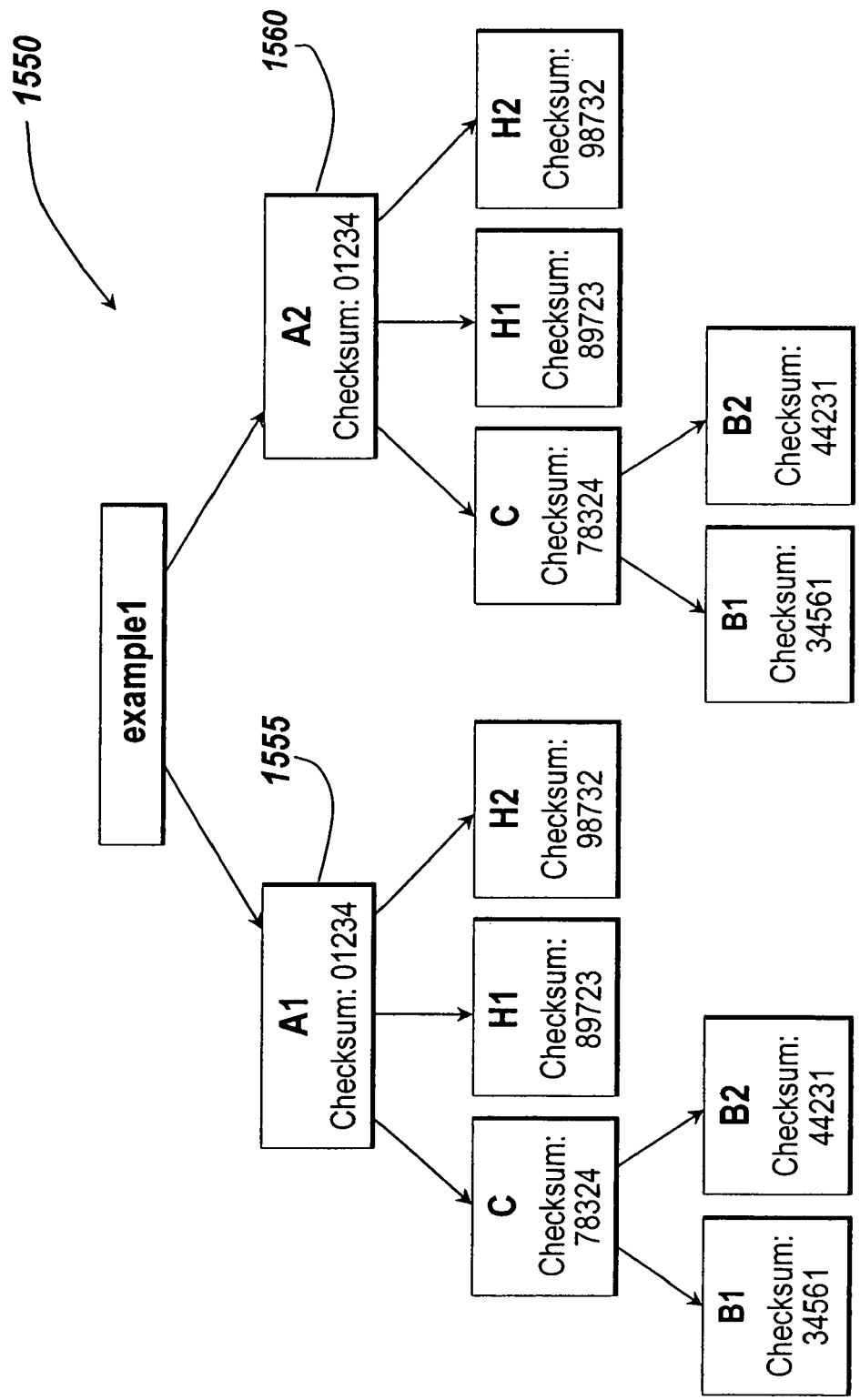
FIG. 20 the altered call graph hierarchy of FIG. 19 with checksums.

This process of computing checksums occurs at the compute checksums phase 1470 during compilation. The results of the checksums are stored with the systems in the call graph. Returning to example 1, a call graph 1550 is provided as shown in FIG. 20. We see that A1 and A2 have the same checksum 1555, 1560 and thus can be reused.

Two examples of pattern matching include generic matching and nonvirtual subsystem matching. Generic matching is not restricted to subsystems and can be accomplished by identifying common patterns within the block diagrams, such as by locating common patterns within 'subsections' of the directed graphs and converting them to hidden atomic subsystems. Nonvirtual subsystem matching involves, a checksum being created for every nonvirtual subsystem in the block diagram. Any subsystems that have identical checksums are then replaced by a common set of instructions, either in-memory or in the generated code.

Figure 21:
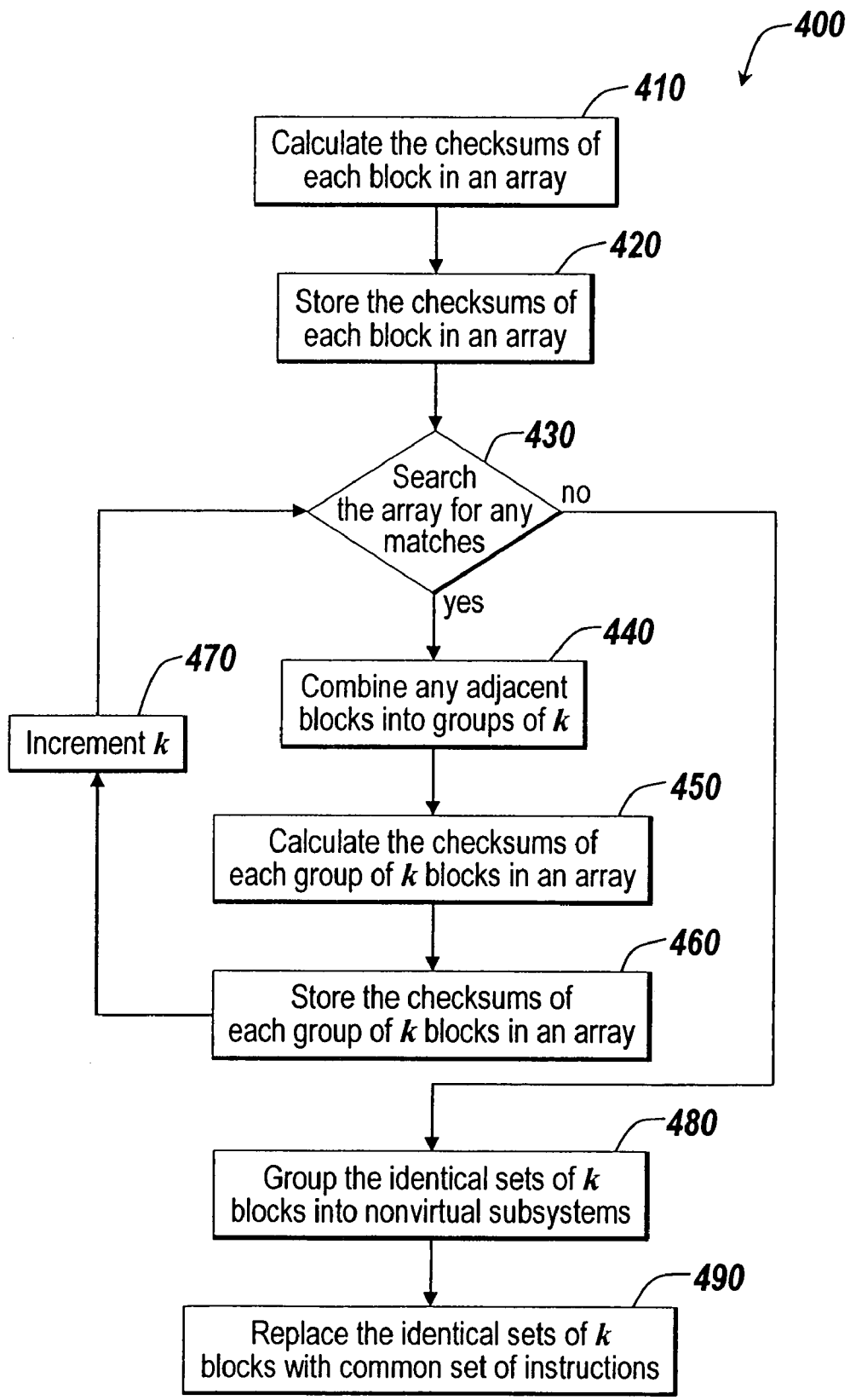
FIG. 21 depicts an example method for finding duplicate patterns.
Figure 22:
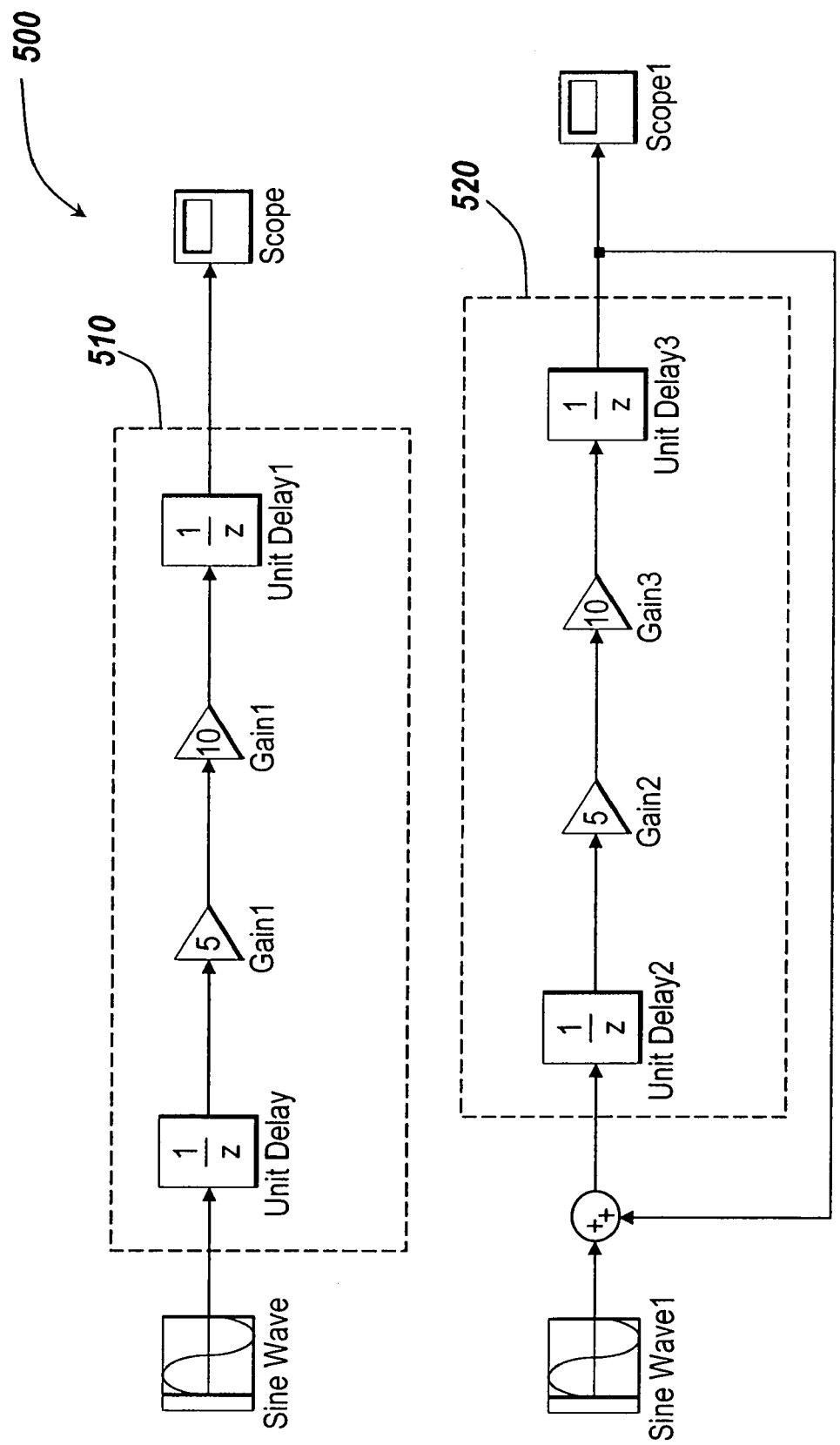
FIG. 22 depicts example block diagrams having matching patterns.

Another method to find duplicate patterns is to search the block diagram for groups of blocks that are identical. These groups do not have to be drawn as nonvirtual subsystems by the user, rather the invention may group these blocks into nonvirtual subsystems and replace each instance with a common set of instructions. A sample method 400 for one possible method to accomplish this is shown in FIG. 21. By way of example, a checksum is calculated, step 410, for each block in the block diagram model and the checksum is stored, step 420, in an array. The array is searched, step 430, for any matches of the checksums. If matches exist, checksums corresponding to block(s) adjacent to the blocks having matching checksums are grouped, step 440, into groups of k, where k starts at 2. Therefore, a group of 2 is formed by including a checksum of an adjacent block with the checksum matching another checksum in the array. An "adjacent" block in this sense is considered to be a block that interacts with another block, such as by interaction of their ports in communicating a signal. Checksums of each group of k blocks are then calculated, step 450, and stored, step 460, in the array. k is then incremented, step 470, before returning to searching, step 430, the array for any matches. If searching, step 430, does not result in any matches, identical sets of k blocks are grouped, step 480, into nonvirtual subsystems and replaced, step 490, with a common set of instructions. Variations of the method 400 include adding a heuristic to the searching, step 430, by stopping if the number of matches decreases by some amount. For example, five identical instances of a two-block set may be better than two identical instances of a three-block set. It is understood that there are other possible algorithms for generic matching. An example block diagram 500 and a result of applying a generic matching method to locate two matching patterns 510, 520, is shown in FIG. 22. A portion of the generated code for this block diagram is shown below. Note that one function was generated for both groups of blocks.

```
/* Outputs for atomic system:
*       '<Root>/Subsystem'
*       '<Root>/Subayatem1'
*/
void generic_matching_Subsyste(rtB_generic_matching_Subsyste *localB,
rtDW_generic_matching_Subsyste *localDW, rtP_generic_matching_Subsyste *localP)
(
    /*      Gain: '<S1>/Gain1' incorporates:
    *           Gain: '<S1>/Gain'
    *           UnitDelay: '<S1>/Unit Delay'
    *
    *       Regarding '<S1>/Gain1':
    *           Gain value: localP->Gain1_Gain
    *
    *       Regarding '<S1>/Gain':
    *           Gain value: localP->Gain_Gain
    */
    localB->Gain1 = ((localDW->Unit_Delay_DSTATE) * localP->Gain_Gain) *
        localP->Gain1_Gain;
    /*      UnitDelay: '<S1>/Unit Delay1' */
    localB->Unit_Delay1 = localDW->Unit_Delay1_DSTATE;
)
```

The second example of pattern matching involves nonvirtual subsystem matching. In this form of pattern matching, searching is performed for nonvirtual subsystems that have the same checksum. To accomplish this, checksums are generated for each subsystem. Although the invention is not so limited, an example of how the checksum may be calculated is shown by the method 540 in FIG. 23. A checksum record, such as a 128 bit record, is created and attached to each subsystem. A subsystem counter, sysIdx, is initialized, step 542, and the subsystem counter is compared to the number of subsystems, step 544. If the number of subsystems is less than the subsystem counter, the checksum for subsystem(sysIdx) is set to an initial checksum, step 546, and a block counter, blkIdx, is set to 1, step 548.

Figure 23:
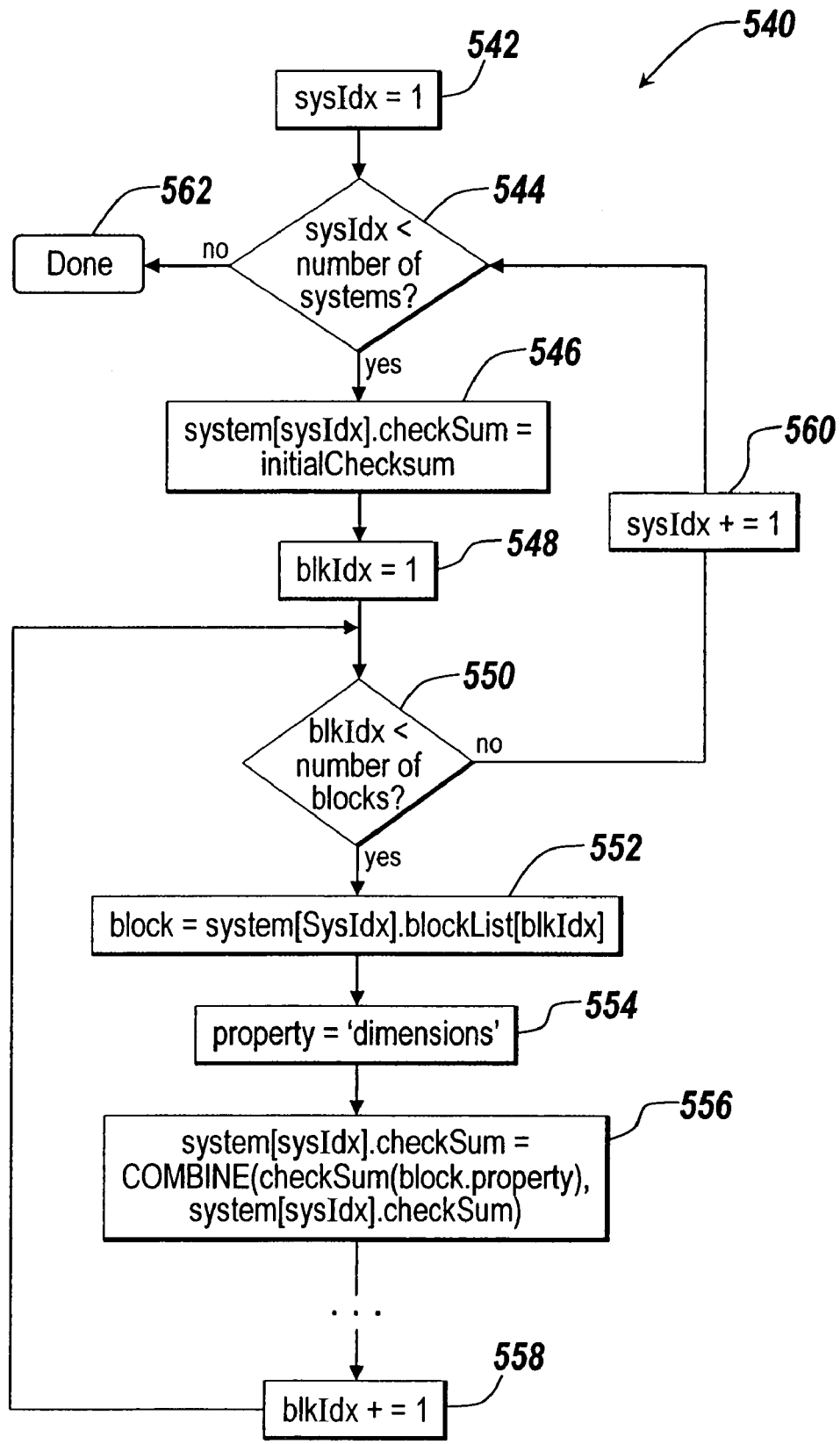
FIG. 23 depicts an example method for calculating a checksum.

A loop through each of the properties of block(blkIdx) that affect the execution structure of the block diagram are assigned a representative value and included in the checksum. For instance, a block may have an input signal that has a width of two and data type "double". In this case, the representative values would be the integer 2 and the string "double". With reference to FIG. 23, step 550 compares the block counter, blkIdx, to the number of blocks in the subsystem. The block to be read is set to read the blkIdx block of the SysIdx subsystem, step 552, and the property to be read is set to 'dimensions', step 554. The checksum of the subsystem sysIdx is set to the combination of the checksum of the block property being read and any previously calculated checksum of the subsystem, step 556. In the case of the MD5 checksum algorithm, there are methods provided which will update the existing checksum as the representative values are added. The block counter, blkIdx is then incremented, step 558, and the loop continues again at step 550. When all the blocks of the subsystem have been processed, the subsystem counter, sysIdx is incremented, step 560. When all the subsystems have been processed, the method is complete, step 562.

Figure 24:
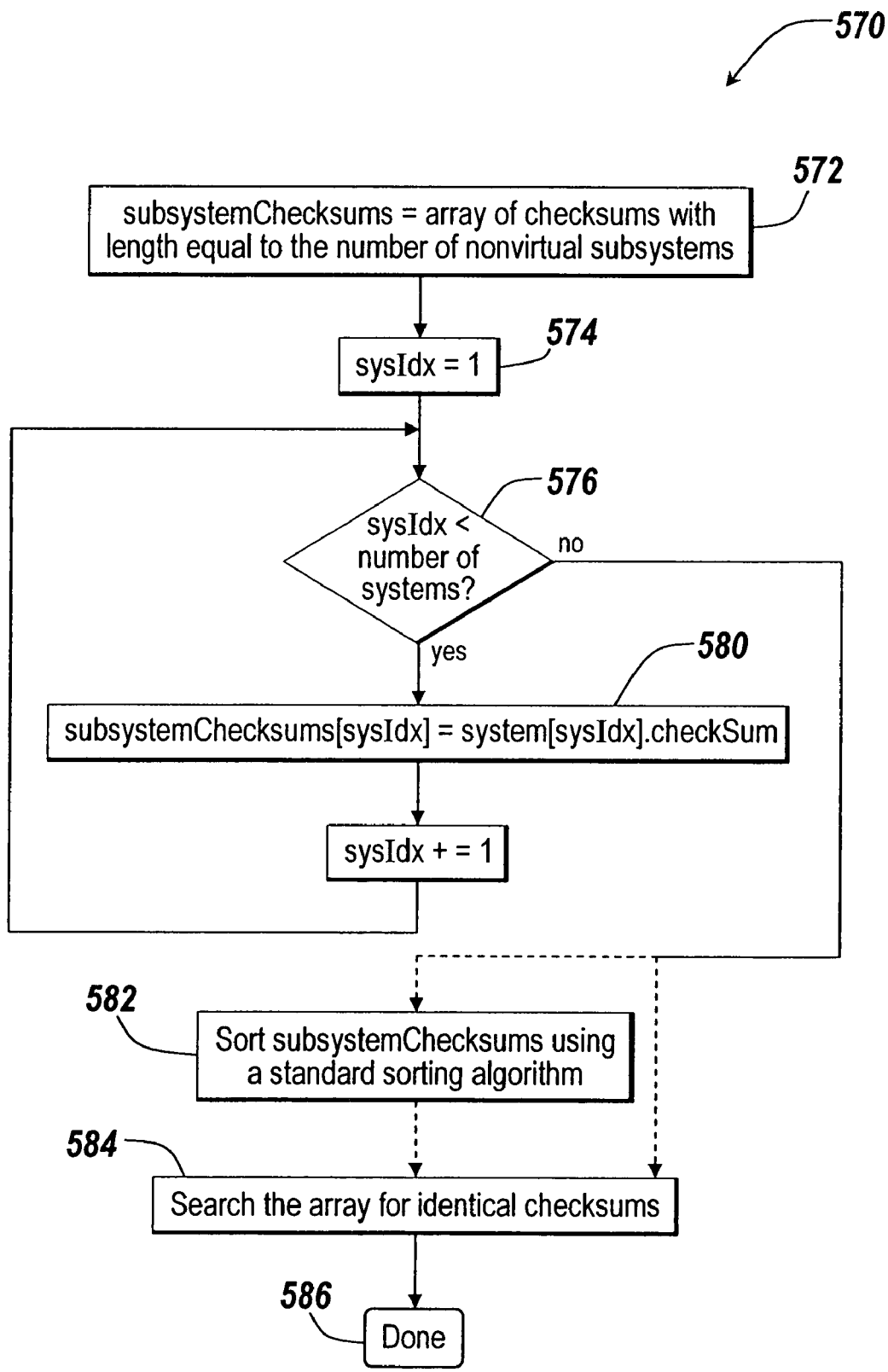
FIG. 24 depicts an example method for an example method for locating matching checksums

Once a checksum has been generated for each of the nonvirtual subsystems in a block diagram, the checksums are searched to determine if any subsystems have matching checksums. By way of example, a method 570 is provided in FIG. 24 illustrating an example method for locating matching checksums. An array is created, sized to the number of non-virtual subsystems in the block diagram model, step 572. A subsystem counter, sysIdx, is initialized, step 574. The method 570 then loops through each of the subsystems, reading the subsystem checksums into the array. If the number of subsystems is greater than the subsystem counter, sysIdx, step 576, the checksum of the subsystem sysIdx is read into system(sysIdx).checkSum, step 578. The subsystem counter is then incremented, step 580, and the loop continues at step 576.

When all of the subsystem checksums are in the array, the array is optionally sorted, step 582, and then the array, or sorted array, is then searched for identical checksums, step 584, which would be next to each other if the list was sorted. The methods then ends, step 586. If any matching checksums are found, then each instance of the corresponding subsystems can be replaced by a single instance, e.g. a common set of instructions.

Figure 25:
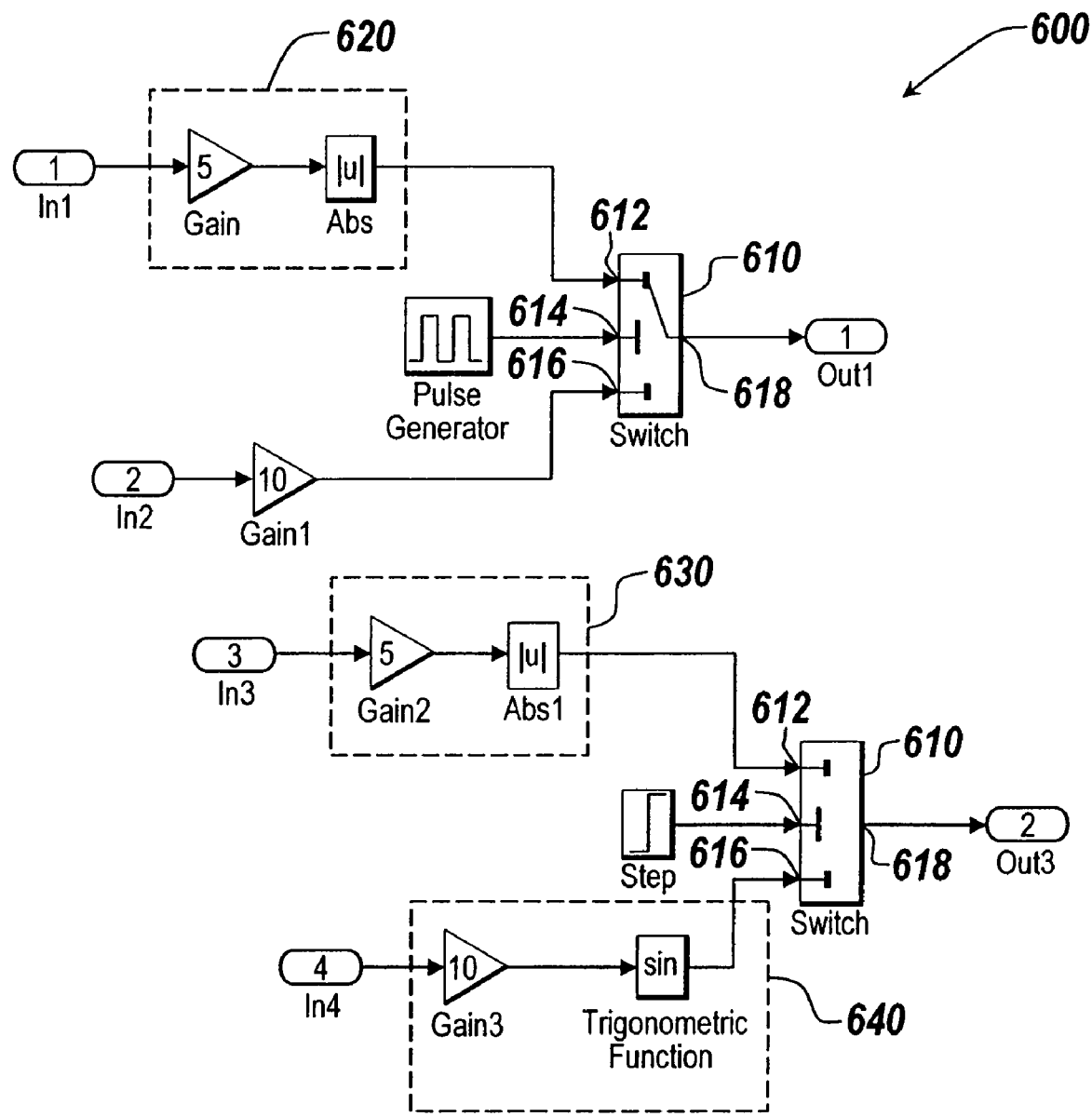
FIG. 25 depicts a block diagram having multiple derived systems.

For certain situations, it is sometimes advantageous to group a set of blocks together into a hidden nonvirtual subsystem, called a derived system, before a simulation is executed. One situation where this is beneficial involves a group of blocks feeding another block or port that does not run at every time step. In such a case, the group of blocks should only be run just before the driving block is ready to run. By way of example, with reference to FIG. 25, a block diagram 600 is provided having switch blocks 610. Each switch block 610 has three input ports 612, 614, 616. One input port 614 controls which of the other two input ports 612, 616 is read and copied to the output port 618. When the switch block 610 is run, the blocks that are feeding the input port that is not read do not have to calculate their outputs if no other block is reading them. The methods for identifying groups of blocks feeding another block or port that does not run at every time step is described in greater detail in U.S. Patent Application entitled, System And Method For Using Execution Contexts In Block Diagram Modeling, Ser. No. 10/414,644. It is noted that the results of such methods may be considered as subsystems for the purpose of searching for pattern matching. As illustrated in FIG. 25, two of the derived systems 620, 630 can be considered matching patterns and replaced with a common set of instructions. The third derived system 640 is not a match to either of the other derived systems 620, 630 and therefore would not be a matching pattern at a derived system level. It is understood that some or all of the blocks forming the third derived system 640 may be considered to be all or part of another pattern, such as a pattern determined by generic matching.

According to a further embodiment of the invention, in block diagrams, it is possible for the same parameter to be shared across several blocks. For example, there may be several gain blocks in a block diagram that all share the same gain value k, if the user changes the value of k it is expected that each gain block will see the same value. When this block is inside a reusable function, each call to the function may access the same memory location for the parameter. It is also possible that a common set of instructions is accessing different values for a parameter for each instance of the common set of instructions. In this case, a different memory location for the parameter may be passed to the common set of instructions.

Figure 26:
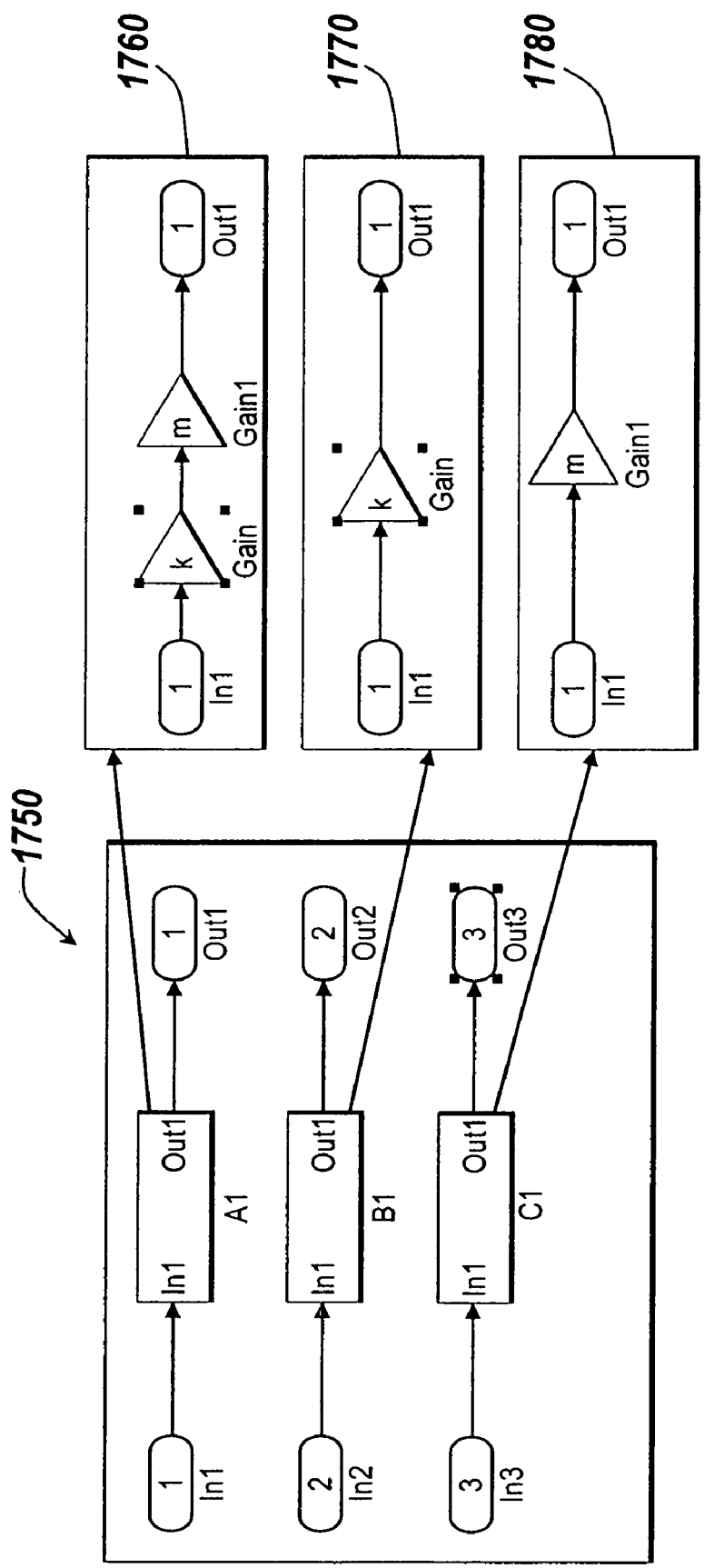
FIG. 26 depicts a sample block diagram.

In the case of shared parameter values, the parameter is placed at a level in the hierarchical structures so that data encapsulation is maximized. One possible goal is to create as many functions as possible which do not access any data outside of their hierarchical scope. So if two subsystems A and B share a single parameter k, but A already accesses another parameter m outside of its hierarchical scope, we place the parameter k in the scope of B. An example of this is shown in FIG. 26. A sample block diagram 1750 is shown. The contents of boxes A1, B1 and C1 are shown in enlarged boxes 1760, 1770, 1780. The hierarchical parameter data structure for this model is as follows:

```
/* Parameters for system: '<Root>/B1' */
    struct __rtP__param__example2__B1 {
        real__T k;
    };
/* Parameters for system: '<Root>/C1' */
    struct __rtP__param__example2__C1 {
        real__T m;
    };
/* Parameters (auto storage) */
    struct __Parameters__param__example2 {
        rtP__param__example2__C1 C1;      /* '<Root>/C1' */
        rtP__param__example2__B1 B1;      /* '<Root>/B1' */
    };
```

Note that k is placed inside B1 even though it shows up in both A1 and B1, and m is placed in C1 even though it shows up in both A1 and C1.

Figure 27:
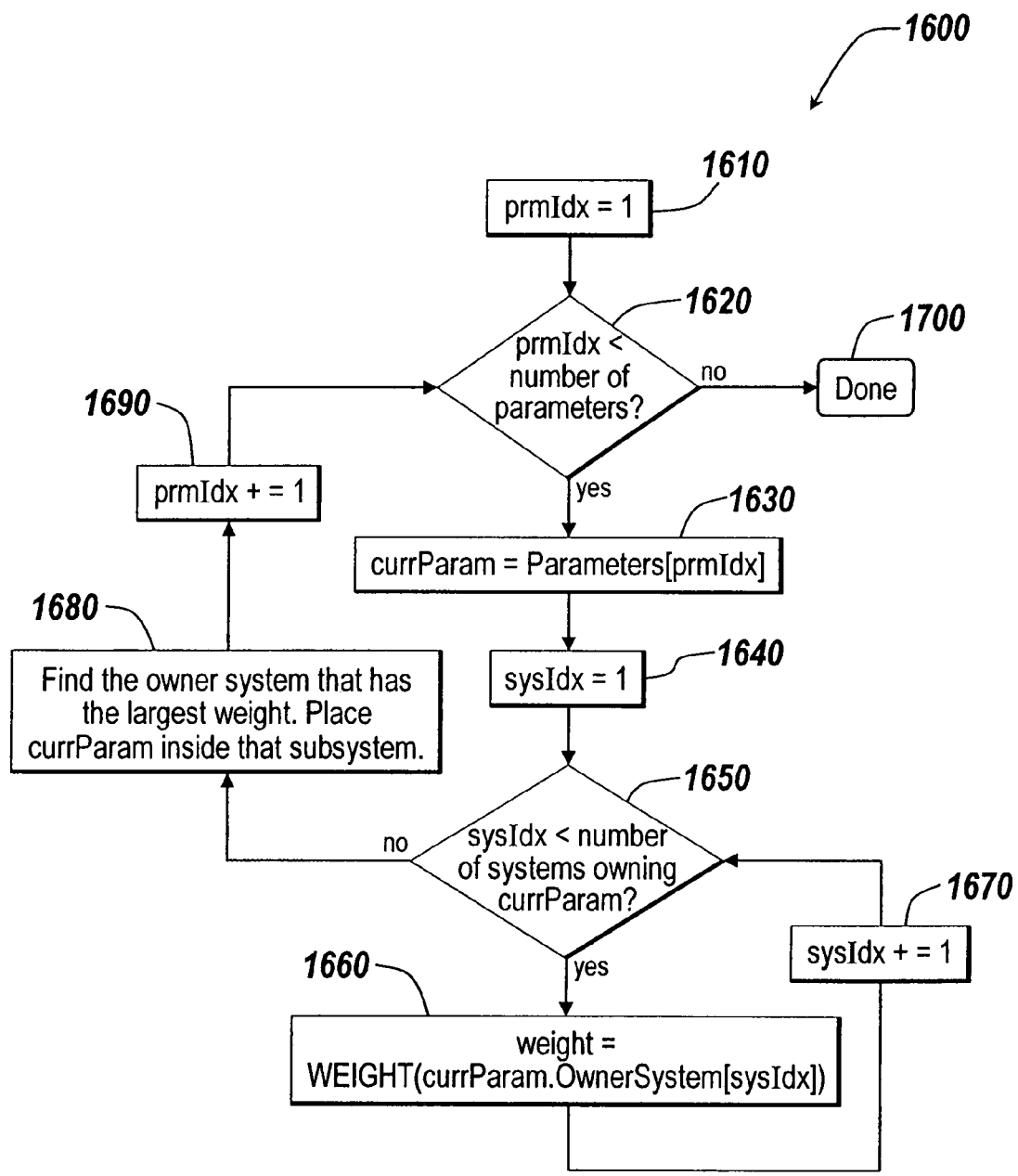
FIG. 27 depicts an example method for placing a parameter at a level in the hierarchical structures so that data encapsulation is maximized.

If both A and B are already accessing parameters outside of their hierarchical scope, then we place the parameter in the hierarchical scope of the system that is more likely to not access parameters outside of its scope. This is accomplished by assigning a weight value for each system that measures the likelihood that the system will not access any parameters outside of its scope. This weight function can be dependent on the total number of parameters a system owns, and how many of those parameters are shared with other systems; as fewer parameters are shared with other systems, the weight function will increase. An example method for implementing this is illustrated in FIG. 27. Another way to maximize data encapsulation is to put the shared parameter into the lowest common parent subsystem in the hierarchy of all the subsystems that share that parameter.

With reference to FIG. 27, the method 1600 includes initialization of the parameter counter, prmIdx, step 1610. If the number of parameters is greater that the parameter counter, step 1620, a current parameter, currParam, is set from a list of tunable parameters used in the block diagram, step 1630. A system counter, sysIdx, is initialized, step 1640. Each of the subsystems owning the current parameter are then processed. If the number of subsystems owning the current parameter is greater than the subsystem counter, step 1650, a weight value is assigned as discussed above, step 1660. The subsystem counter is incremented, step 1670. When all of the subsystems owning the current parameter have been processed, the current parameter is placed inside the owner subsystem with the largest weight, step 1680. The parameter counter is incremented, step 1690, and the loop begins again at step 1620. When all of the parameters have been processed, the method is complete, step 1700 When a block diagram is being constructed, there can be subsystems which seem to be identical but when code is generated, separate functions are created for each of the subsystems. In such a case, something different was added to the checksum for each of the subsystems. It is difficult to reverse engineer the value of a checksum after it has been created, so in order to give a diagnostic to the user indicating what is causing the checksums to be different, some information may be stored while creating the checksums. According to one implementation, incremental checksums may be determined such that each incremental checksum corresponds to a group of characteristics of each subsystem. Examples of groups of characteristics that can be represented by an incremental checksum include: connectivity, such as graphical sources and destinations, block type; port properties, such as dimensions, data type and complexity; internal block properties, such as continuous states and zero-crossing information; sample times; and reused function signature.

Figure 28:
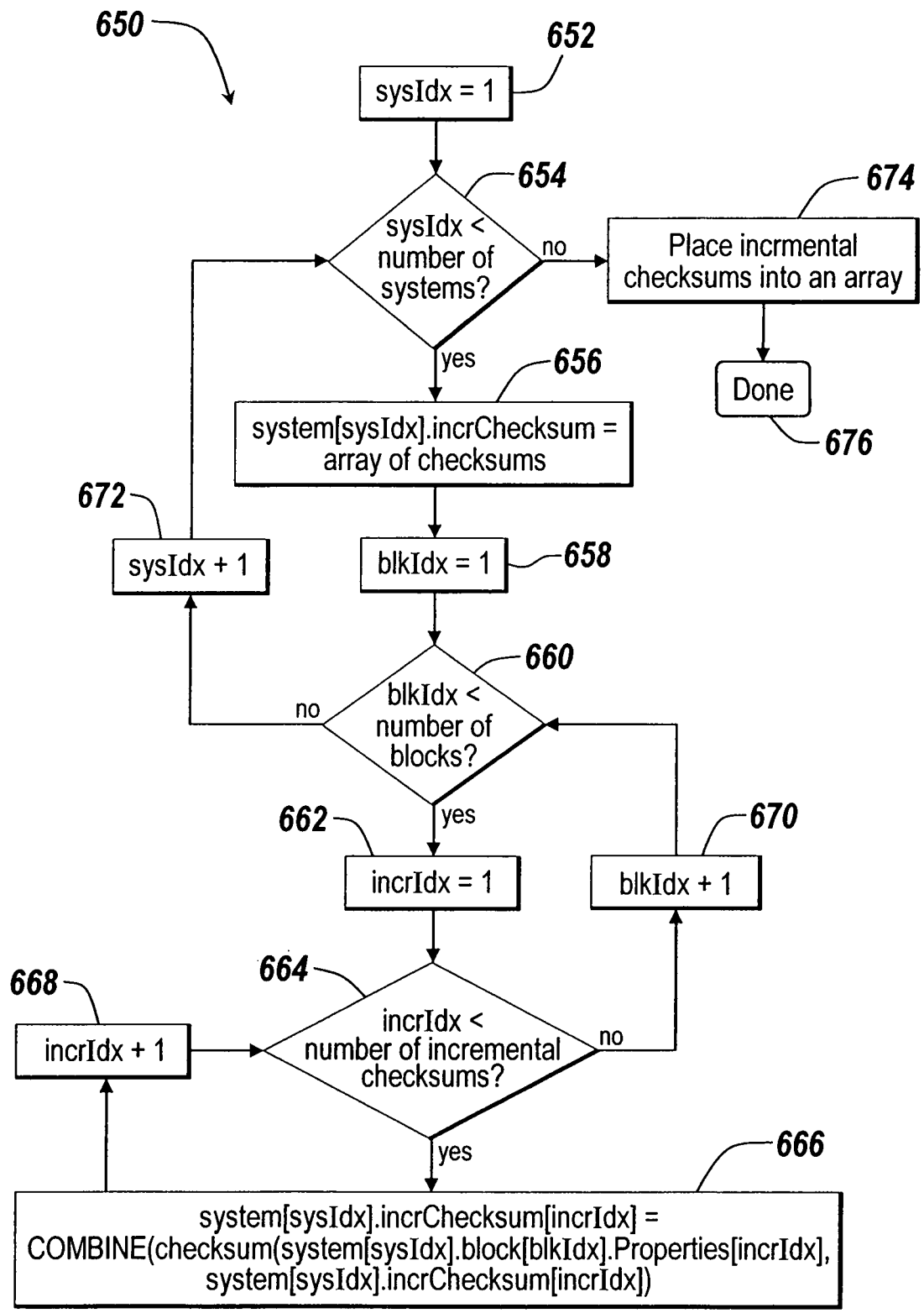
FIG. 28 depicts an example method for how incremental checksums may be created.

A sample method 650 is provided in FIG. 28 to show an example of how incremental checksums may be created. A subsystem counter, sysIdx, is initialized, step 652. Each nonvirtual subsystem of the block diagram model is processed. If the number of subsystems is greater than the subsytem counter, step 654, an array is created and attached to each nonvirtual subsystem of the block diagram model, step 656. The size of the array depends on how many incremental checksums are desired. A block counter, blkIdx is initialized, step 658. Each block is then processed. If the number of blocks is greater than the block counter, step 660, an incremental checksum counter, incrIdx, is initialized, step 662. If the number of incremental checksums is greater than the incremental checksum counter, step 664, then the properties associated with the current, incrIdx, incremental checksum are combined into the incrIdx incremental checksum of the sysIdx subsystem, step 666. The incremental checksum counter is incremented, step 668, and the loop continues at step 664. When all of the incremental checksums have been processed, the block counter is incremented, step 670, and the loop continues at step 660. When all of the blocks have been processed, the subsystem counter is incremented, step 672, and the loop continues at step 654. When all of the nonvirtual subsystems have been processed, the incremental checksums from each of the nonvirtual subsystems may be placed into an array, step 674. The method is then complete, step 676. It is understood that the incremental checksums may be searched, as described above in relation to subsystem checksum, to locate matching incremental checksums.

A final checksum may also be determined by combining each of the incremental checksums. It is possible to create as many incremental checksums as necessary, although, for efficiency reasons, the number of incremental checksums should be less than the total number of characteristics that get added to the checksum. A search of all the subsystems in a model can report which incremental checksums match and which do not match.

A diagnostics report 700 can then be provided to the user to indicate which attributes are preventing subsystems from being reused. An example of a diagnostics report 700 is shown in FIG. 29. The report can include the type of characteristics 710 represented by the incremental checksum 720 of the subsystem 730. It is understood that the illustrated characteristics 710 are by way of example only, and the invention is not so limited. Optionally, each of the subsystems in the listing of subsystems 730 may be linked to the block diagram to allow a user to quickly access the corresponding portion of the block diagram. According to one implementation, subsystems are only included on the report when there are at least two subsystems with a matching, corresponding incremental checksum.

Figure 30:
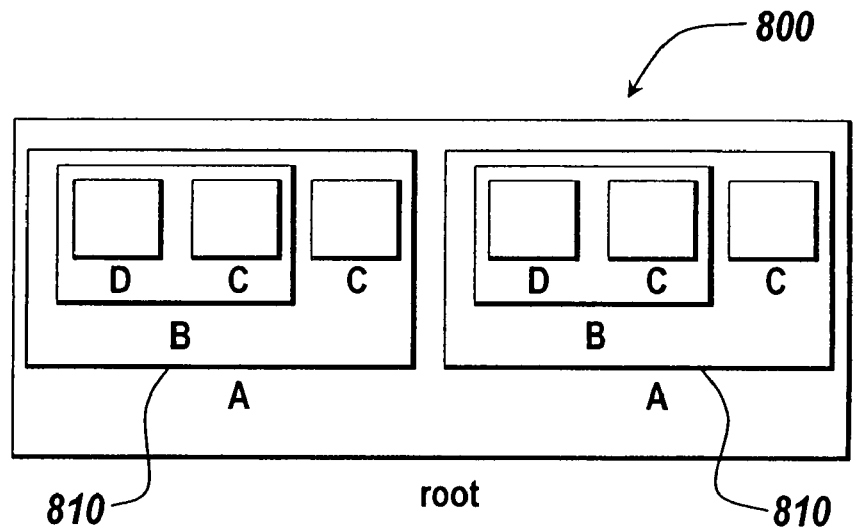
FIG. 30 illustrates a block diagram having a hierarchy formed of multiple non-virtual subsystems.
Figure 31:
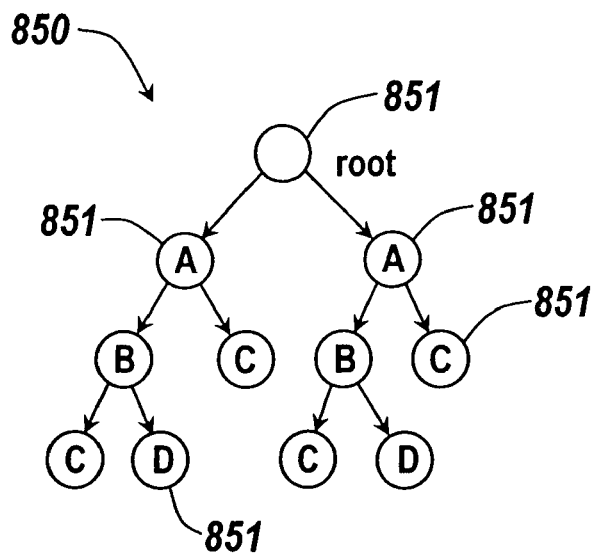
FIGS. 31 and 32 depict call graphs of various implementations of the block diagram of FIG. 30.
Figure 32:
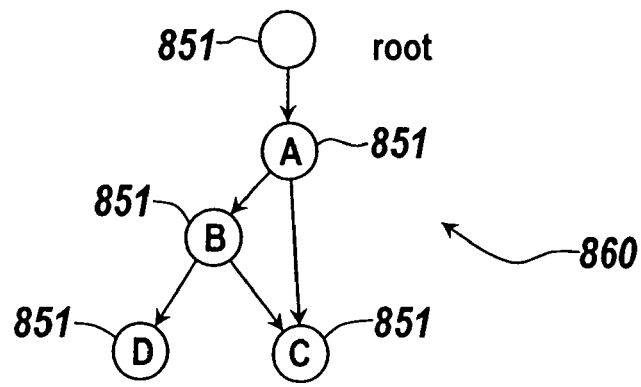

According to another illustrative embodiment of the invention, a hierarchy is created when using nonvirtual subsystems in a block diagram model. When code is auto-generated for a block diagram like the one in FIG. 30, there can be many data structures in the code that represent information in the model such as states, outputs of blocks and others. If this information is stored hierarchically, it makes the generated code easier to read and it also decreases the number of arguments that reusable functions for identical subsystems have. This efficiency is demonstrated in the following example with reference to FIGS. 30-32. FIG. 30 illustrates a hierarchy 800 of subsystems 810 that contains subsystems that are identical. This hierarchy 800 can be represented by the call graph 850 of FIG. 31, representing a subsystem hierarchy that does not take reuse of identical subsystems, e.g. use of common sets of instructions, into account. FIG. 32 provides a call graph 860 taking the reuse of identical subsystems into account. The efficiency that can be generated when reusing identical subsystems is evident when comparing the number of nodes 851 in the call graphs. Note that although in this example the call graphs exactly follow the graphical hierarchy, this is not always the case. For example, it is possible for a subsystem to call another subsystem that is not a graphical child.

By way of further example, a block diagram contains two identical subsystems A and B, each having, among other blocks, blocks Gain and Gain1. One piece of data that must be stored in the generated code is the outputs of the blocks Gain and Gain1. Using hierarchical data structures, this can be done in C using the following code:

```
typedef struct{
    double gain;
    double gain1;
} Subsystem;
typedef struct{
    Subsystem A;
    Subsystem B;
} BlockOutputs;
```

A single reusable function can be provided for both subsystems A and B in the following manner.

```
void Subsystem(double in1, double in2, Subsystem *subsys)
{
    subsys->gain = ...;
    subsys->gain1 = ...; }
```

If the structures were not hierarchical, the memory locations for gain and gain1 would likely be passed individually. For subsystems with a very large number of blocks, this would result in long argument lists that would increase the size of the code. As an alternative, flat data structures could be created for all of the important data in the generated code. In such a case, offset indices would be used to access the appropriate piece of data for each instance of a reusable subsystem.

Figure 33:
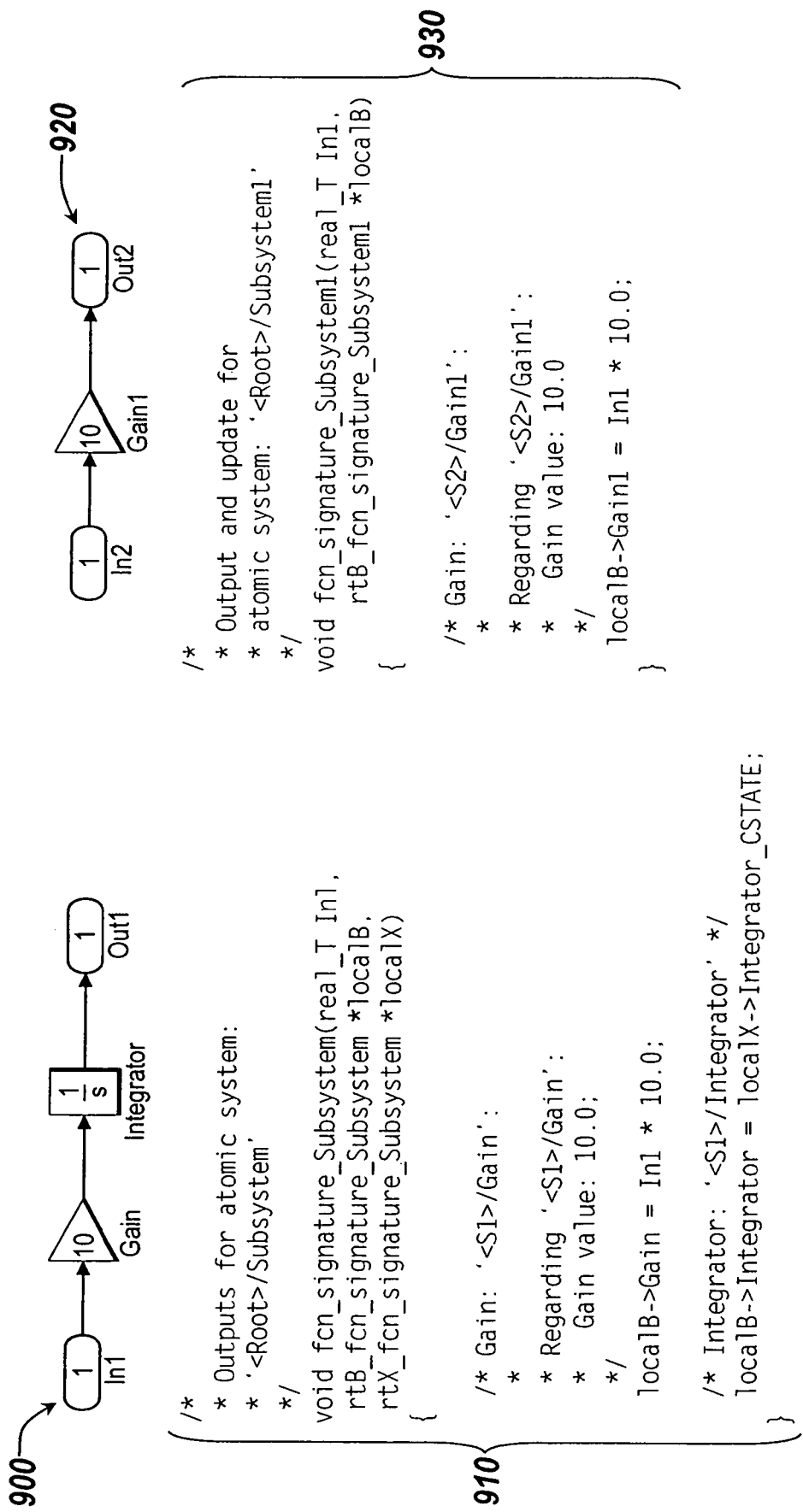
FIG. 33 illustrates examples of variable signatures within code corresponding to block diagrams.

According to a further illustrative embodiment of the invention, when generating code from a block diagram, it is often desirable to partition the code into separate functions for separate parts of the block diagram. Also, when a portion of the block diagram has been identified as being repetitive, a common set of instructions, e.g. such as a single function, will be generated for that repeated group of blocks. In order to take advantage of the hierarchical structures that have been described previously according to an embodiment of the invention, a function in the generated code may have a variable signature depending on the types of blocks that the function contains. An example of this is shown in FIG. 33 where only the data structures that are needed in the function are passed into the function. FIG. 33 includes a first group 900 of blocks and associated code 910 and a second group 920 of blocks and associated code 930. Note that the continuous states are passed into the function within the code 910 because the integrator block is present in the first group 900 of blocks, but are not passed in the code 930, as no integrator block is in the second group 920 of blocks. This embodiment of the invention can result in more efficient and more readable generated code. The code 910, 930 of the present example was generated using the R13 release of Simulink and Real-Time Workshop from The MathWorks, Inc.

Figure 34:
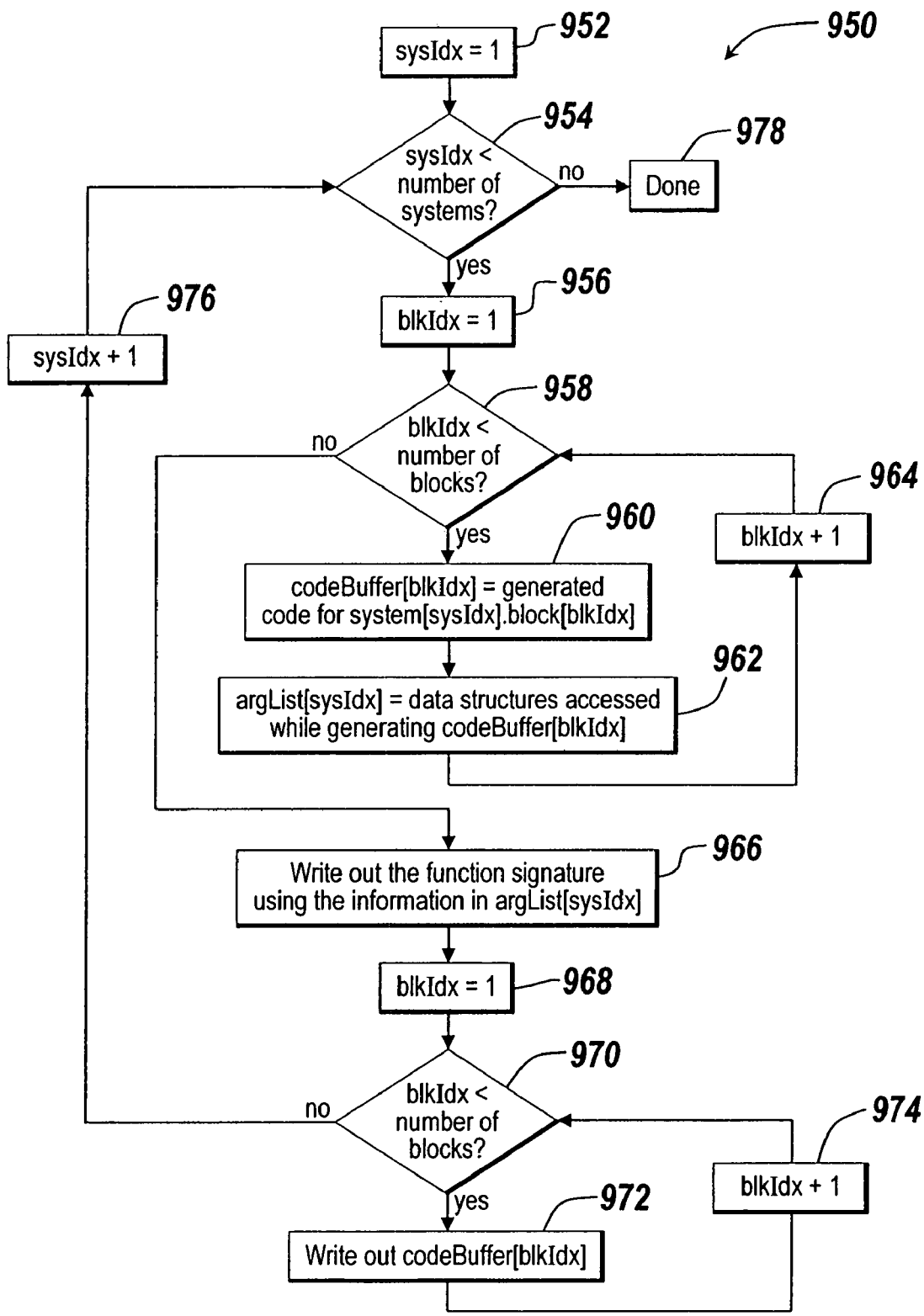
FIG. 34 depicts an example method for how to automatically generate function-signatures.

A sample method 950 to automatically generate function-signatures is shown in FIG. 34. A subsystem counter, sysIdx, is initialized, step 952. A loop is established to run through each of the subsystems. If the number of subsystems is greater than the subsystem counter, step 954, a block counter, blkIdx, is initialized, step 956. Each of the blocks in the subsystem are processed. If the number of blocks is greater than the block counter, step 958, code is generated for the block and stored in a buffer that is attached to the subsystem, step 960. Data structures accessed while code was generated for the block are tracked and stored with the subsystem, step 962. The block counter is incremented, step 964, and the loop continues at step 958. When all the blocks have been processed for a given subsystem, a function prototype is written for the subsystem where the arguments to the function are the data structures that have been accessed while generating code for each of the blocks, step 966. The block counter is again initialized, step 968. If the number of blocks in the subsystem is greater than the block counter, step 970, the code that was buffered for the block is written out, step 972. The block counter is then incremented, step 974, and the loop continues at step 970. When all the blocks have been processed, the subsystem counter, sysIdx, is incremented, step 976, and the loop continues at step 964. When all the subsystems have been processed, the method 950 is complete, step 978.

Figure 36:
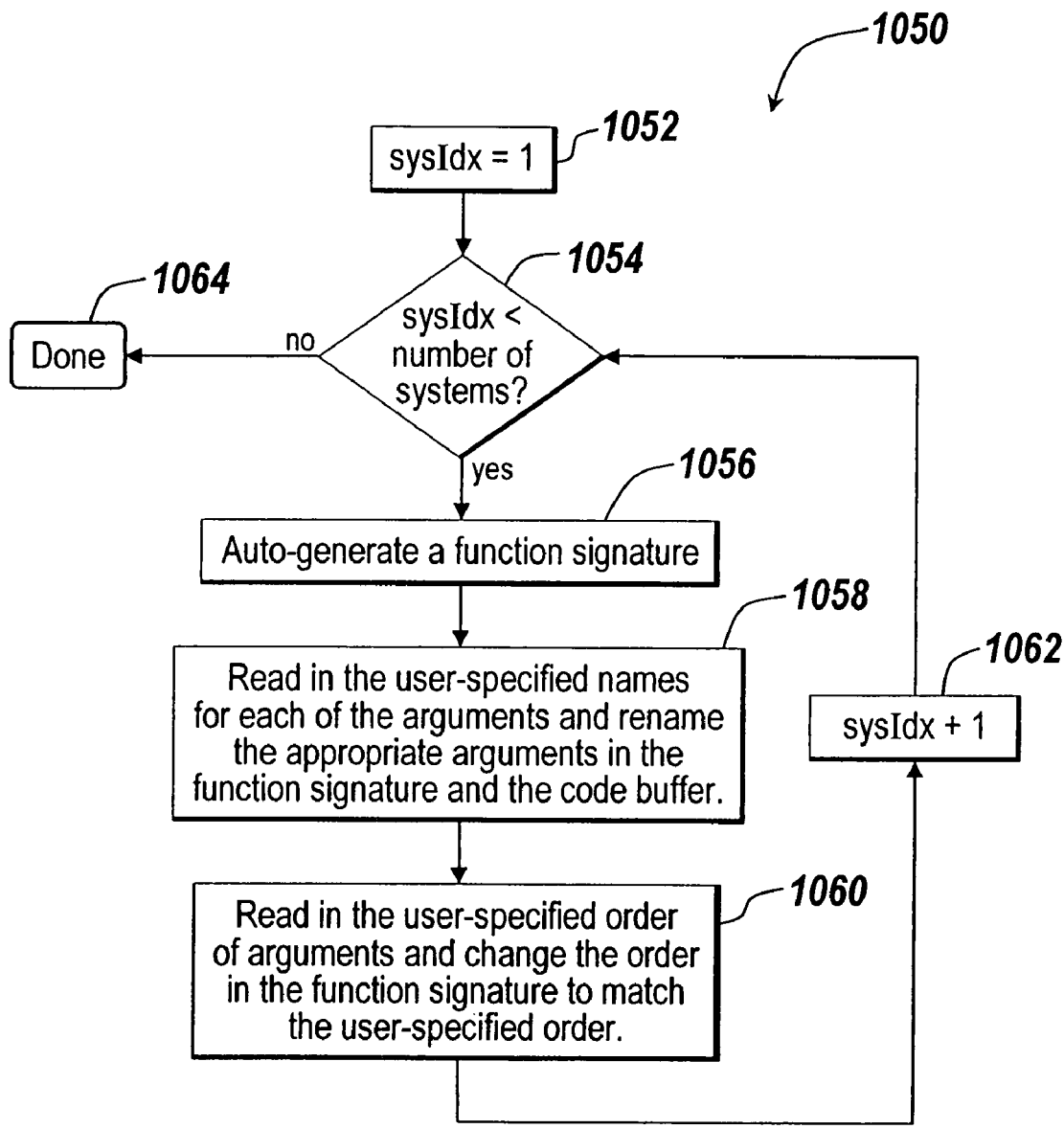
FIG. 36 depicts an example method for how to provide user-controlled function signatures.

According to another illustrative embodiment of the invention, although the function signatures may be automatically generated, it may still be desirable for the user to control the order of the arguments, the names of the arguments and/or other aspects of the function signature. An example of an interface 1000 to provide such control is shown in FIG. 35. The example of FIG. 35 corresponds to a nonvirtual subsystem block in a block diagram having an input In1 and an output Out1. The interface 1000 can include an indication of all the possible function types 1010 for a subsystem, arguments 1020 for those function types and parameter names 1030 for those arguments. The interface 1000 can allow the user to drag the items in the argument 1020 indication to specify the order in the function signature. A sample method 1050 to provide user-controlled function signatures is shown in FIG. 36. A subsystem counter is initialized, step 1052. Each subsystem is then processed. If the number of subsystems is greater than the subsystem counter, step 1054, a function signature is auto-generated for the nonvirtual subsystem, step 1056, such as is described by way of example in relation to FIG. 34. The user-specified names are read in for each of the arguments and rename the appropriate arguments in the function signature and in the code buffer, step 1058. The user-specified order of arguments is read in and the order is changed in the auto-generated function signature to match the user-specified order, step 1060. The subsystem counter is incremented, step 1062, and the loop continues ate step 1054. When all of the subsystems have been processed, the method 1050 is complete, step 1064.

Figure 37:
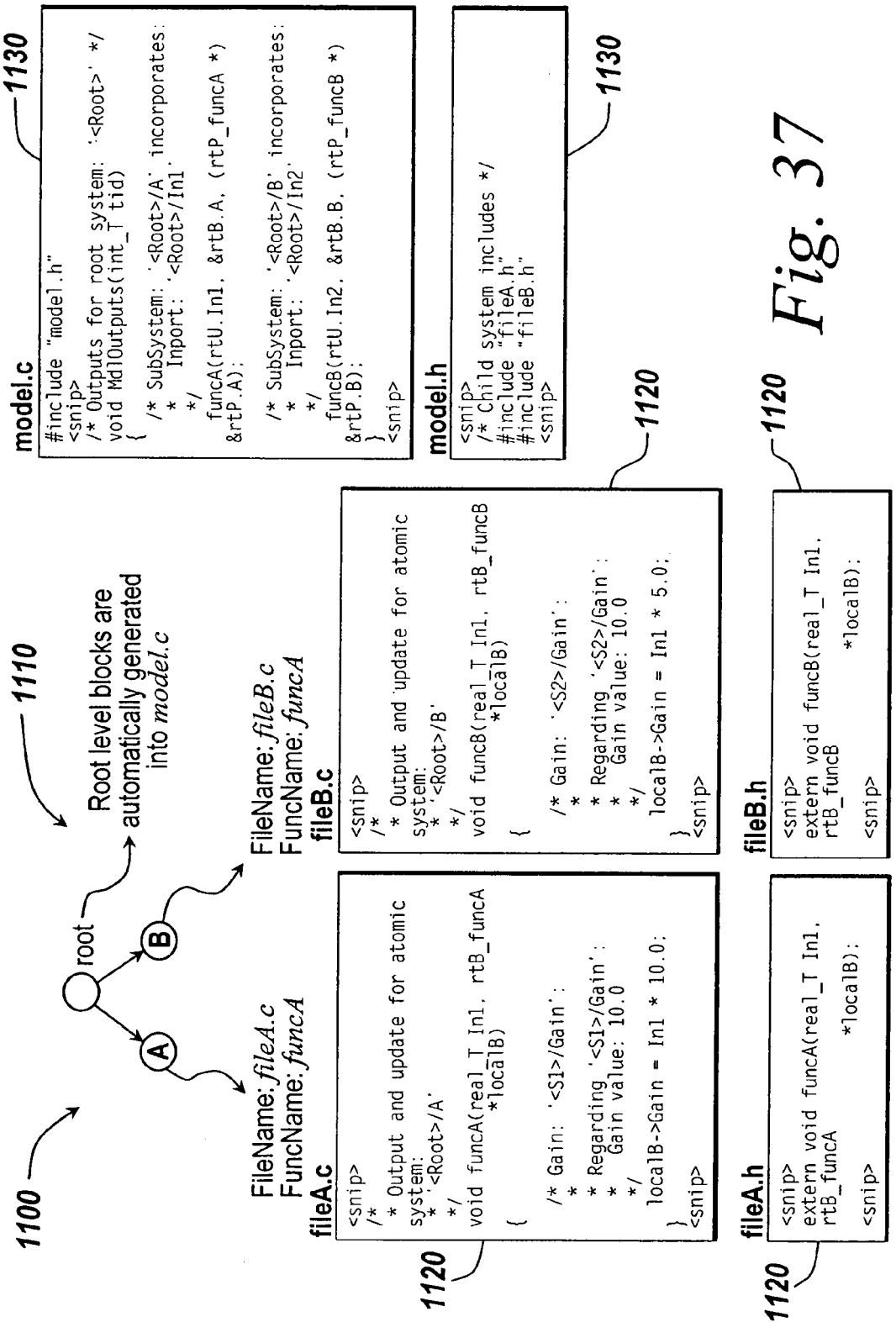
FIG. 37 illustrates a diagram illustrating an example of the operation of an interface enabling a user to control the format and/or readability of generated code.

According to another illustrative embodiment of the invention, when generating code from a block diagram, it may be desirable to organize the code into functions and to place those functions into certain files. This embodiment of the invention can provide an interface so that the user can control the names of the functions and/or the files for each nonvirtual subsystem. This interface can be in the form of a dialog associated with each subsystem in which the user can enter a file name and a function name. This allows the user to control the format and/or readability of the generated code, without having to edit any of the code manually. A diagram 1100 illustrating an example of the operation of such an interface is provided in FIG. 37. A call graph 1110 is illustrated with files 1120 and models 1130 corresponding to the call graph 1110 also shown. For this example, the code was generated using Release 13 of Simulink and Real-Time Workshop from The MathWorks, Inc. It is understood that in a large block diagram, there can be many identifiers and function names that should be unique in the generated code. This embodiment of the invention can parse all the identifiers, and if any clashes are found, remove the clash by appending a unique string to the identifier. This may be done automatically without any user intervention, or by prompting the user to approve recommendations. Also, the user may revisit the identifiers, including those to which a unique string has been appended, optionally changing the identifiers as desired.

Figure 38:
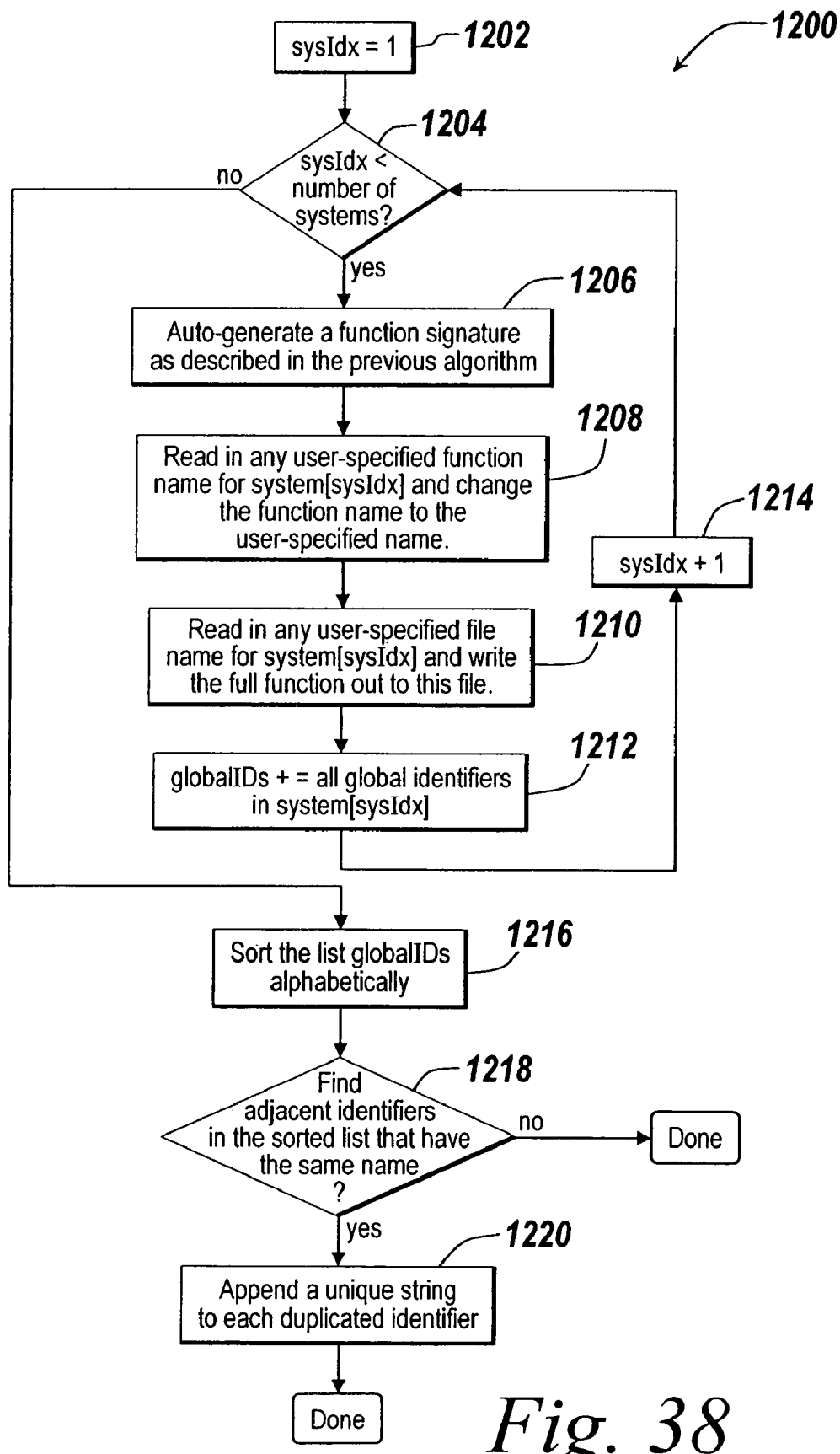
FIG. 38 illustrates an example method for providing user-specified file and function names.

An example method 1200 is illustrated in FIG. 38 for providing user-specified file and function names. A subsystem counter, sysIdx, is initialized, step 1202. A loop is established to run through each of the subsystems. If the number of subsystems is greater than the subsystem counter, step 1204, code and a function signature is generated as described herein, step 1206. Any user-specified function name for the subsystem is read in and the function name is changed to any user-specified name, step 1208. Any user-specified file name is read in and the full function is written out to this file name, step 1210. A list of global identifiers that are used in the generated code is stored, step 1212. This list may be attached to the block diagram and/or stored while generating code for the subsystem. The subsystem counter is incremented, step 1214, and the loop continues at step 1204. When all the subsystems have been processed, the list of global identifiers may optionally be sorted alphabetically, step 1216, such as by using a standard sorting algorithm. Any identical identifiers are found, step 1218, such as by locating matching adjacent identifiers if the list is sorted. If any identifiers in the list are identical, a unique string is appended to the identifier name and all occurrences of that identifier in the generated code are changed to the new unique identifier name, step 1220. When all the identical identifiers are processed, the method 1200 is complete.

According to a further illustrative embodiment of the invention, information related to the compiled block diagram may be presented to a user in a report. This report allows users to quickly obtain documentation of the functional description of their model. Information related to the execution of a particular model may optionally be obtained automatically and presented to the user as a report. Examples of such information include, for example, the time taken to execute various portions of the model and the coverage of various portions of the model, a list of functions that were created, and which subsystems are associated with a common set of instructions. Also, links may be provided to the corresponding portion of the generated code back to the corresponding portion of the model. This allows the user to identify lines in the generated code with a specific block.

Figure 39:
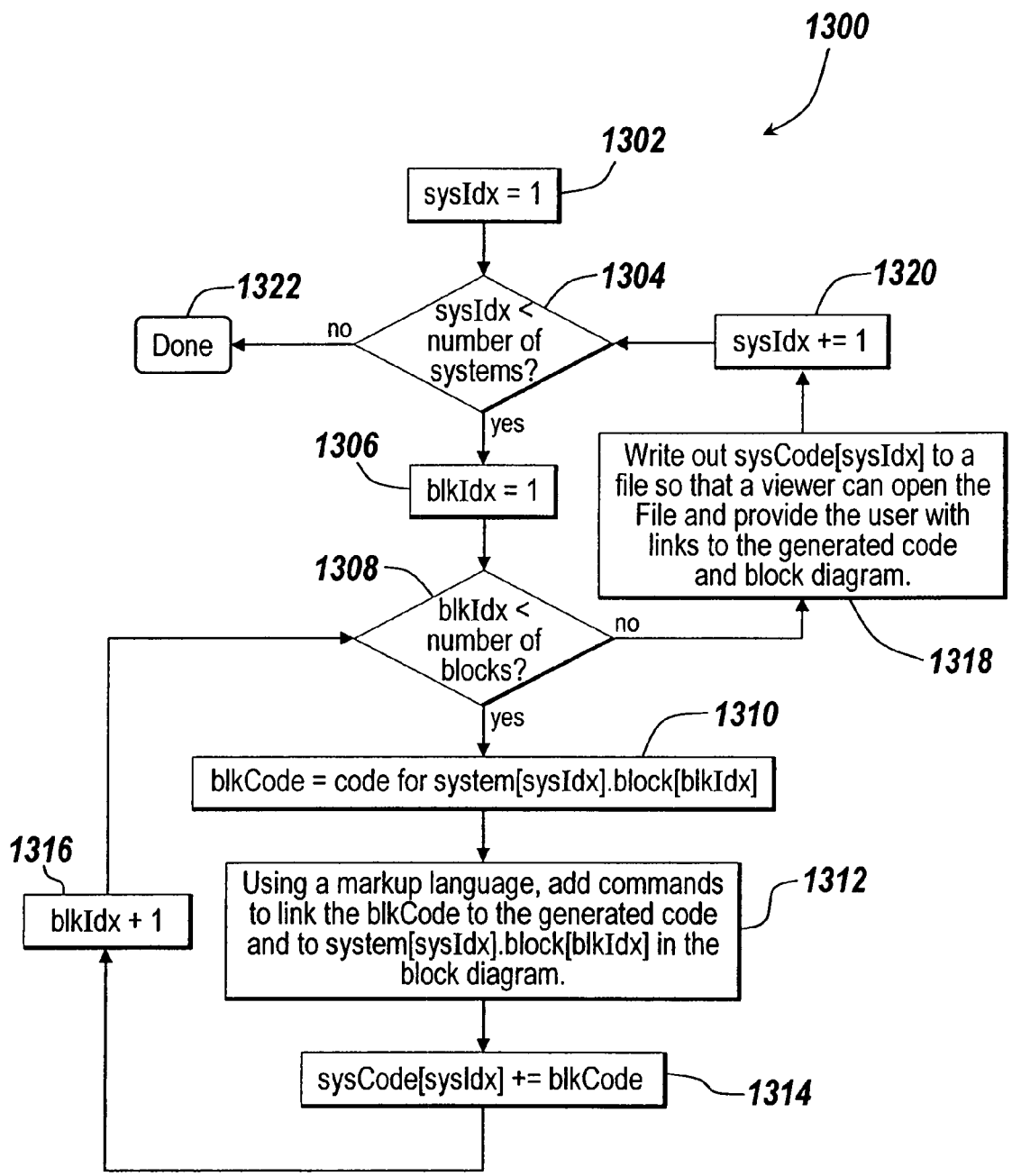
FIG. 39 illustrates an example method for generating a report on the generated code.

An example method 1300 is illustrated in FIG. 39 for generating a report on the generated code. A subsystem counter, sysIdx, is initialized, step 1302. A loop is established to run through each of the subsystems. If the number of subsystems is greater than the subsystem counter, step 1304, a block counter, blkIdx, is initialized, step 1306. Each of the blocks in the subsystem are processed. If the number of blocks is greater than the block counter, step 1308, the code is written out for the block to a buffer attached to the subsystem, step 1310. The code is copied to another buffer attached to the subsystem and, using a markup language, commands are added to link to the corresponding generated code and commands are added to link to the corresponding block in the block diagram, step 1312. The block code is then added to the system code for the subsystem, step 1314. The block counter is then incremented, step 1316, and the loop begins again at step 1308. When all the blocks for the subsystem have been processed, the marked up buffer is written out for the subsystem to a file so that a viewer can open the file and provide the user with links to the generated code and the block diagram, step 1318. The subsystem counter is then incremented, step 1320, and the loop begins again at step 1304. When all the subsystems have been processed, the method 1300 is complete, step 1322. It is understood that a variation of this method involves writing the much or all of the code, with commands and links added at a later time.

The present invention has been described by way of example, and modifications and variations of the described embodiments will suggest themselves to skilled artisans in this field without departing from the spirit of the invention. Aspects and characteristics of the above-described embodiments may be used in combination and embodiments may be combined with other embodiments in an implementation of the invention. The described embodiments are merely illustrative and should not be considered restrictive in any way. The scope of the invention is to be measured by the appended claims, rather than the preceding description, and all variations and equivalents that fall within the range of the claims are intended to be embraced therein.

What is claimed is:

1. A computer-implemented method for executing a graphical block diagram model, said method comprising:
    searching the graphical block diagram model using a computer for a first pattern of a first set of one or more blocks that matches a second pattern of a second set of one or more blocks in the graphical block diagram model;
    executing the graphical block diagram model using the computer, wherein one set of instructions is used for execution of the first set of one or more blocks and the second set of one or more blocks in the graphical block diagram model; and
    computing a checksum for the first pattern in the graphical block diagram model, wherein the checksum is based on a set of characteristics.

2. The method of claim 1, wherein the one set of instructions comprises at least one hierarchical data structure encapsulating data for the one set of instructions for the first and second patterns.

3. The method of claim 2, wherein the hierarchical data structure comprises at least two subsystems that share a parameter, wherein the shared parameter is accessed by the instructions for the at least two subsystems.

4. The method of claim 1, further comprising:
    generating a list of references from instructions in the one set of instructions to corresponding portions of the model.

5. The method of claim 1, further comprising:
    generating a list of references from a portion of the model to a corresponding subset of the instructions in the one set of instructions.

6. The method of claim 1, wherein the one set of instructions comprises code generated for the first pattern.

7. The method of claim 6, further comprising:
    providing an interface for controlling the location of the code generated for the first pattern.

8. The method of claim 1, further comprising:
    providing an interface for controlling at least one of the following: a list of arguments associated with the one set of instructions, a name assigned to at least one of a list of arguments associated with the one set of instructions, or a name associated with the one set of instructions.

9. The method of claim 1, wherein the first pattern of one or more blocks is a subsystem.

10. The method of claim 1, wherein the match between the first pattern and the second pattern is determined based on a set of characteristics.

11. The method of claim 10, wherein the characteristics comprise one or more of the following: connectivity, port properties, internal block properties, sample times, and reused function signature.

12. The method of claim 1, further comprising:
    computing a second checksum for the second pattern in the model;
    comparing the checksums for the first and the second pattern in the model; and determining a match between the first pattern and the second pattern in the model based on a match between their respective checksums.

13. The method of claim 1, further comprising:
displaying the checksum for the first pattern in the model to a user.

14. The method of claim 1, further comprising:
computing a checksum for a third pattern of one or more blocks in the model; and
determining that the third pattern does not match the first pattern based on the checksum.

15. The method of claim 14, further comprising:
displaying to a user a representation of the checksums for the first and the third pattern.

16. The method of claim 15, wherein displaying to the user further comprises:
displaying to the user at least one characteristic of the first pattern that does not match a corresponding characteristic of the third pattern.

17. The method of claim 1, further comprising:
parsing identifiers in the first pattern and the second pattern; and
resolving a conflict of names in identifiers in the at least two subsystems.

18. The method of claim 17, wherein resolving further comprises:
appending a string to at least one of the identifiers.

19. The method of claim 17, wherein resolving further comprises:
providing a user interface for controlling a name of at least one of the identifiers.

20. The method of claim 1, further comprising:
providing a report comprising a functional description of the model.

21. A computer-readable medium holding computer-executable commands for executing a graphical block diagram model, said commands comprising:
commands stored in the storage device for searching the graphical block diagram model for a first pattern of a first set of one or more blocks that matches a second pattern of a second set of one or more blocks in the graphical block diagram model;
commands stored in the storage device for executing the graphical block diagram model, wherein one set of instructions is used for execution of the first set of one or more blocks and the second set of one or more blocks in the graphical block diagram model and
commands stored in the storage device for computing a checksum for the first pattern in the graphical block diagram model, wherein the checksum is based on a set of characteristics.

22. The medium of claim 21, wherein the one set of instructions comprises at least one hierarchical data structure encapsulating data for the one set of instructions for the first and second patterns.

23. The medium of claim 22, wherein the hierarchical data structure comprises at least two subsystems that share a parameter, wherein the shared parameter is accessed by the instructions for the at least two subsystems.

24. The medium of claim 21, wherein the commands further comprise:
commands for generating a list of references from instructions in the one set of instructions to corresponding portions of the model.

25. The medium of claim 21, wherein the commands further comprise:
commands for generating a list of references from a portion of the model to a corresponding subset of the instructions in the one set of instructions.

26. The medium of claim 21, wherein the one set of instructions comprises code generated for the first pattern.

27. The medium of claim 26, wherein the commands further comprise:
commands for providing an interface for controlling the location of the code generated for the first pattern.

28. The medium of claim 21, wherein the commands further comprise:
commands for providing an interface for controlling a list of arguments associated with the one set of instructions.

29. The medium of claim 21, wherein the commands further comprise:
commands for providing an interface for controlling a name assigned to at least one of a list of arguments associated with the one set of instructions.

30. The medium of claim 21, wherein the commands further comprise:
providing an interface for controlling a name associated with the one set of instructions.

31. The medium of claim 21, wherein the first pattern of one or more blocks is a subsystem.

32. The medium of claim 21, wherein the match between the first pattern and the second pattern is determined based on a set of characteristics.

33. The medium of claim 32, wherein the characteristics comprise one or more of the following: connectivity, port properties, internal block properties, sample times, and reused function signature.

34. The medium of claim 21, wherein the commands further comprise:
commands for computing a second checksum for the second pattern in the model;
commands for comparing the checksums for the first and the second pattern in the model; and
commands for determining a match between the first pattern and the second pattern in the model based on a match between their respective checksums.

35. The medium of claim 21, wherein the commands further comprise:
commands for displaying the checksum for the first pattern in the model to a user.

36. The medium of claim 21, wherein the commands further comprise:
commands for computing a checksum for a third pattern of one or more blocks in the model; and
commands for determining that the third pattern does not match the first pattern based on the checksum.

37. The medium of claim 36, wherein the commands further comprise:
commands for displaying to a user a representation of the checksums for the first and the third pattern.

38. The medium of claim 37, wherein the commands for displaying to the user further comprise:
commands for displaying to the user at least one characteristic of the first pattern that does not match a corresponding characteristic of the third pattern.

39. The medium of claim 21, wherein the commands further comprise:
commands for parsing identifiers in the first pattern and the second pattern; and
commands for resolving a conflict of names in identifiers in the at least two subsystems.

40. The medium of claim 39, wherein commands for resolving further comprise:
commands for appending a string to at least one of the identifiers.

41. The medium of claim 39, wherein commands for resolving further comprise:
commands for providing a user interface for controlling a name of at least one of the identifiers.

42. The medium of claim 21, wherein the commands further comprise:
commands for providing a report comprising a functional description of the model.

43. A computer-implemented system for executing a graphical block diagram model, said system comprising:
a first pattern of a first set of one or more blocks in the graphical block diagram model, the first pattern matching a second pattern of a second set of one or more blocks in the graphical block diagram model;
one set of instructions used for execution of the first set of one or more blocks and the second set of one or more blocks in the graphical block diagram model; and
one set of instructions used for computing a checksum for the first pattern in the graphical block diagram model, wherein the checksum is based on a set of characteristics.

44. The system of claim 43, wherein the one set of instructions comprises code generated for the first pattern.

45. A computer-implemented system for executing a graphical block diagram model, said system comprising:
means for searching the graphical block diagram model for a first pattern of a first set of one or more blocks that matches a second pattern of a second set of one or more blocks in the graphical block diagram model;
means for executing the graphical block diagram model, wherein one set of instructions is used for execution of the first set of one or more blocks and the second set of one or more blocks in the graphical block diagram model; and
means for computing a checksum for the first pattern in the graphical block diagram model, wherein the checksum is based on a set of characteristics.

* * * * *

UNITED STATES PATENT AND TRADEMARK OFFICE
CERTIFICATE OF CORRECTION

PATENT NO. : 7,681,151 B2 Page 1 of 1
APPLICATION NO. : 11/703336
DATED : March 16, 2010
INVENTOR(S) : John Edward Ciolfi et al.

It is certified that error appears in the above-identified patent and that said Letters Patent is hereby corrected as shown below:

In Column 33, line 51, please change "subsytem" to --subsystem--.

Signed and Sealed this

Thirteenth Day of July, 2010

David J. Kappos
*Director of the United States Patent and Trademark Office*

UNITED STATES PATENT AND TRADEMARK OFFICE
CERTIFICATE OF CORRECTION

PATENT NO. : 7,681,151 B2  
APPLICATION NO. : 11/703336  
DATED : March 16, 2010  
INVENTOR(S) : John E. Ciolfi et al.

Page 1 of 1

It is certified that error appears in the above-identified patent and that said Letters Patent is hereby corrected as shown below:

Title Page, item (73) Assignee, replace "The Math Works, Inc." with
--The MathWorks, Inc.--.

Signed and Sealed this
Twenty-fifth Day of November, 2014

Michelle K. Lee
*Deputy Director of the United States Patent and Trademark Office*